US009880437B2

(12) United States Patent
Kusunoki et al.

(10) Patent No.: US 9,880,437 B2
(45) Date of Patent: Jan. 30, 2018

(54) DISPLAY DEVICE

(71) Applicant: Semiconductor Energy Laboratory Co., Ltd., Atsugi-shi, Kanagawa-ken (JP)

(72) Inventors: Koji Kusunoki, Kawasaki (JP); Hiroyuki Miyake, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/551,914

(22) Filed: Nov. 24, 2014

(65) Prior Publication Data
US 2015/0144945 A1 May 28, 2015

(30) Foreign Application Priority Data

Nov. 27, 2013 (JP) .................................. 2013-245172
Feb. 28, 2014 (JP) .................................. 2014-038159

(51) Int. Cl.
*G02F 1/1343* (2006.01)
*G02F 1/1362* (2006.01)
(Continued)

(52) U.S. Cl.
CPC ...... *G02F 1/136286* (2013.01); *G02F 1/1368* (2013.01); *H01L 27/124* (2013.01);
(Continued)

(58) Field of Classification Search
CPC ... G02F 1/134336; G02F 2001/134354; H01L 27/124; H01L 27/3213; H01L 27/3216
See application file for complete search history.

(56) References Cited

U.S. PATENT DOCUMENTS 5,126,865 A * 6/1992 Sarma ............... G02F 1/136213
345/103
5,731,856 A 3/1998 Kim et al.
(Continued)

FOREIGN PATENT DOCUMENTS

EP          1737044 A      12/2006
EP          2226847 A       9/2010
(Continued)

OTHER PUBLICATIONS

Takashi Hirao et al., Novel top-gate zinc oxide thin-film transistors (ZnO TFTs) for AMLCDs, Journal of the Society for Information Display, vol. 15, No. 1 (Jan. 2007), pp. 17-22.*
(Continued)

*Primary Examiner* — Victoria K Hall
(74) *Attorney, Agent, or Firm* — Robinson Intellectual Property Law Office; Eric J. Robinson

(57) ABSTRACT

A transistor includes a gate electrode over a substrate, an oxide semiconductor film overlapping with the gate electrode, a gate insulating film in contact with one surface of the oxide semiconductor film, and a pair of conductive films in contact with the oxide semiconductor film. A capacitor includes a metal oxide film over the gate insulating film and in contact with one of the pair of conductive films, an inorganic insulating film, and a first light-transmitting conductive film over the inorganic insulating film. A first gate line serving also as a gate electrode is connected so as to be able to select three sub-pixels of four sub-pixels, and a second gate line is connected so as to be able to select the remaining one of the four sub-pixels and also one sub-pixel in the next row.

12 Claims, 29 Drawing Sheets

(51) Int. Cl.
  *H01L 27/12* (2006.01)
  *H01L 29/786* (2006.01)
  *G02F 1/1368* (2006.01)

(52) U.S. Cl.
  CPC ...... *H01L 27/1225* (2013.01); *H01L 27/1255* (2013.01); *H01L 29/7869* (2013.01); *H01L 29/78606* (2013.01); *H01L 29/78696* (2013.01); *G02F 1/134336* (2013.01); *G02F 2001/134345* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,392,255 | B1* | 5/2002 | Shibata ............. G02F 1/136213 257/350 |
| 6,563,174 | B2 | 5/2003 | Kawasaki et al. |
| 6,583,472 | B1* | 6/2003 | Shibata ............... G02F 1/13454 257/350 |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 9,385,144 | B2* | 7/2016 | Gao ....................... G02F 1/1368 |
| 9,671,662 | B2* | 6/2017 | Hsu .................. G02F 1/134309 |
| 2001/0028429 | A1* | 10/2001 | Wu ........................ G02F 1/1309 349/139 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0217694 | A1* | 11/2004 | Cok ....................... G09G 3/3216 313/504 |
| 2005/0017302 | A1 | 1/2005 | Hoffman |
| 2005/0116615 | A1* | 6/2005 | Matsumoto ......... H01L 27/3213 313/500 |
| 2005/0199959 | A1 | 9/2005 | Chiang et al. |
| 2005/0231534 | A1* | 10/2005 | Lee ...................... G09G 3/2003 345/690 |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1* | 9/2006 | Kimura ................. G09G 3/2014 345/76 |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0002084 | A1* | 1/2007 | Kimura ..................... G09G 3/32 345/694 |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1* | 7/2007 | Lai ....................... H01L 27/1225 257/59 |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0115952 | A1* | 5/2009 | Nakamura ............. G02B 5/201 349/143 |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0191654 | A1* | 7/2009 | Yu ..................... B29D 11/00634 438/29 |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0089416 | A1* | 4/2011 | Yamazaki ......... H01L 21/02565 257/43 |
| 2011/0089422 | A1* | 4/2011 | Yoon .................. H01L 27/1214 257/59 |
| 2011/0140100 | A1* | 6/2011 | Takata ................ H01L 29/7869 257/43 |
| 2011/0303953 | A1* | 12/2011 | Kamata ................... H01L 27/12 257/253 |
| 2012/0306732 | A1* | 12/2012 | Sugihara ............ G02F 1/134336 345/88 |
| 2013/0135845 | A1 | 5/2013 | Matsui et al. |
| 2013/0292795 | A1* | 11/2013 | Pyon .................... H01L 27/124 257/532 |
| 2014/0001447 | A1* | 1/2014 | Kim .................... H01L 27/3213 257/40 |
| 2014/0054624 | A1* | 2/2014 | Chen ........................ G09G 3/32 257/89 |
| 2014/0152938 | A1* | 6/2014 | Lee ....................... G09G 3/3648 349/46 |
| 2014/0204321 | A1* | 7/2014 | Koh .................. G02F 1/133514 349/109 |

(56) References Cited

U.S. PATENT DOCUMENTS

| | | | | |
|---|---|---|---|---|
| 2014/0217388 A1* | 8/2014 | Yamashita | ........... | G09G 3/3233 257/40 |
| 2014/0284570 A1* | 9/2014 | Jinta | ................ | H01L 27/3218 257/40 |
| 2014/0285542 A1* | 9/2014 | Izumi | ................ | G09G 3/2003 345/694 |
| 2015/0129877 A1* | 5/2015 | Cho | ................ | G02F 1/134363 257/59 |
| 2015/0138464 A1* | 5/2015 | Okazaki | ........... | G02F 1/134336 349/37 |
| 2015/0185576 A1* | 7/2015 | Chu | ................ | G02F 1/136286 349/43 |
| 2015/0331291 A1* | 11/2015 | Sakaigawa | ........... | G09G 3/3625 349/43 |
| 2015/0356900 A1* | 12/2015 | Yang | ................ | G09G 3/20 345/88 |
| 2016/0026046 A1* | 1/2016 | Itoh | ................ | G02F 1/136213 257/43 |
| 2016/0116808 A1* | 4/2016 | Higano | ............ | G02F 1/134309 349/110 |
| 2016/0139469 A1* | 5/2016 | Okita | ................ | G02F 1/134309 349/43 |
| 2016/0155396 A1* | 6/2016 | Yang | ................ | G09G 3/3611 345/87 |
| 2016/0155397 A1* | 6/2016 | Yang | ................ | G09G 3/3607 345/87 |
| 2016/0155398 A1* | 6/2016 | Yang | ................ | G09G 3/3607 345/87 |
| 2016/0260401 A1* | 9/2016 | Sakaigawa | ........... | G09G 3/3607 |
| 2016/0300891 A1* | 10/2016 | Ren | ................ | H01L 27/3213 |
| 2016/0306237 A1* | 10/2016 | Okita | ............... | G02F 1/134309 |
| 2016/0315127 A1* | 10/2016 | Yoon | ................ | H01L 27/3218 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-295717 | 10/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-113880 | 6/2013 |
| WO | WO-2004/114391 | 12/2004 |

OTHER PUBLICATIONS

Je-hun Lee, et al., 42.2: World's Largest (15-inch) XGA AMLCD Panel Using IGZO Oxide TFT, SID (Society for Information Display) Symposium Digest of Technical Papers, vol. 39, No. 1, Blackwell Publishing (2008), pp. 625-628.*

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn-Oxide TFTs With a Novel Passivation Layer", SID Digest'09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure Amorphous In—Ga—Zn-Oxide TFT", AM-FPD'09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using Castep", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(56) References Cited

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dieelectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

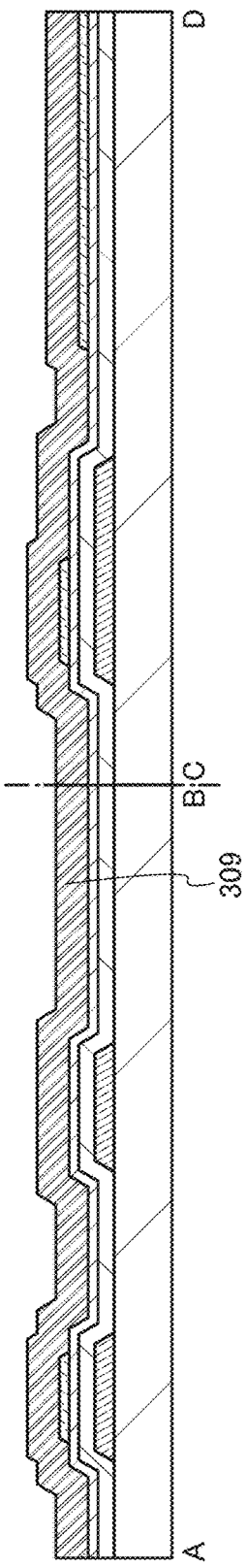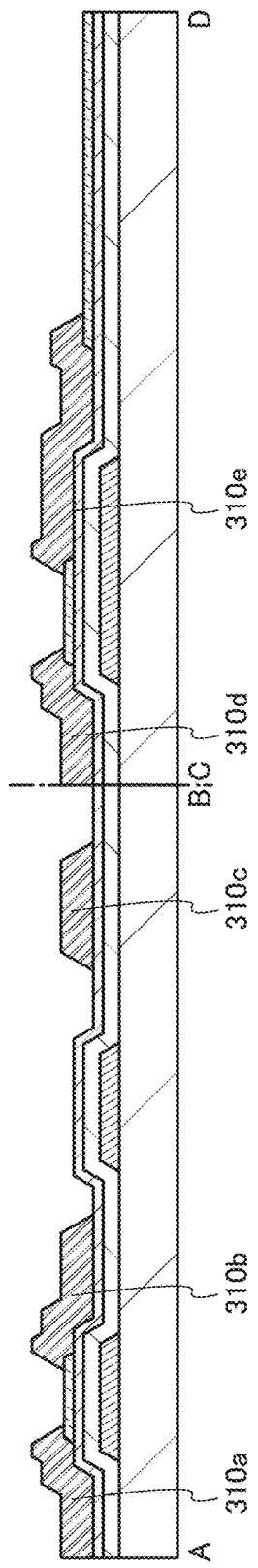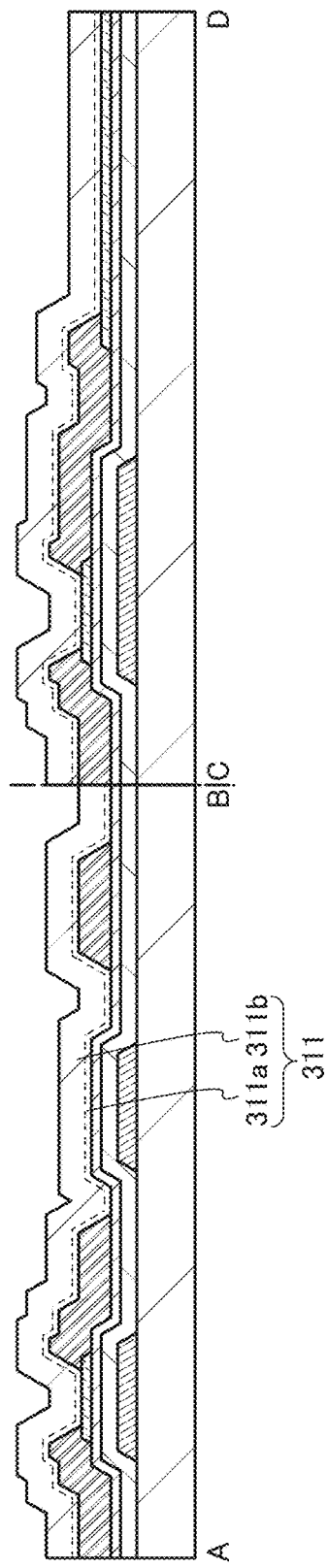

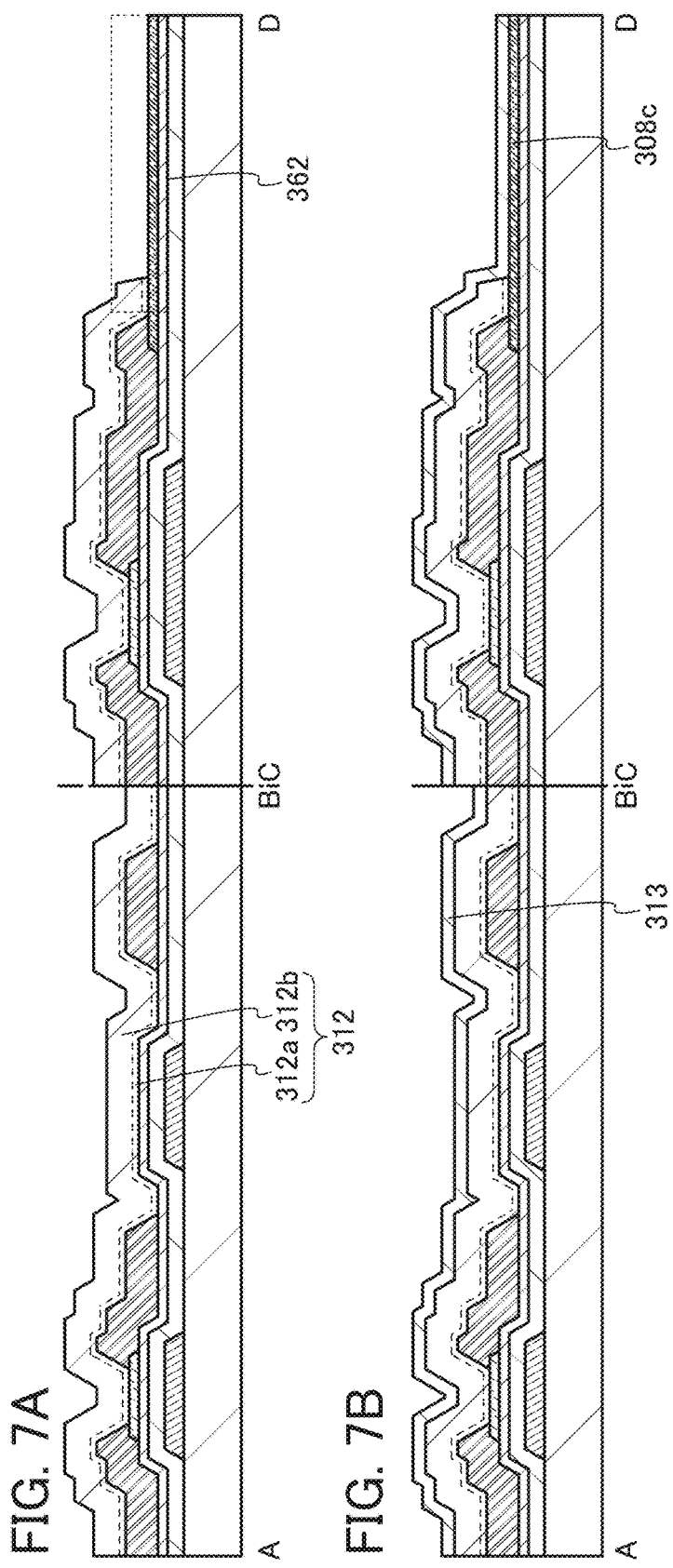

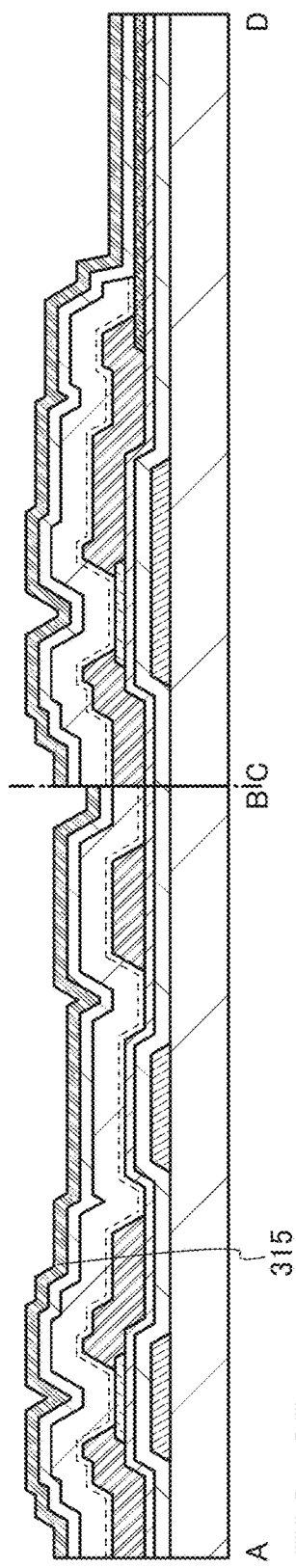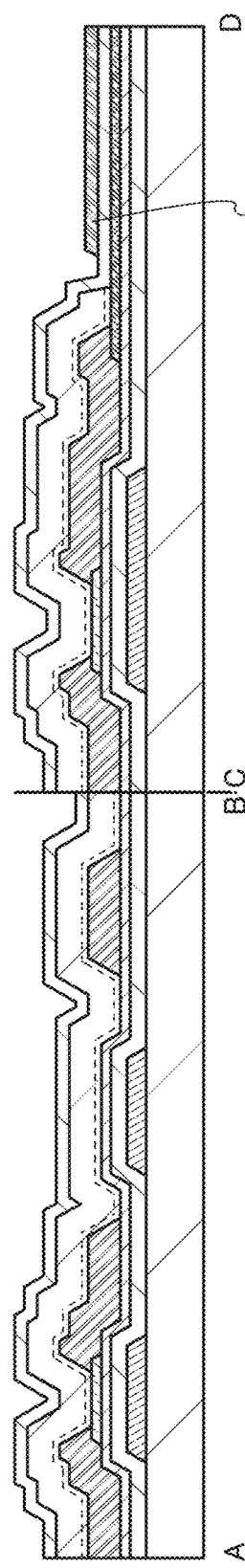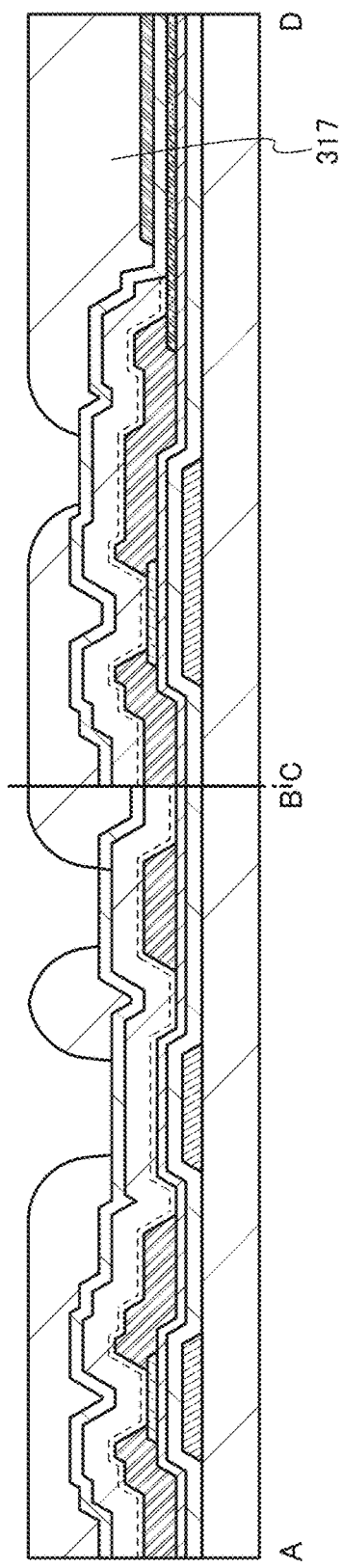

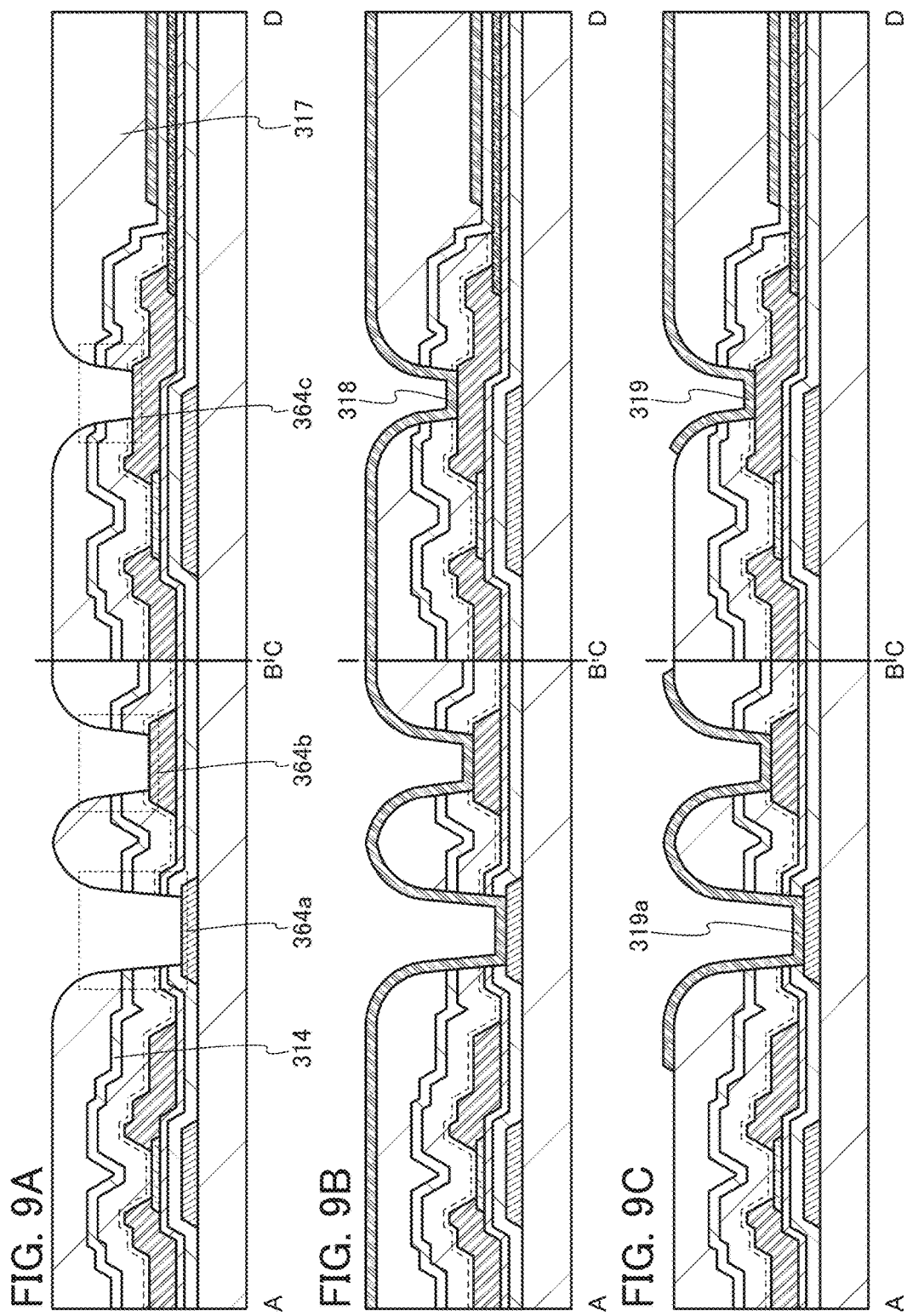

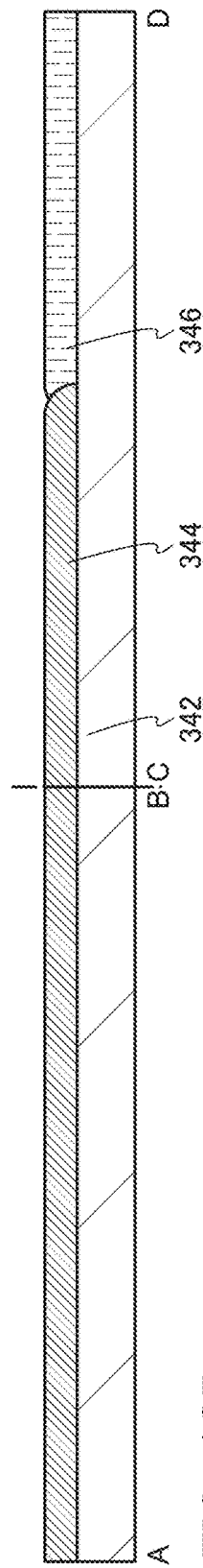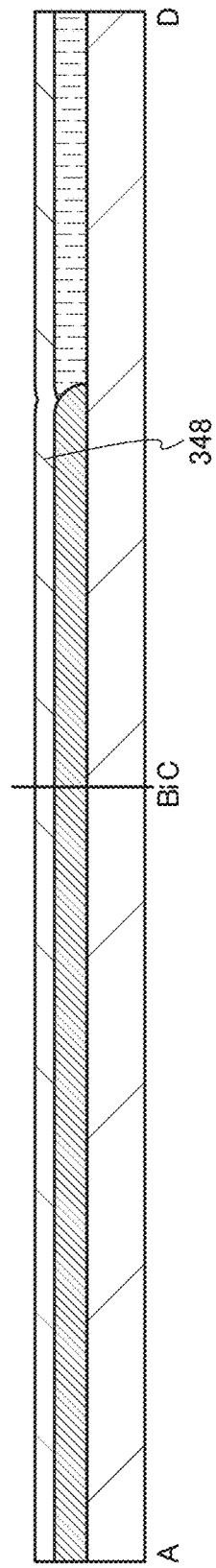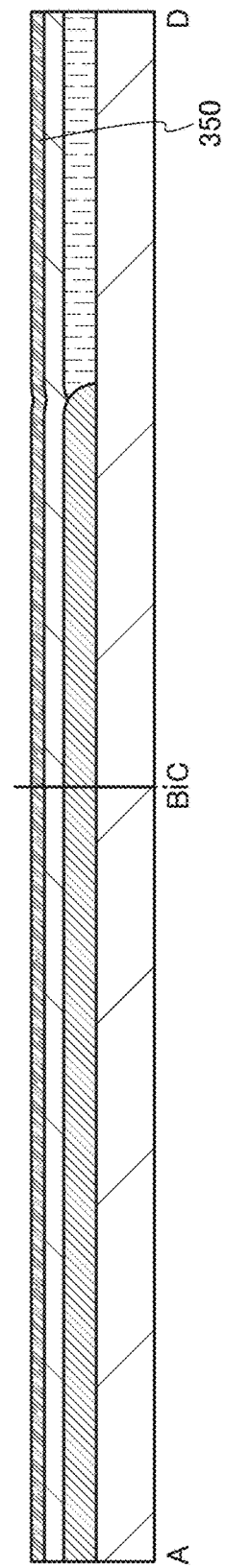

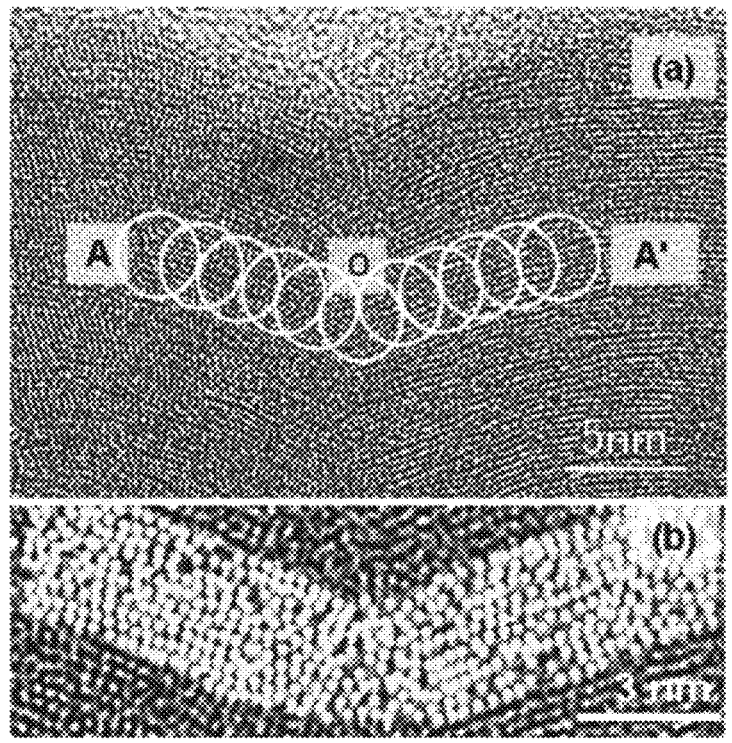
FIG. 17A
FIG. 17B
FIG. 17C
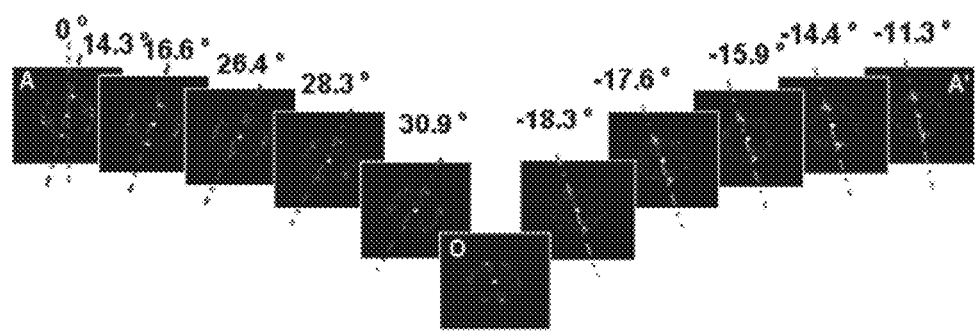

CAAC-OS nc-OS

- □ proportion of non-CAAC
- ☰ proportion of CAAC as-sputtered after heat treatment at 450°C

DISPLAY DEVICE

BACKGROUND OF THE INVENTION

1. Field of the Invention

One embodiment of the present invention relates to a display device. One embodiment of the present invention particularly relates to a display device including a liquid crystal element as a display element.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

In connection with a structure for color display with sub-pixels including color filters of three primary colors, i.e., red (R), green (G), and blue (B), a display device in which a white (W) sub-pixel is provided in addition to R, G, and B sub-pixels for lower power consumption and higher luminance has recently been proposed (see Patent Document 1).

PATENT DOCUMENT

[Patent Document 1] Japanese Published Patent Application No. H11-295717

SUMMARY OF THE INVENTION

The addition of the W sub-pixel to the sub-pixels including red (R), green (G), and blue (B) color filters leads to an increase in the number of wirings for controlling the sub-pixels. The increase in the number of wirings requires an increase in circuit area for driving the wirings, which makes it difficult to achieve a narrower bezel with a structure incorporating a driver circuit.

Alternatively, the increase in the number of sub-pixels in each pixel causes a decrease in area of each sub-pixel. This leads to a decrease in aperture ratio or a difficulty in obtaining a sufficient capacitance of a capacitor.

In view of the above, it is an object of one embodiment of the present invention to provide a display device or the like having a novel structure with which the number of wirings can be prevented from increasing even when the number of sub-pixels is increased. Alternatively, it is an object of one embodiment of the present invention to provide a display device or the like having a novel structure with which a narrow bezel can be achieved. Alternatively, it is an object of one embodiment of the present invention to provide a display device or the like having a novel structure with which a decrease in aperture ratio can be prevented. Alternatively, it is an object of one embodiment of the present invention to provide a display device or the like having a novel structure with which a sufficient capacitance of a capacitor can be obtained. Alternatively, it is an object of one embodiment of the present invention to provide a display device or the like having a novel structure and excellent display quality. Alternatively, it is an object of one embodiment of the present invention to provide a novel display device or the like.

Note that the objects of the present invention are not limited to the above. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to achieve at least one of the aforementioned objects and the other objects.

One embodiment of the present invention is a display device including a first pixel which includes first to fourth sub-pixels, a second pixel which is in a row next to that of the first pixel and includes first to fourth sub-pixels, a first wiring for supplying a signal to select the first to third sub-pixels of the first pixel, and a second wiring for selecting the fourth sub-pixel of the first pixel. The second wiring is a wiring for selecting the fourth sub-pixel of the second pixel.

Another embodiment of the present invention is a display device including a first pixel which includes first to fourth sub-pixels, a second pixel which is in a row next to that of the first pixel and includes first to fourth sub-pixels, a first wiring for supplying a signal to select the first to third sub-pixels of the first pixel, a second wiring for selecting the fourth sub-pixel of the first pixel, and a third wiring for selecting the first to third sub-pixels of the second pixel. The second wiring is a wiring for selecting the fourth sub-pixel of the second pixel.

One embodiment of the present invention can provide a display device or the like having a novel structure with which the number of wirings can be prevented from increasing even when the number of sub-pixels is increased. Alternatively, one embodiment of the present invention can provide a display device or the like having a novel structure with which a narrow bezel can be achieved. Alternatively, one embodiment of the present invention can provide a display device or the like having a novel structure with which a decrease in aperture ratio can be prevented. Alternatively, one embodiment of the present invention can provide a display device or the like having a novel structure with which a sufficient capacitance of a capacitor can be obtained. Alternatively, one embodiment of the present invention can provide a display device or the like having a novel structure and excellent display quality. Alternatively, one embodiment of the present invention can provide a novel display device or the like.

Note that the effects of the present invention are not limited to the above. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

FIGS. 6A to 6C are cross-sectional views illustrating one embodiment of a method for manufacturing a display device.

FIGS. 7A and 7B are cross-sectional views illustrating one embodiment of a method for manufacturing a display device.

FIGS. 8A to 8C are cross-sectional views illustrating one embodiment of a method for manufacturing a display device.

FIGS. 9A to 9C are cross-sectional views illustrating one embodiment of a method for manufacturing a display device.

FIGS. 10A to 10C are cross-sectional views illustrating one embodiment of a method for manufacturing a display device.

FIGS. 17A to 17C are cross-sectional TEM images and a local Fourier transform image of an oxide semiconductor.

DETAILED DESCRIPTION OF THE INVENTION

Figure 1A:
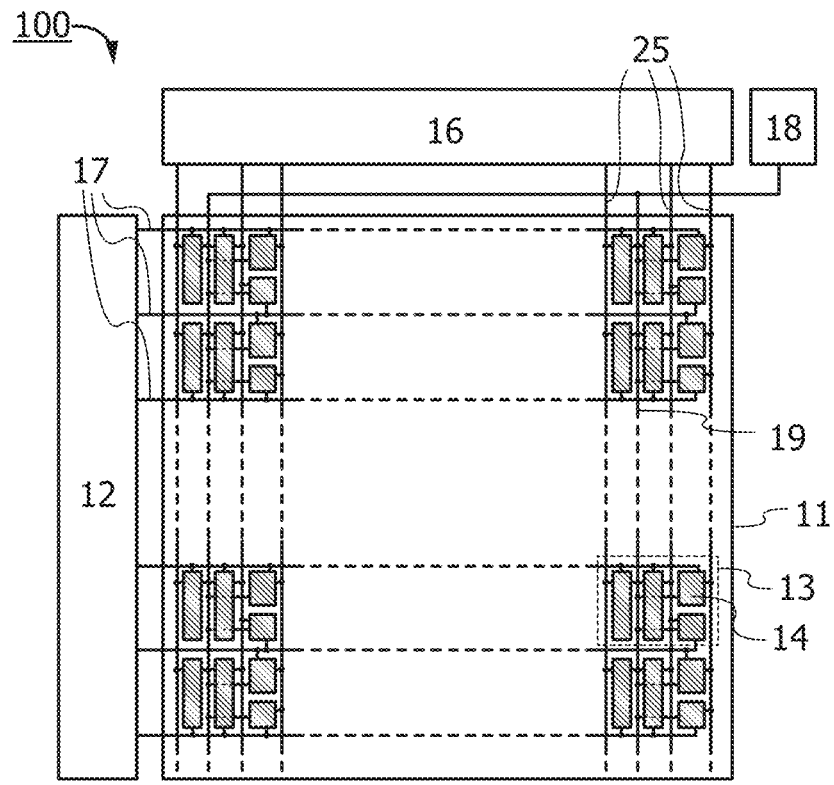
FIGS. 1A and 1B are a block diagram and a circuit diagram illustrating one embodiment of a display device.

Embodiments will be hereinafter described with reference to drawings. Note that embodiments can be carried out in many different modes, and it is easily understood by those skilled in the art that modes and details of the present invention can be modified in various ways without departing from the spirit and the scope of the present invention. Therefore, the present invention should not be interpreted as being limited to the description in the following embodiments. In structures of the present invention described below, the same components in different diagrams are denoted by the same reference numerals.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion which functions as the source and a portion which functions as the drain are not called a source and a drain, and one of the source and the drain is referred to as a first terminal and the other thereof is referred to as a second terminal in some cases.

Note that ordinal numbers such as "first", "second", and "third" in this specification are used in order to avoid confusion among components, and the terms do not limit the components numerically.

Note that in this specification, the phrase "A and B are connected" or "A is connected to B" means the case where A and B are electrically connected to each other as well as the case where A and B are directly connected to each other. Here, the phrase "A and B are electrically connected" or "A is electrically connected to B" means the following case: when an object having any electrical function exists between A and B, an electric signal can be transmitted and received between A and B.

Note that in this specification, terms for describing arrangement, such as "over" and "under", are used for convenience for describing the positional relationship between components with reference to drawings. Furthermore, the positional relationship between components is changed as appropriate in accordance with a direction in which each component is described. Thus, the positional relationship is not limited to that described with a term used in this specification and can be explained with another term as appropriate depending on the situation.

Note that the positional relationships of circuit blocks in diagrams are specified for description, and even in the case where different circuit blocks have different functions in the diagrams, the different circuit blocks might be provided in an actual circuit or region so that different functions are achieved in the same circuit block. The functions of circuit blocks in diagrams are specified for description, and even in the case where one circuit block is illustrated, blocks might be provided in an actual circuit or region so that processing performed by one circuit block is performed by a plurality of circuit blocks.

Note that a voltage refers to a potential difference between a given potential and a reference potential (e.g., a ground potential) in many cases. Therefore, a voltage, a potential, and a potential difference can also be referred to as a potential, a voltage, and a voltage difference, respectively. Note that a voltage refers to the difference between potentials of two points, and a potential refers to electrostatic energy (electric potential energy) of a unit charge at a given point in an electrostatic field.

Note that in general, potential and voltage are relative values. Therefore, ground potential is not always 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, trigonal and rhombohedral crystal systems are included in a hexagonal crystal system.

(Embodiment 1)

In this embodiment, a configuration of a pixel in a display device that is one embodiment of the present invention is described with reference to drawings.

FIG. 1A illustrates a display device 100 as an example of a display device. The display device 100 in FIG. 1A includes a pixel portion 11, a scan line driver circuit 12, a signal line driver circuit 16, scan lines 17 which are arranged parallel or substantially parallel to each other and whose potentials are controlled by the scan line driver circuit 12, and signal lines 25 which are arranged parallel or substantially parallel to each other and whose potentials are controlled by the signal line driver circuit 16. Furthermore, the pixel portion 11 includes pixels 13 arranged in a matrix. Each of the pixels 13 includes a plurality of sub-pixels 14. Furthermore, capacitor lines 19 arranged parallel or substantially parallel to each other for supplying a potential of a potential generation circuit 18 are provided along the signal lines 25.

Note that the display device includes a driver circuit for driving a plurality of pixels and the like. The display device may also be referred to as a liquid crystal module including a control circuit, a power supply circuit, a signal generation circuit, a backlight module, and the like provided over another substrate. Note that the scan line driver circuit 12 has a function of driving the scan lines 17 and may be simply referred to as a circuit. The potential generation circuit 18 has a function of generating a potential to be supplied to the capacitor lines 19 and may be simply referred to as a circuit. The signal line driver circuit 16 has a function of driving the signal lines 25 and may be simply referred to as a circuit.

The pixels 13, in which transmission of light of four colors including white (W) in addition to the three primary colors of red (R), green (G), and blue (B) is controlled by the sub-pixels 14, have a function of performing color display by additive mixture of these colors of light. The sub-pixels which control transmission of light of R, G, and B include respective coloring films for changing light from a light source into light of these colors. Note that the sub-pixel which controls transmission of light of W transmits light without change when light from the light source is white. Note that white may be obtained by additive mixture of R, G, and B or by mixture of complementary colors.

White light obtained from the sub-pixels which transmit light of R, G, and B have passed through color filters and therefore has a lower intensity than light from the light source. White light obtained from the sub-pixel which transmits W light from the light source without change as in one embodiment of the present invention hardly loses its intensity after emission from the light source. Therefore, white light obtained in one embodiment of the present invention from the sub-pixels which transmit light of R, G, B, and W has a higher intensity than white light obtained from the sub-pixels which transmit light of R, G, and B. In other words, white light obtained from the sub-pixels which transmit light of R, G, B, and W is prevented from losing its intensity. Thus, compared with the case where white light is obtained from a display device including sub-pixels which transmit light of R, G, and B, the configuration in one embodiment of the present invention with sub-pixels which transmit light of R, G, B, and W allows the intensity of light from a light source to be lower. Accordingly, power consumption of the display device can be lowered.

The sub-pixels 14 have a function of controlling light transmission by supplying a scan signal to control the conduction of a transistor, retaining a data signal in a capacitor, and driving a display element in accordance with the amount of charge supplied by the data signal. Note that the sub-pixels 14 include first to fourth sub-pixels corresponding to the colors of R, G, B, and W.

In one example, the scan lines 17 are electrically connected in different manners among rows to the sub-pixels 14 arranged in a matrix in the pixel portion 11. For example, the scan line 17 in the first row is electrically connected to the sub-pixels 14 which control transmission of light of R, G, and B in the pixels 13 in the first row. The scan line 17 in the second row is electrically connected to the sub-pixels 14 which control transmission of W light in the pixels 13 in the first row and to the sub-pixels 14 which control transmission of W light in the pixels 13 in the second row. The scan line 17 in the third row is electrically connected to the sub-pixels 14 which control transmission of light of R, G, and B in the pixels 13 in the second row. Note that the scan lines 17 are provided to supply signals to select sub-pixels and may be simply referred to as wirings.

In one example, the signal lines 25 are electrically connected in different manners among columns to the sub-pixels 14 arranged in a matrix in the pixel portion 11. For example, the signal line 25 in the first column is electrically connected to the sub-pixels 14 which control transmission of R light in the pixels 13 in the first column. The signal line 25 in the second column is electrically connected to the sub-pixels 14 which control transmission of G light in the pixels 13 in the first column. The signal line 25 in the third column is electrically connected to the sub-pixels 14 which control transmission of B light and the sub-pixels 14 which control transmission of W light in the pixels 13 electrically connected to the signal line in the first column. Note that the signal lines 25 are provided to supply data of data signals to sub-pixels and may be simply referred to as wirings.

In one example, the capacitor line 19 in the first column is electrically connected to the sub-pixels 14 which control transmission of light of R, G, B, and W in the pixels 13 in the first to third columns. Note that the capacitor lines 19 are provided to supply a fixed potential to sub-pixels and may be simply referred to as wirings.

Figure 27A:
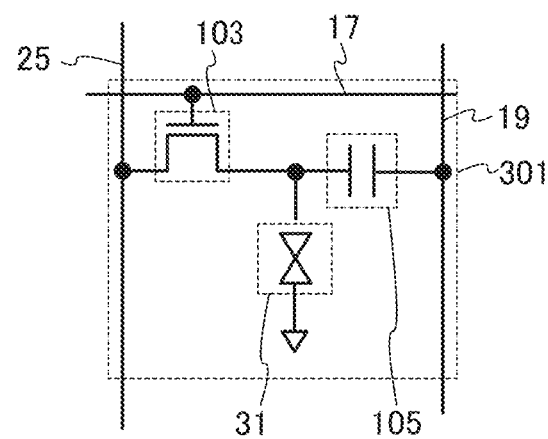
FIGS. 27A and 27B are each a circuit diagram illustrating one embodiment of a display device.
Figure 27B:
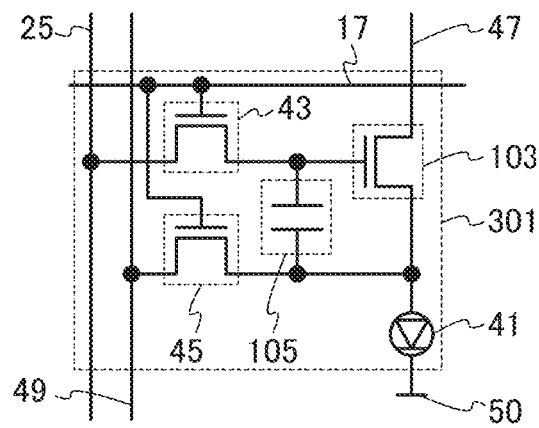

FIGS. 27A and 27B illustrate examples of circuit configurations which can be used in the sub-pixels 14 in the display device illustrated in FIG. 1A.

A sub-pixel 301 illustrated in FIG. 27A includes a liquid crystal element 31, a transistor 103, and a capacitor 105.

The potential of one of a pair of electrodes of the liquid crystal element 31 is set in accordance with the specifications of the sub-pixel 301 as appropriate. The alignment state of the liquid crystal element 31 depends on written data. A common potential may be supplied to one of the pair of electrodes of the liquid crystal element 31 included in each of the plurality of sub-pixels 301. Further, the potential supplied to one of the pair of electrodes of the liquid crystal element 31 in the sub-pixel 301 in one row may be different from the potential supplied to one of the pair of electrodes of the liquid crystal element 31 in the sub-pixel 301 in another row.

The liquid crystal element 31 is an element that controls transmission or non-transmission of light utilizing an optical modulation action of liquid crystal. Note that optical modulation action of a liquid crystal is controlled by an electric field applied to the liquid crystal (including a horizontal electric field, a vertical electric field, and an oblique electric field). Note that the following can be used for the liquid crystal element 31: a nematic liquid crystal, a cholesteric liquid crystal, a smectic liquid crystal, a thermotropic liquid crystal, a lyotropic liquid crystal, a ferroelectric liquid crystal, an anti-ferroelectric liquid crystal, and the like.

As examples of a driving method of the display device including the liquid crystal element 31, any of the following modes can be given: a TN mode, a VA mode, an axially symmetric aligned micro-cell (ASM) mode, an optically compensated birefringence (OCB) mode, an MVA mode, a patterned vertical alignment (PVA) mode, an IPS mode, an FFS mode, a transverse bend alignment (TBA) mode, and the like. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less. In addition, the liquid crystal exhibiting a blue phase is optically isotropic; therefore, alignment treatment is not necessary and viewing angle dependence is small.

In the configuration of the sub-pixel 301 illustrated in FIG. 27A, one of a source electrode and a drain electrode of the transistor 103 is electrically connected to the signal line 25, and the other is electrically connected to the other of the pair of electrodes of the liquid crystal element 31. A gate electrode of the transistor 103 is electrically connected to the scan line 17. The transistor 103 has a function of controlling whether to write a data signal by being turned on or off.

In the configuration of the sub-pixel 301 illustrated in FIG. 27A, one of a pair of electrodes of the capacitor 105 is electrically connected to the capacitor line 19 to which a potential is supplied, and the other is electrically connected to the other of the pair of electrodes of the liquid crystal element 31. The potential of the capacitor line 19 is set in accordance with the specifications of the sub-pixel 301 as appropriate. The capacitor 105 functions as a storage capacitor for storing written data.

For example, in the display device including the sub-pixels 301 in FIG. 27A, the sub-pixels 301 are sequentially selected row by row by the scan line driver circuit 12, whereby the transistors 103 are turned on and a data signal is written.

When the transistors 103 are turned off, the sub-pixels 301 in which the data has been written are brought into a holding state. This operation is sequentially performed row by row; thus, an image is displayed.

A sub-pixel 301 illustrated in FIG. 27B includes a transistor 43 for switching a display element, the transistor 103 for controlling driving of a pixel, a transistor 45, the capacitor 105, and a light-emitting element 41.

One of a source electrode and a drain electrode of the transistor 43 is electrically connected to the signal line 25 to which a data signal is supplied. A gate electrode of the transistor 43 is electrically connected to the scan line 17 to which a gate signal is supplied.

The transistor 43 has a function of controlling whether to write a data signal by being turned on or off.

One of source and drain electrodes of the transistor 103 is electrically connected to a wiring 47 serving as an anode line. The other of the source and drain electrodes of the transistor 103 is electrically connected to one of electrodes of the light-emitting element 41. A gate electrode of the transistor 103 is electrically connected to the other of the source and drain electrodes of the transistor 43 and one of electrodes of the capacitor 105.

The transistor 103 has a function of controlling current flowing to the light-emitting element 41 by being turned on or off.

One of source and drain electrodes of the transistor 45 is connected to a wiring 49 to which a data reference potential is supplied. The other of the source and drain electrodes of the transistor 45 is electrically connected to the one of the electrodes of the light-emitting element 41 and the other of the electrodes of the capacitor 105. A gate electrode of the transistor 45 is electrically connected to the scan line 17 to which a gate signal is supplied.

The transistor 45 has a function of controlling current flowing to the light-emitting element 41. For example, in the case where internal resistance of the light-emitting element 41 is increased by degradation or the like, by monitoring current flowing through the wiring 49 that is connected to the one of the source and drain electrodes of the transistor 45, current flowing to the light-emitting element 41 can be corrected. A potential that is supplied to the wiring 49 can be 0 V, for example.

The one of the pair of electrodes of the capacitor 105 is electrically connected to the other of the source and drain electrodes of the transistor 43 and the gate electrode of the transistor 103. The other of the pair of electrodes of the capacitor 105 is electrically connected to the other of the source and drain electrodes of the transistor 45 and the one of the electrodes of the light-emitting element 41.

In the configuration of the sub-pixel 301 illustrated in FIG. 27B, the capacitor 105 functions as a storage capacitor for storing written data.

The one of the pair of electrodes of the light-emitting element 41 is electrically connected to the other of the source and drain electrodes of the transistor 45, the other of the pair of electrodes of the capacitor 105, and the other of the source and drain electrodes of the transistor 103. The other of the pair of electrodes of the light-emitting element 41 is electrically connected to a wiring 50 serving as a cathode line.

As the light-emitting element 41, an organic electroluminescent element (also referred to as an organic EL element) or the like can be used, for example. Note that the light-emitting element 41 is not limited to organic EL elements; an inorganic EL element including an inorganic material can be used.

Note that a high power supply potential VDD is supplied to one of the wirings 47 and 50, and a low power supply potential VSS is supplied to the other. In the configuration illustrated in FIG. 27B, the high power supply potential VDD is supplied to the wiring 47, and the low power supply potential VSS is supplied to the wiring 50.

In the display device including the sub-pixels 301 in FIG. 27B, the sub-pixels 301 are sequentially selected row by row by the scan line driver circuit 12, whereby the transistors 43 are turned on and a data signal is written.

When the transistors 43 are turned off, the sub-pixels 301 in which the data has been written are brought into a holding state. The transistor 43 is connected to the capacitor 105, and thus written data can be stored for a long period. The amount of current flowing between the source and drain electrodes is controlled by the transistor 103. The light-emitting element 41 emits light with a luminance corresponding to the amount of flowing current. This operation is sequentially performed row by row; thus, an image is displayed.

Note that although FIGS. 27A and 27B each illustrate an example where the liquid crystal element 31 or the light-emitting element 41 is used for a display element, one embodiment of the present invention is not limited thereto. Any of a variety of display elements may be used. Examples include an electroluminescent (EL) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a display element using a micro electro mechanical system (MEMS), a digital micromirror device (DMD), a digital micro shutter (DMS), an interferometric modulator display (IMOD), a MEMS shutter display element, an optical-interference-type MEMS display element, an electrowetting element, a piezoelectric ceramic display, or a carbon nanotube, which are display media whose contrast, luminance, reflectance, transmittance, or the like is changed by electromagnetic action. Examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples further include a display device including electronic ink or electrophoretic elements, such as electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Figure 1B:
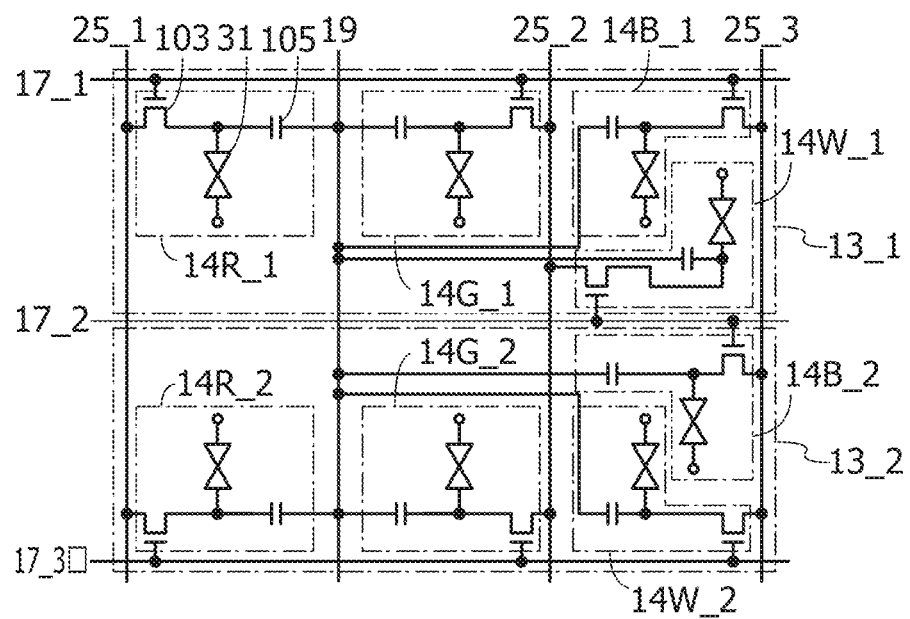

FIG. 1B illustrates an example of a circuit configuration in the case where the circuit configuration illustrated in FIG. 27A is applied to the layout in FIG. 1A.

In FIG. 1B, a pixel 13_1 in an m-th row (m is a natural number) and a pixel 13_2 in an (m+1)-th row are illustrated as the pixels 13.

The pixel 13_1 includes a sub-pixel 14R_1 which controls transmission of R light, a sub-pixel 14G_1 which controls transmission of G light, a sub-pixel 14B_1 which controls transmission of B light, and a sub-pixel 14W_1 which controls transmission of W light. The pixel 13_2 includes a sub-pixel 14R_2 which controls transmission of R light, a sub-pixel 14G_2 which controls transmission of G light, a sub-pixel 14B_2 which controls transmission of B light, and a sub-pixel 14W_2 which controls transmission of W light.

Note that the sub-pixels 14R_1 and 14R_2 may be referred to as first sub-pixels. The sub-pixels 14G_1 and 14G_2 may be referred to as second sub-pixels. The sub-pixels 14B_1 and 14B_2 may be referred to as third sub-pixels. The sub-pixels 14W_1 and 14W_2 may be referred to as fourth sub-pixels.

Each of the sub-pixels 14R_1 to 14W_2 in the pixels 13_1 and 13_2 includes the transistor 103, the capacitor 105, and the liquid crystal element 31.

In FIG. 1B, a scan line 17_1 in an M-th row (M is a natural number), a scan line 17_2 in an (M+1)-th row, and a scan line 17_3 in an (M+2)-th row are illustrated as the scan lines 17.

In FIG. 1B, a signal line 25_1 in an n-th column (n is a natural number), a signal line 25_2 in an (n+1)-th column, and a signal line 25_3 in an (n+2)-th column are illustrated as the signal lines 25.

Note that the sub-pixels 14R may be referred to as first sub-pixels. The sub-pixels 14G may be referred to as second sub-pixels. The sub-pixels 14B may be referred to as third sub-pixels. The sub-pixels 14W may be referred to as fourth sub-pixels.

A first gate line serving also as a gate electrode is connected so as to be able to select three sub-pixels of four sub-pixels, and a second gate line is connected so as to be able to select the remaining one of the four sub-pixels and also one sub-pixel in the next row.

In the case where the sub-pixels 14R_1 and 14R_2 in the pixels 13_1 and 13_2 are disposed as illustrated in FIGS. 1A and 1B, the number of signal lines can be the same as that in a pixel in which R, G, and B sub-pixels are disposed in a stripe arrangement. In addition, the number of scan lines for two pixels can be as small as three.

For example, in the case where the display device is a liquid crystal display device and four R, G, B, and W sub-pixels are disposed in a stripe arrangement, the sub-pixels can be controlled using a total of six wirings which are four data lines, one scan line, and one capacitor line; however, the number of signals lines is increased.

In the case where four R, G, B, and W sub-pixels are disposed in two rows and two columns, the sub-pixels can be controlled using a total of five wirings which are two data lines, two scan lines, and one capacitor line; however, the number of scan lines for pixels in one row is increased. In this case, the circuit configuration of the scan line driver circuit 12 is enlarged, which makes it difficult to achieve a narrow bezel in the display device.

In the configuration disclosed in one embodiment of the present invention, the sub-pixels 14R_1 to 14W_2 in the pixels 13_1 and 13_2 arranged in two rows can be driven using three scan lines. In addition, in the configuration disclosed in one embodiment of the present invention, the number of signal lines can be the same as that in the case where three R, G, and B sub-pixels are disposed in a stripe arrangement; thus, the number of signal lines can be decreased in comparison to the case where four R, G, B and W sub-pixels are disposed in a stripe arrangement. Thus, the circuit configuration of the scan line driver circuit 12 can be made particularly small, which makes it possible to achieve a narrow bezel in the display device.

Figure 28A:
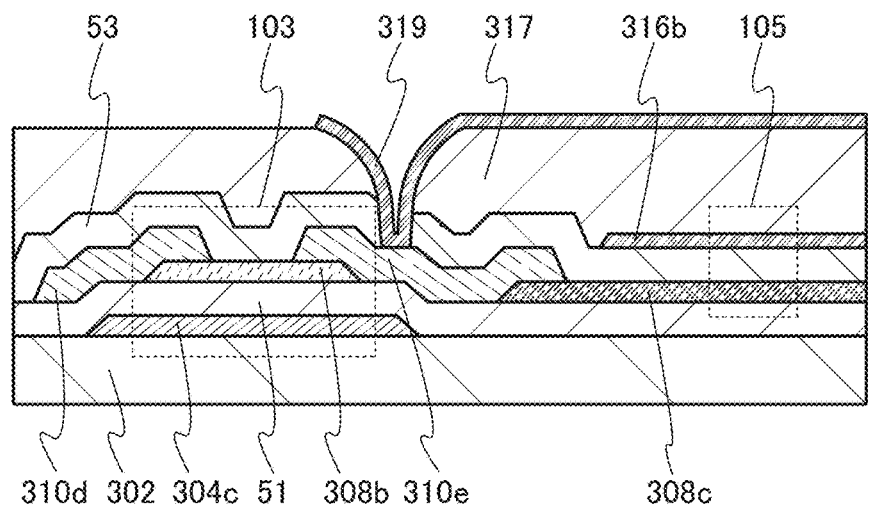
FIGS. 28A to 28C are each a cross-sectional view illustrating one embodiment of a display device.

FIG. 28A illustrates a cross-sectional view of the transistor 103 and the capacitor 105 of the display device.

The transistor 103 in FIG. 28A includes a conductive film 304c serving as a gate electrode over a substrate 302, a gate insulating film 51 over the substrate 302 and the conductive film 304c, an oxide semiconductor film 308b overlapping with the conductive film 304c with the gate insulating film 51 provided therebetween, and a pair of conductive films 310d and 310e serving as a source electrode and a drain electrode in contact with the oxide semiconductor film 308b.

A metal oxide film 308c is provided over the gate insulating film 51. Note that the metal oxide film 308c is connected to the conductive film 310e that is one of the pair of conductive films included in the transistor 103. An inorganic insulating film 53 is provided over the transistor 103 and the metal oxide film 308c. A conductive film 316b is provided over the inorganic insulating film 53. The capacitor 105 is formed by the metal oxide film 308c, the inorganic insulating film 53, and the conductive film 316b.

An organic insulating film 317 is provided over the inorganic insulating film 53 and the conductive film 316b. A conductive film 319, connected to the conductive film 310e through an opening provided in the inorganic insulating film 53 and the organic insulating film 317, is provided over the organic insulating film 317. The conductive film 319 serves as a pixel electrode.

The metal oxide film 308c is a conductive film whose conductivity is increased by adding an impurity such as hydrogen, boron, phosphorus, nitrogen, tin, antimony, a rare gas element, an alkali metal, or an alkaline earth metal to an oxide semiconductor film formed at the same time as the oxide semiconductor film 308b and by forming oxygen vacancies. Since the oxide semiconductor film has light-transmitting properties, the metal oxide film 308c also has light-transmitting properties.

Note that in an oxide semiconductor including oxygen vacancies, hydrogen enters oxygen vacant sites and forms a donor level in the vicinity of the conduction band. As a result, the conductivity of the oxide semiconductor is increased, so that the oxide semiconductor becomes a conductor. An oxide semiconductor that has become a conductor is referred to as a metal oxide film or may be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

The conductive films 316b and 319 are formed using light-transmitting conductive films. Thus, the capacitor 105 has light-transmitting properties. Consequently, in a pixel, the area of the capacitor can be increased, and the capacitance of the capacitor and the aperture ratio of the pixel can be increased.

The inorganic insulating film 53 includes at least an oxide insulating film, and preferably further includes a stack of an oxide insulating film and a nitride insulating film. In the inorganic insulating film 53, when an oxide insulating film is formed in a region in contact with the oxide semiconductor film 308b, the number of defects at an interface between the oxide semiconductor film 308b and the inorganic insulating film 53 can be reduced.

The nitride insulating film functions as a barrier film against water, hydrogen, or the like. When the oxide semiconductor film 308b contains water, hydrogen, or the like, oxygen contained in the oxide semiconductor film 308b reacts with water, hydrogen, or the like, so that oxygen vacancies are formed. The oxygen vacancies generate carriers in the oxide semiconductor film 308b, the threshold voltage of the transistor is shifted in a negative direction, and the transistor is normally on. Thus, when the inorganic insulating film 53 includes a nitride insulating film, the amount of water, hydrogen, or the like diffusing from the outside into the oxide semiconductor film 308b can be reduced, and the number of defects in the oxide semiconductor film 308b can be reduced. Accordingly, in the inorganic insulating film 53, when the oxide insulating film and the nitride insulating film are stacked sequentially from the oxide semiconductor film 308b side, the number of defects at the interface between the oxide semiconductor film 308b and the inorganic insulating film 53 and the number of oxygen vacancies in the oxide semiconductor film 308b can be reduced, so that a normally-off transistor can be formed.

Since the organic insulating film 317 is formed using an organic resin such as an acrylic resin, a polyimide resin, or an epoxy resin, the organic insulating film 317 has high flatness. The thickness of the organic insulating film 317 is greater than or equal to 500 nm and less than or equal to 5000 nm, preferably greater than or equal to 1000 nm and less than or equal to 3000 nm.

The conductive film 319 formed over the organic insulating film 317 is connected to the transistor 103. The conductive film 319 functions as a pixel electrode, and is connected to the transistor 103 through an opening provided in the inorganic insulating film 53 and the organic insulating film 317. Since the conductive film 319 is apart from the transistor 103, the conductive film 319 is less likely to be affected by the potential of the conductive film 310d in the transistor 103. Accordingly, it is possible to provide the conductive film 319 to overlap with the transistor 103. Thus, the aperture ratio of a pixel can be increased.

Here the case is described as a comparison example in which in a display device including the transistor 103 that does not include the organic insulating film 317 over the inorganic insulating film 53, a negative voltage is applied to the conductive film 304c functioning as the gate electrode of the transistor 103.

When a negative voltage is applied to the conductive film 304c functioning as the gate electrode, an electric field is generated. The electric field is not blocked by the oxide semiconductor film 308b and affects the inorganic insulating film 53; thus, a surface of the inorganic insulating film 53 is charged with weak positive charge. In addition, when a negative voltage is applied to the conductive film 304c functioning as the gate electrode, positively charged particles contained in air are adsorbed to the surface of the inorganic insulating film 53, so that the surface of the inorganic insulating film 53 is charged with weak positive charge.

When the surface of the inorganic insulating film 53 is charged with positive charge, an electric field is generated and affects the interface between the oxide semiconductor film 308b and the inorganic insulating film 53. Thus, practically a positive bias is applied to the interface between the oxide semiconductor film 308b and the inorganic insulating film 53, so that the threshold voltage of the transistor is shifted in a negative direction.

On the other hand, the transistor 103 in FIG. 28A includes the organic insulating film 317 over the inorganic insulating film 53. Since the organic insulating film 317 is thick, an electric field generated by application of a negative voltage to the conductive film 304c serving as a gate electrode does not affect a surface of the organic insulating film 317; as a result, the surface of the organic insulating film 317 is less likely to be charged with positive charge. In addition, even when positively charged particles in the air are adsorbed on the surface of the organic insulating film 317, the electric field of the positively charged particles adsorbed on the surface of the organic insulating film 317 is less likely to affect the interface between the oxide semiconductor film 308b and the inorganic insulating film 53, because the organic insulating film 317 is thick. As a result, practically no positive bias is applied to the interface between the oxide semiconductor film 308b and the inorganic insulating film 53; thus, a change in the threshold voltage of the transistor is small.

Water or the like is easily diffused into the organic insulating film 317; however, when the inorganic insulating film 53 includes a nitride insulating film, the nitride insulating film serves as a water barrier film that prevents water diffused into the organic insulating film 317 from being diffused into the oxide semiconductor film 308b.

Accordingly, when the organic insulating film 317 is provided over the transistor, a change in the electrical characteristics of the transistor can be reduced. In addition, a normally-off transistor having high reliability can be formed. Furthermore, the organic insulating film can be formed by a printing method, a coating method, or the like; thus, manufacturing time can be shortened. Moreover, by providing the conductive film that functions as a pixel electrode over the organic insulating film 317, the aperture ratio of a pixel can be increased.

<Oxide Conductor (Metal Oxide Film)>

Figure 29:
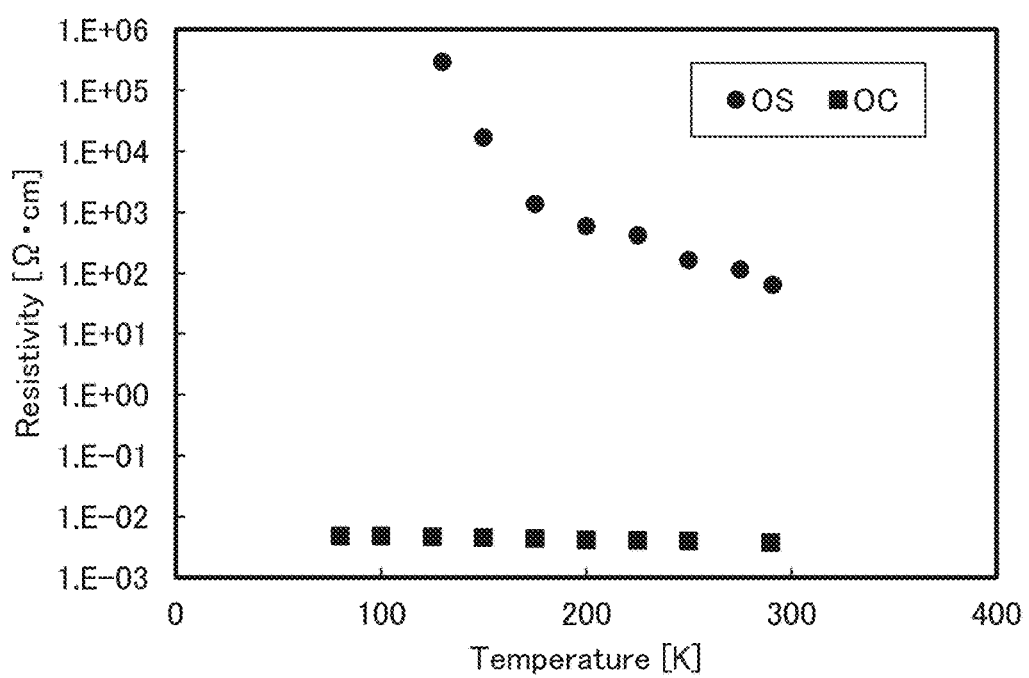
FIG. 29 shows temperature dependence of resistivity.

Here, the temperature dependence of resistivity of a film formed with an oxide semiconductor (hereinafter referred to as an oxide semiconductor film (OS)) and that of a film formed with an oxide conductor (hereinafter referred to as an oxide conductor film (OC)) will be described with reference to FIG. 29. In FIG. 29, the horizontal axis represents measurement temperature, and the vertical axis represents resistivity. Measurement results of the oxide semiconductor film (OS) are plotted as circles, and measurement results of the oxide conductor film (OC) are plotted as squares.

Note that a sample including the oxide semiconductor film (OS) was prepared by forming a 35-nm-thick In—Ga—Zn oxide film over a glass substrate by a sputtering method using a sputtering target with an atomic ratio of In:Ga:Zn=1:1:1.2, forming a 20-nm-thick In—Ga—Zn oxide film over the 35-nm-thick In—Ga—Zn oxide film by a sputtering method using a sputtering target with an atomic ratio of In:Ga:Zn=1:4:5, performing heat treatment in a 450° C. nitrogen atmosphere and then performing heat treatment in a 450° C. atmosphere of a mixed gas of nitrogen and oxygen, and forming a silicon oxynitride film by a plasma CVD method.

A sample including the oxide conductor film (OC) was prepared by forming a 100-nm-thick In—Ga—Zn oxide film over a glass substrate by a sputtering method using a sputtering target with an atomic ratio of In:Ga:Zn=1:1:1, performing heat treatment in a 450° C. nitrogen atmosphere and then performing heat treatment in a 450° C. atmosphere of a mixed gas of nitrogen and oxygen, and forming a silicon nitride film by a plasma CVD method.

As can be seen from FIG. 29, the temperature dependence of resistivity of the oxide conductor film (OC) is lower than the temperature dependence of resistivity of the oxide semiconductor film (OS). Typically, the range of variation of resistivity of the oxide conductor film (OC) at temperatures from 80 K to 290 K is from more than −20% to less than +20%. Alternatively, the range of variation of resistivity at temperatures from 150 K to 250 K is from more than −10% to less than +10%. In other words, the oxide conductor is a degenerate semiconductor and it is suggested that the conduction band edge agrees with or substantially agrees with the Fermi level. Therefore, the oxide conductor film can be used as a wiring, an electrode, or a pixel electrode, for example.

<Modification Example 1>

A modification example of the transistor illustrated in FIG. 28A is described with reference to FIG. 28B. A transistor 103c described in this modification example includes an oxide semiconductor film 308e and a pair of conductive films 310f and 310g that are formed using a multi-tone mask. In addition, the transistor 103c and the capacitor 105 are connected to each other through the conductive film 319 functioning as a pixel electrode.

With the use of the multi-tone mask, a resist mask having a plurality of thicknesses can be formed. After the oxide semiconductor film 308e is formed using the resist mask, the resist mask is exposed to oxygen plasma or the like; thus, the resist mask is partly removed to be a resist mask used for forming the pair of conductive films. As a result, the number of steps in photolithography in a process for forming the oxide semiconductor film 308e and the pair of conductive films 310f and 310g can be reduced.

Note that part of the oxide semiconductor film 308e formed using the multi-tone mask extends beyond and is not covered with the pair of conductive films 310f and 310g in a planar shape. That is, the part of the oxide semiconductor film 308e is exposed on the outside of the pair of conductive films 310f and 310g.

Figure 28B:
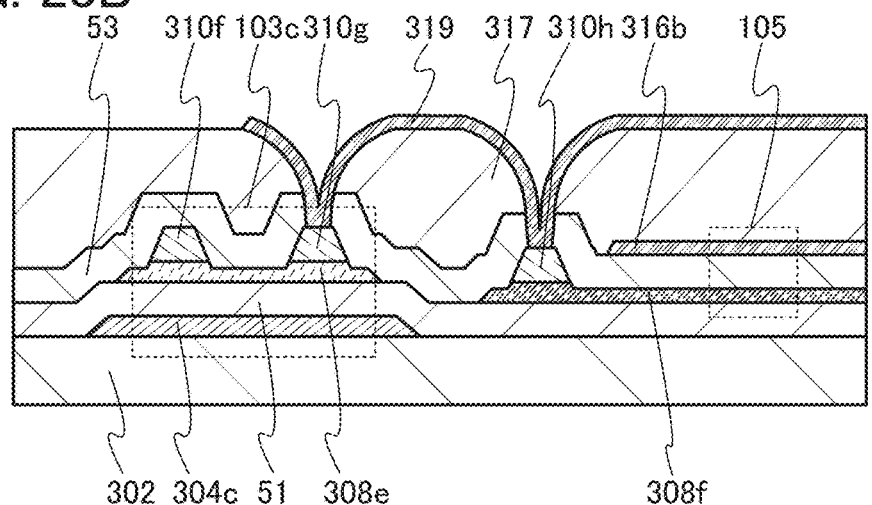

In FIG. 28B, a metal oxide film 308f is formed over the gate insulating film 51. In addition, a conductive film 310h is formed over the metal oxide film 308f at the same time as the conductive films 310f and 310g. The conductive film 319 is connected to the conductive films 310g and 310h. As a result, the transistor 103c and the capacitor 105 are electrically connected to each other.

<Modification Example 2>

A modification example of the transistor illustrated in FIG. 28A is described with reference to FIG. 28C. A transistor 103d in this modification example has a channel protective structure.

The transistor 103d with a channel protective structure has openings in an insulating film 53a, and the oxide semiconductor film 308b is connected to a pair of conductive films 310i and 310j through the openings. This structure can reduce damage to the oxide semiconductor film 308b.

<Modification Example 3>

Figure 28C:
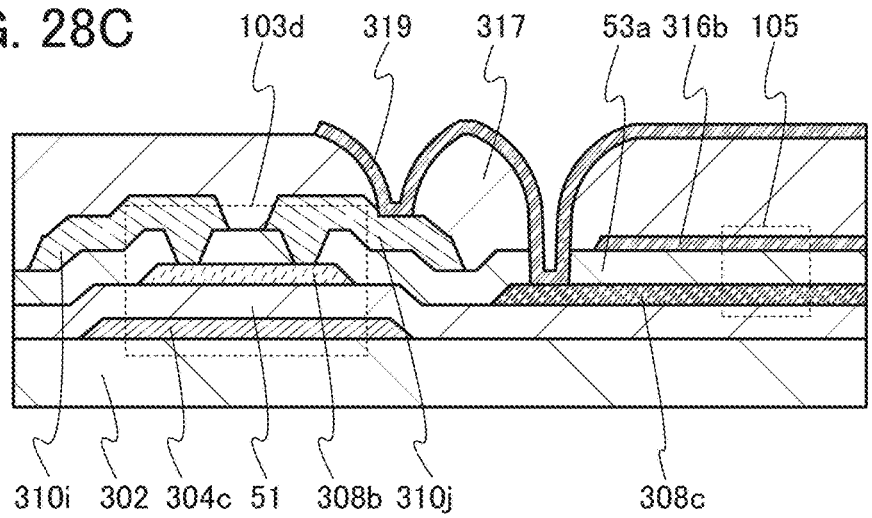

In each of the display devices illustrated in FIGS. 28A to 28C, depending on circumstances or conditions, the conductive film 319 may be formed using a conductive film having a function of reflecting light, for example. Alternatively, the conductive film 319 may be formed using stacked films at least one of which is a conductive film having a function of reflecting light. Examples of a material of the conductive film having a function of reflecting light include silver, aluminum, chromium, copper, tantalum, titanium, molybdenum, and tungsten. Alternatively, the conductive film 319 may be formed using stacked films in which a film formed using silver is sandwiched between ITO films. In this case, each of the display devices illustrated in FIGS. 28A to 28C can be applied to a reflective display device, a semi-transmissive display device, a top emission type light-emitting device, or the like.

The above-described display device of one embodiment of the present invention includes a first pixel which includes first to fourth sub-pixels, a second pixel which is in a row next to that of the first pixel and includes first to fourth sub-pixels, a first wiring for supplying a signal to select the first to third sub-pixels of the first pixel, and a second wiring for selecting the fourth sub-pixel of the first pixel. The second wiring is a wiring for selecting the fourth sub-pixel of the second pixel.

Therefore, the number of signal lines can be the same as the number of signal lines for three R, G, and B sub-pixels in a stripe arrangement, and the number of scan lines for pixels in two rows can be decreased to three. Thus, the size of the circuit configuration of the scan line driver circuit 12 can be decreased. In addition, the bezel of the display device can be narrower.

In the display device of one embodiment of the present invention, thanks to the light-transmitting property of the capacitor, the capacitor can be formed large (covers a large area) in the sub-pixel. Thus, a display device with increased capacitance and an increased aperture ratio of typically 50% or more, preferably 60% or more can be obtained. For example, in a display device with a high resolution such as a liquid crystal display device, the area of a pixel is small and thus the area of a capacitor is also small. For this reason, the amount of charge stored in the capacitor is small in the high-resolution display device. However, since the capacitor 105 of this embodiment has a light-transmitting property, when it is provided in a pixel, enough capacitance can be obtained in the pixel and the aperture ratio can be increased.

In the liquid crystal display device, as the capacitance of the capacitor is increased, a period in which the alignment of liquid crystal molecules of a liquid crystal element can be kept constant in the state where an electric field is applied can be made longer. When the period can be made longer in the case of displaying a still image, the number of times of rewriting image data can be reduced, leading to a reduction in power consumption. Further, with the configuration described in this embodiment, the aperture ratio can be improved even in a display device with a high resolution, which makes it possible to use light from a light source such as a backlight efficiently, so that power consumption of the display device can be reduced.

Note that a pixel may include four types of sub-pixels which are R, G, B, and W sub-pixels; however, one embodiment of the present invention is not limited thereto. One pixel may include at least a plurality of sub-pixels of the four types of sub-pixels. Different pixels may include different types of sub-pixels.

For example, the first pixel may include an R sub-pixel, a G sub-pixel, and a B sub-pixel, and the second pixel may include an R sub-pixel, a G sub-pixel, and a W sub-pixel. Alternatively, the first pixel may include an R sub-pixel and a G sub-pixel, and the second pixel may include a B sub-pixel and a W sub-pixel. Alternatively, the first pixel may include an R sub-pixel, a G sub-pixel, and a B sub-pixel, and the second pixel may include an R sub-pixel, a G sub-pixel, a B sub-pixel, and a W sub-pixel.

Note that the structures, methods, and the like described in this embodiment can be used as appropriate in combination with any of the structures, methods, and the like described in other embodiments.

(Embodiment 2)

In this embodiment, a display device which is one embodiment of the present invention and a manufacturing method thereof are described with reference to drawings illustrating a specific structure.

Figure 2:
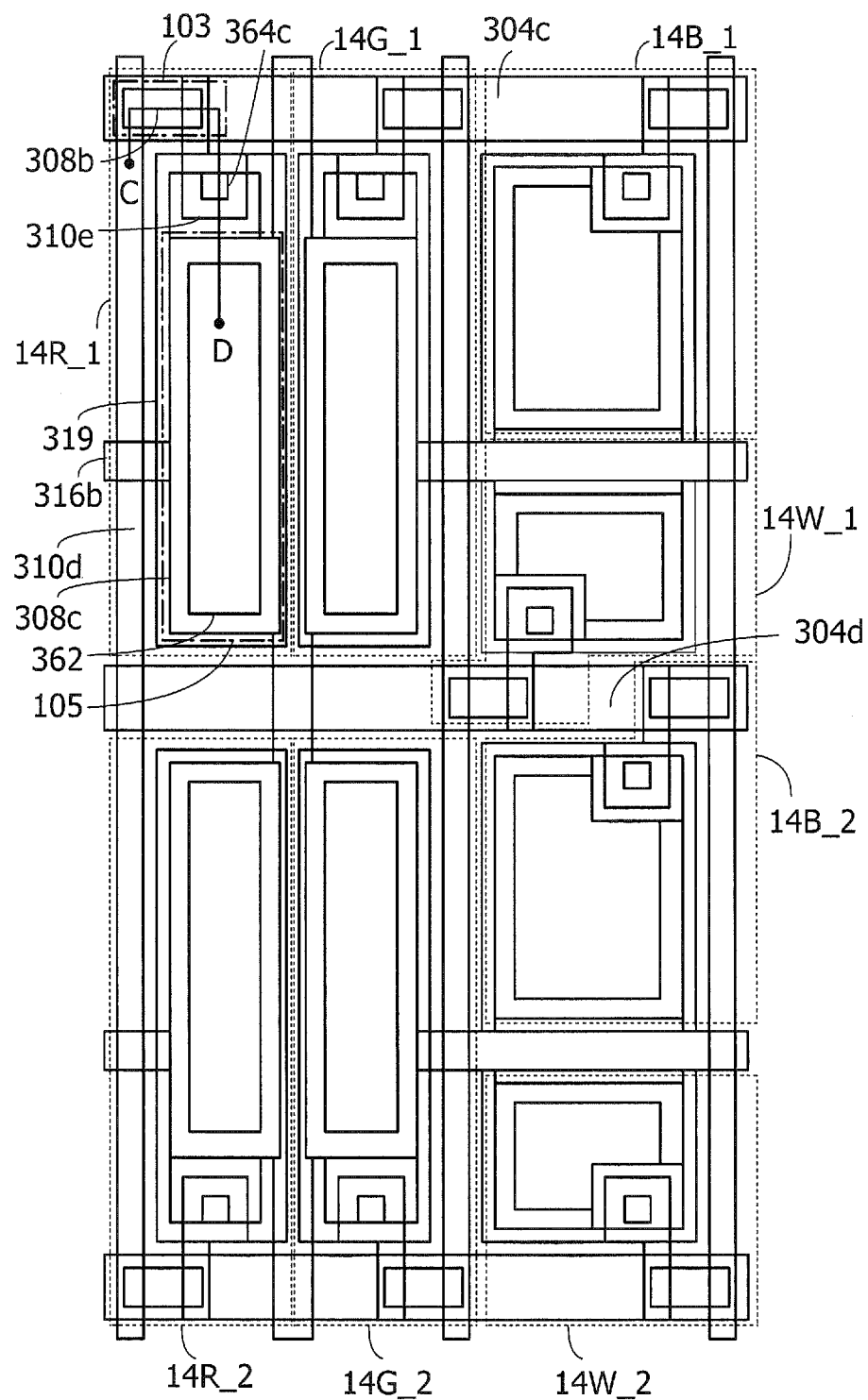
FIG. 2 is a top view illustrating one embodiment of a display device.
Figure 3:
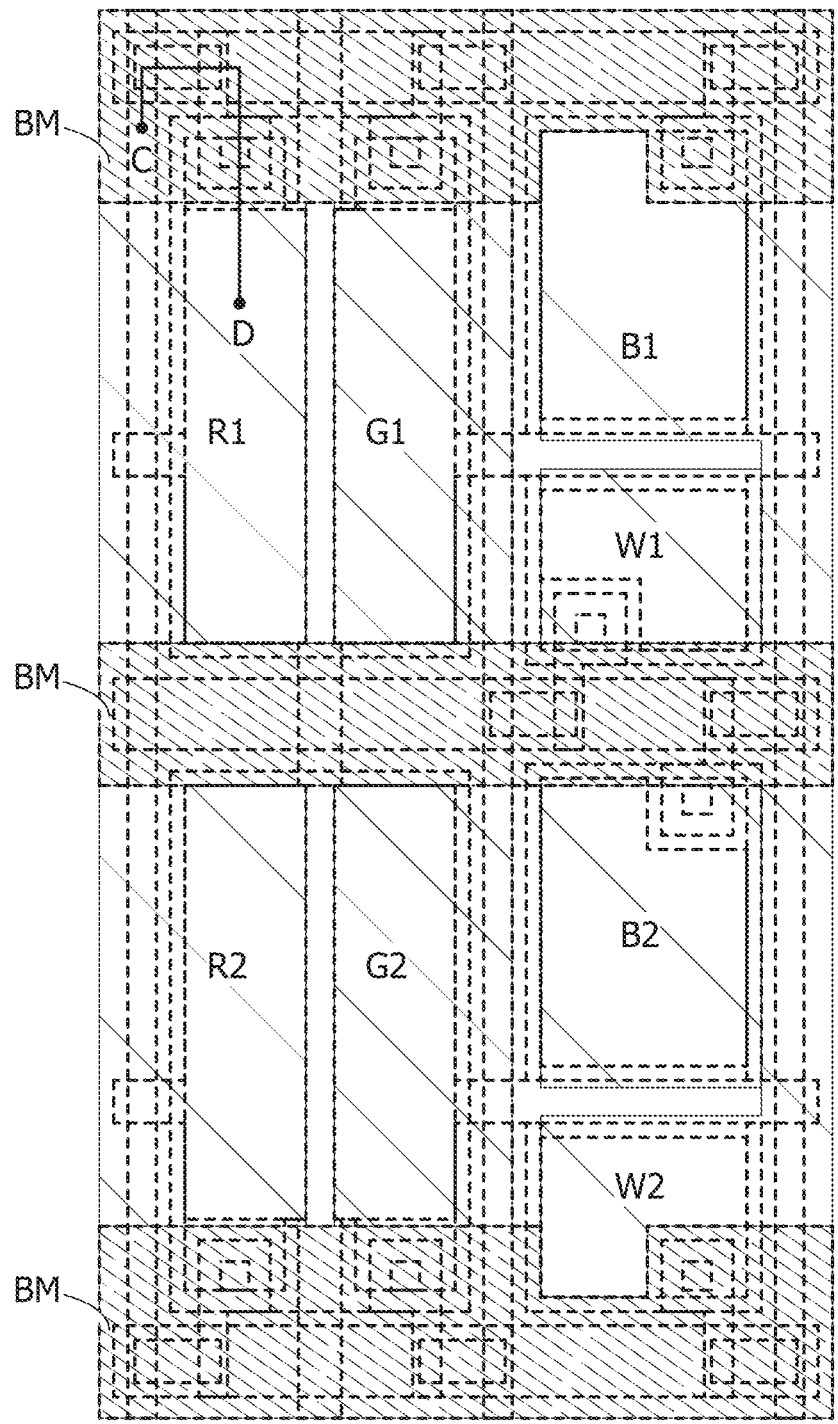
FIG. 3 is a top view illustrating one embodiment of a display device.

First, a specific structure of an element substrate included in the display device is described. Here, a VA mode liquid crystal display device is used as the display device, and a top view of sub-pixels 14R_1, 14G_1, 14B_1, 14W_1, 14R_2, 14G_2, 14B_2, and 14W_2 (hereinafter referred to as sub-pixels 14) included in the liquid crystal display device is described. FIG. 2 is a top view illustrating the layout of components in the sub-pixels 14 on the element substrate side. FIG. 3 is a top view illustrating the layout of components on the counter substrate side, which corresponds to the top view of the components on the element substrate side in FIG. 2. Note that the top views in FIGS. 2 and 3 correspond to the circuit configuration in FIG. 1B.

In FIG. 2, the conductive film 304c serving as a scan line of the sub-pixels 14R_1, 14G_1, and 14B_1 and a conductive film 304d serving as a scan line of the sub-pixels 14W_1 and 14W_2 extend substantially perpendicularly to a conductive film serving as a signal line (in the horizontal direction in the drawing). The conductive film 310d serving as a signal line extends substantially perpendicularly to the conductive film serving as a scan line (in the vertical direction in the drawing). Note that the conductive film 304c serving as a scan line is electrically connected to the scan line driver circuit 12 (see FIG. 1A), and the conductive film 310d serving as a signal line is electrically connected to the signal line driver circuit 16 (see FIG. 1A).

The transistor 103 is provided at a region where the conductive film serving as a scan line and the conductive film serving as a signal line cross each other. The transistor 103 includes the conductive film 304c serving as a gate electrode; a gate insulating film (not illustrated in FIG. 2); the oxide semiconductor film 308b where a channel region is formed, over the gate insulating film; and the pair of conductive films 310d and 310e serving as a source electrode and a drain electrode. The conductive film 304c also serves as the conductive film serving as a scan line, and a region of the conductive film 304c that overlaps with the oxide semiconductor film 308b serves as the gate electrode of the transistor 103. In addition, the conductive film 310d also serves as the conductive film serving as a signal line, and a region of the conductive film 310d that overlaps with the oxide semiconductor film 308b serves as the source electrode or drain electrode of the transistor 103. Further, in the top view of FIG. 2, an end portion of the conductive film serving as a scan line is located on the outer side of an end portion of the oxide semiconductor film 308b. Thus, the conductive film serving as a scan line functions as a light-blocking film for blocking light from a light source such as a backlight. For this reason, the oxide semiconductor film 308b included in the transistor is not irradiated with light, so that a variation in the electrical characteristics of the transistor can be suppressed.

The metal oxide film 308c is connected to the conductive film 310e of the transistor 103. The conductive film 316b is formed over the metal oxide film 308c with an insulating film positioned therebetween. Note that an opening 362 is formed in the insulating film provided over the metal oxide film 308c. In the opening 362, the metal oxide film 308c is in contact with a nitride insulating film (not illustrated in FIG. 2) included in the insulating films.

The capacitor 105 is formed in a region where the metal oxide film 308c and the conductive film 316b overlap with each other. The metal oxide film 308c and the conductive film 316b have light-transmitting properties. Thus, the capacitor 105 has light-transmitting properties.

The conductive film 319 serving as a pixel electrode is provided over the conductive film 310e and the conductive film 316b with an organic insulating film (not illustrated in FIG. 2) positioned therebetween. The conductive film 319 is connected to the conductive film 310e through an opening 364c. That is, the transistor 103, the capacitor 105, and the conductive film 319 are electrically connected to one another.

Thanks to the light-transmitting property of the capacitor 105, the capacitor 105 can be formed large (covers a large area) in the sub-pixel 14. Thus, a display device with increased capacitance and an increased aperture ratio of typically 50% or more, preferably 60% or more can be obtained. For example, in a display device with a high resolution such as a liquid crystal display device, the area of a pixel is small and thus the area of a capacitor is also small. For this reason, the amount of charge stored in the capacitor is small in the high-resolution display device. However, since the capacitor 105 of this embodiment has a light-transmitting property, when it is provided in a pixel, enough capacitance can be obtained in the pixel and the aperture ratio can be increased. Typically, the capacitor 105 can be favorably used in a high-resolution display device with a pixel density of 200 ppi or more, 300 ppi or more, or 500 ppi or more.

In the liquid crystal display device, as the capacitance of the capacitor is increased, a period in which the alignment of liquid crystal molecules of a liquid crystal element can be kept constant in the state where an electric field is applied can be made longer. When the period can be made longer in the case of displaying a still image, the number of times of rewriting image data can be reduced, leading to a reduction in power consumption. Further, with the configuration described in this embodiment, the aperture ratio can be improved even in a display device with a high resolution, which makes it possible to use light from a light source such as a backlight efficiently, so that power consumption of the display device can be reduced.

The top view in FIG. 3 on the counter substrate side, which corresponds to the top view in FIG. 2, illustrates an example of the layout of the sub-pixels 14. In the sub-pixels 14, coloring films R1, G1, and B1, a light-transmitting layer W1, coloring films R2, G2, and B2, and a light-transmitting layer W2 are provided in opening portions in a light-blocking portion BM.

The light-blocking portion BM preferably has a function of blocking light in a particular wavelength region, and can be a metal film or an organic insulating film including a black pigment.

The coloring films R1, G1, B1, R2, G2, and B2 are layers which transmit and change light from a light source into light of certain colors. Typically, color filters may be used, and R, G, and B sub-pixels may be provided with respective color filters.

The light-transmitting layers W1 and W2 are layers which transmit light from a light source. Typically, an organic resin such as an acrylic resin, polyimide, or an epoxy resin may be used and disposed in W sub-pixels. Note that the light-transmitting layers W1 and W2 are not necessarily provided. Alternatively, as layers including the light-transmitting layers W1 and W2, layers which absorb light at particular wavelengths may be provided. This structure enables display with high color purity even when appropriate white light is not obtained depending on the wavelength of a light from light source, because white balance can be adjusted.

Figure 4:
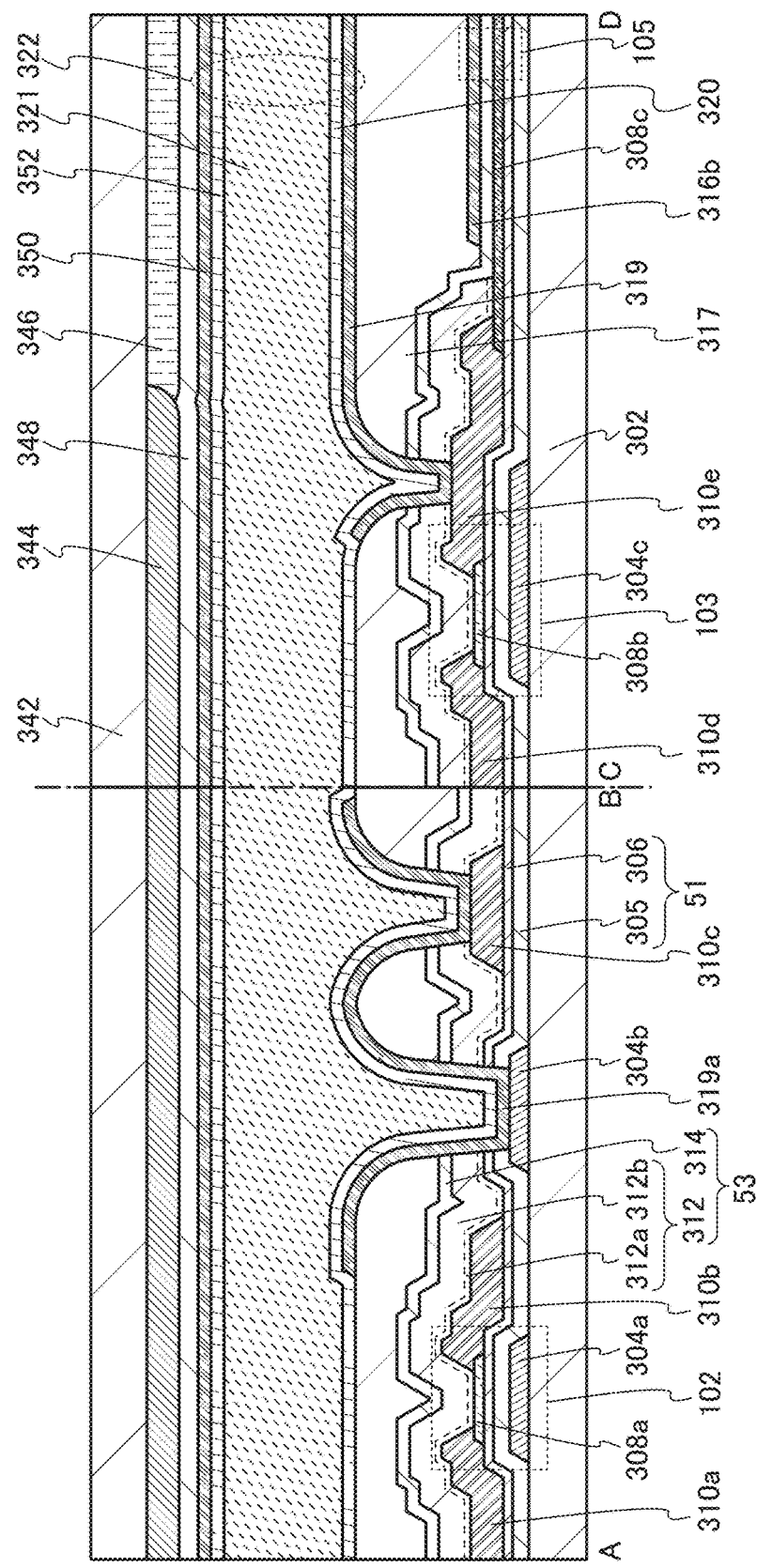
FIG. 4 is a cross-sectional view illustrating one embodiment of a display device.

FIG. 4 shows a cross section taken along line C-D in FIGS. 2 and 3. Note that a cross section A-B in FIG. 4 shows a driver circuit portion (a top view thereof is omitted) including the scan line driver circuit 12 and the signal line driver circuit 16 described with reference to FIGS. 1A and 1B. In this embodiment, the VA mode liquid crystal display device is described as the display device.

In the liquid crystal display device described in this embodiment, a liquid crystal element 322 is provided between a pair of substrates (a substrate 302 and a substrate 342).

The liquid crystal element 322 includes the conductive film 319 over the substrate 302, films controlling alignment (hereinafter referred to as alignment films 320 and 352), a liquid crystal layer 321, and a conductive film 350. Note that the conductive film 319 functions as one electrode of the liquid crystal element 322, and the conductive film 350 functions as the other electrode of the liquid crystal element 322.

Thus, a "liquid crystal display device" refers to a device including a liquid crystal element. The liquid crystal display device includes a driver circuit for driving a plurality of pixels, for example. The liquid crystal display device may also be referred to as a liquid crystal module including a control circuit, a power supply circuit, a signal generation circuit, a backlight module, and the like provided over another substrate.

In the driver circuit portion, a transistor 102 includes a conductive film 304a functioning as a gate electrode, insulating films 305 and 306 collectively functioning as a gate insulating film 51, an oxide semiconductor film 308a in which a channel region is formed, and conductive films 310a and 310b functioning as a source electrode and a drain electrode. The oxide semiconductor film 308a is provided over the gate insulating film 51.

In the pixel portion, the transistor 103 includes the conductive film 304c functioning as a gate electrode, the insulating films 305 and 306 collectively functioning as the gate insulating film 51, the oxide semiconductor film 308b which is formed over the gate insulating film 51 and in which a channel region is formed, and the conductive films 310d and 310e functioning as a source electrode and a drain electrode. The oxide semiconductor film 308b is provided over the gate insulating film 51. Furthermore, insulating films 312 and 314 which correspond to the inorganic insulating film 53 are provided as protective films over the conductive films 310d and 310e.

Further, the capacitor 105 includes the metal oxide film 308c functioning as one electrode of the capacitor 105, the insulating film 314 functioning as a dielectric film, and the conductive film 316b functioning as the other electrode of the capacitor 105. The metal oxide film 308c is provided over the gate insulating film 51.

The organic insulating film 317 is formed over the inorganic insulating film 53. The conductive film 319 serving as a pixel electrode is formed over the organic insulating film 317. The conductive film 319 is connected to the conductive film 310e.

In the driver circuit portion, a conductive film 304b formed at the same time as the conductive films 304a and 304c and a conductive film 310c formed at the same time as the conductive films 310a, 310b, 310d, and 310e are connected to each other by a conductive film 319a formed at the same time as the conductive film 319.

The conductive film 304b and the conductive film 319a are connected to each other through an opening provided in the insulating film 305, the insulating film 306, the insulating film 312, the insulating film 314, and the organic insulating film 317. Further, the conductive film 310c and the conductive film 319a are connected to each other through an opening provided in the insulating film 312, the insulating film 314, and the organic insulating film 317.

Although not illustrated, the conductive film 316b is electrically connected to a conductive film that is formed at the same time as the conductive films 304a to 304c or to a conductive film that is formed at the same time as the conductive films 310a to 310e, by a conductive film that is formed at the same time as the conductive films 319 and 319a. A given potential such as a common potential or a ground potential is applied to the conductive film 316b through the conductive film that is formed at the same time as the conductive films 304a to 304c or the conductive film that is formed at the same time as the conductive films 310a to 310e.

Here, components of the display device shown in FIG. 4 are described below.

The conductive films 304a, 304b, and 304c are formed over the substrate 302. The conductive film 304a functions as a gate electrode of the transistor in the driver circuit portion. The conductive film 304b is formed in the driver circuit portion and connected to the conductive film 310c. The conductive film 304c is formed in the pixel portion 11 and functions as a gate electrode of the transistor in the pixel portion.

There is no particular limitation on a material and the like of the substrate 302 as long as the material has heat resistance high enough to withstand at least heat treatment performed later. For example, a glass substrate, a ceramic substrate, a quartz substrate, or a sapphire substrate may be used as the substrate 302. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 302. In the case where a glass substrate is used as the substrate 302, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm) Thus, a large-sized liquid crystal display device can be manufactured.

Alternatively, a flexible substrate may be used as the substrate 302, and the transistor may be provided directly on the flexible substrate. Alternatively, a separation layer may be provided between the substrate 302 and the transistor. The separation layer can be used when part or the whole of an element portion formed over the separation layer is completed, separated from the substrate 302, and transferred to another substrate. In such a case, the transistor can be transferred to a substrate having low heat resistance or a flexible substrate as well.

The conductive films 304a, 304b, and 304c can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. The conductive films 304a, 304b, and 304c may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are contained may be used.

The conductive films 304a, 304b, and 304c can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

The insulating films 305 and 306 are formed over the substrate 302 and the conductive films 304a, 304c, and 304b. The insulating films 305 and 306 function as the gate insulating film 51 of the transistor in the driver circuit portion and the gate insulating film 51 of the transistor in the pixel portion 11.

The insulating film 305 is preferably formed using a nitride insulating film containing silicon nitride, silicon nitride oxide, aluminum nitride, or aluminum nitride oxide, for example.

The insulating film 306 can be formed to have a single-layer structure or a stacked-layer structure using, for example, any of silicon oxide, silicon oxynitride, silicon nitride oxide, silicon nitride, aluminum oxide, hafnium oxide, gallium oxide, Ga—Zn-based metal oxide, and the like. The insulating film 306 may be formed using a high-k material such as hafnium silicate (HfSi$_x$O$_y$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The total thickness of the insulating films 305 and 306 is greater than or equal to 5 nm and less than or equal to 400 nm, preferably greater than or equal to 10 nm and less than or equal to 300 nm, more preferably greater than or equal to 50 nm and less than or equal to 250 nm.

The oxide semiconductor films 308a and 308b and the metal oxide film 308c are formed over the insulating film 306. The oxide semiconductor film 308a is formed in a position overlapping with the conductive film 304a and functions as a channel region of the transistor in the driver circuit portion. The oxide semiconductor film 308b is formed in a position overlapping with the conductive film 304c and functions as a channel region of the transistor in the pixel portion. The metal oxide film 308c is connected to the conductive film 310e included in the transistor 103 and serves as an electrode of the capacitor 105.

Typical examples of materials of the oxide semiconductor films 308a and 308b and the metal oxide film 308c include an In—Ga oxide, an In—Zn oxide, and an In-M-Zn oxide (M represents Al, Ti, Ga, Y, Zr, La, Ce, Nd, Sn, or Hf). Note that the oxide semiconductor films 308a and 308b and the metal oxide film 308c have a light-transmitting property.

In the case where the oxide semiconductor films 308a and 308b and the metal oxide film 308c contain an In-M-Zn oxide, the proportions of In and M when summation of In and M is assumed to be 100 atomic % are preferably as follows: the atomic percentage of In is greater than or equal to 25 atomic % and the atomic percentage of M is less than 75 atomic %, or more preferably, the atomic percentage of In is greater than or equal to 34 atomic % and the atomic percentage of M is less than 66 atomic %.

The energy gap of each of the oxide semiconductor films 308a and 308b and the metal oxide film 308c is 2 eV or more, preferably 2.5 eV or more, or more preferably 3 eV or more. With the use of an oxide semiconductor having such a wide energy gap, the off-state current of the transistor can be reduced.

The thickness of each of the oxide semiconductor films 308a and 308b and the metal oxide film 308c is set to greater than or equal to 3 nm and less than or equal to 200 nm, preferably greater than or equal to 3 nm and less than or equal to 100 nm, more preferably greater than or equal to 3 nm and less than or equal to 50 nm.

For the oxide semiconductor films 308a and 308b and the metal oxide film 308c, an In—Ga—Zn oxide with an atomic ratio of In:Ga:Zn=1:1:1, In:Ga:Zn=1:1:1.2, or In:Ga:Zn=3:1:2 can be used. Note that the proportion of each metal element in the atomic ratio of each of the oxide semiconductor films 308a and 308b and the metal oxide film 308c may vary within a range of ±20% of that in the above atomic ratio as an error.

The oxide semiconductor films 308a and 308b and the metal oxide film 308c may have a non-single-crystal structure, for example. Non-single-crystal structures include a c-axis aligned crystalline oxide semiconductor (CAAC-OS) described later, a polycrystalline structure, a microcrystalline structure described later, and an amorphous structure. Among the non-single-crystal structures, the amorphous structure has the highest density of defect states, whereas CAAC-OS has the lowest density of defect states. Note that the oxide semiconductor films 308a and 308b and the metal oxide film 308c have the same crystallinity.

Note that the oxide semiconductor films 308a and 308b and the metal oxide film 308c may each be a mixed film including two or more of the following: a region having an amorphous structure, a region having a microcrystalline structure, a region having a polycrystalline structure, a CAAC-OS region, and a region having a single crystal structure. The mixed film has a single-layer structure including, for example, two or more of a region having an amorphous structure, a region having a microcrystalline structure, a region having a polycrystalline structure, a CAAC-OS region, and a region having a single crystal structure in some cases. Furthermore, the mixed film has a stacked-layer structure including, for example, layers of two or more of a region having an amorphous structure, a region having a microcrystalline structure, a region having a polycrystalline structure, a CAAC-OS region, and a region having a single crystal structure in some cases.

When silicon or carbon which is an element belonging to Group 14 is contained in the oxide semiconductor films 308a and 308b, oxygen vacancies are increased, and the oxide semiconductor films 308a and 308b become n-type. Thus, the concentration of silicon or carbon of the oxide semiconductor films 308a and 308b is lower than or equal to $2 \times 10^{18}$ atoms/cm$^3$, preferably lower than or equal to $2 \times 10^{17}$ atoms/cm$^3$.

Further, the concentration of alkali metal or alkaline earth metal of the oxide semiconductor films 308a and 308b, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor films 308a and 308b.

Further, when containing nitrogen, the oxide semiconductor films 308a and 308b easily have n-type conductivity by generation of electrons serving as carriers and an increase of carrier density. Thus, a transistor including an oxide semiconductor which contains nitrogen is likely to be normally on. For this reason, nitrogen in the oxide semiconductor films is preferably reduced as much as possible; the concentration of nitrogen which is measured by SIMS is preferably set to, for example, lower than or equal to $5 \times 10^{18}$ atoms/cm$^3$.

Oxide semiconductor films with low carrier density are used as the oxide semiconductor films 308a and 308b. The oxide semiconductor films 308a and 308b preferably have a carrier density of $1 \times 10^{17}$/cm$^3$ or less, preferably $1 \times 10^{15}$/cm$^3$ or less further preferably $1 \times 10^{13}$/cm$^3$ or less, particularly preferably $8 \times 10^{11}$/cm$^3$ or less, still further preferably $1 \times 10^{11}$/cm$^3$ or less, yet further preferably $1 \times 10^{10}$/cm$^3$ or less, and is $1 \times 10^{-9}$/cm$^3$ or higher.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of each of the oxide semiconductor films 308a and 308b be set to be appropriate.

The oxide semiconductor films 308a and 308b are in contact with the films each formed using a material which can improve characteristics of the interface with the oxide semiconductor film, such as the insulating film 306 and the insulating film 312. Thus, the oxide semiconductor films 308a and 308b function as semiconductors, so that the transistors including the oxide semiconductor films 308a and 308b have excellent electrical characteristics.

Note that it is preferable to use, as each of the oxide semiconductor films 308a and 308b, an oxide semiconductor film in which the impurity concentration is low and the density of defect states is low, in which case the transistor can have more excellent electrical characteristics. The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density in some cases. Thus, a transistor whose channel region is formed in the oxide semiconductor film rarely has a negative threshold voltage (is rarely normally on). Further, a highly purified intrinsic or substantially highly purified intrinsic oxide semiconductor film has a low density of defect states and thus has a low density of trap states in some cases. Further, a highly purified intrinsic or substantially highly purified intrinsic oxide semiconductor film provides an extremely low off-state current; even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Electric charges trapped by the trap states in the oxide semiconductor film take a long time to be lost, and might behave like fixed electric charges. Thus, a transistor whose channel region is formed in an oxide semiconductor film having a high density of trap states has unstable electrical characteristics in some cases. Examples of the impurities include hydrogen, nitrogen, alkali metal, alkaline earth metal, and the like.

The metal oxide film 308c is formed by processing an oxide semiconductor film that is formed at the same time as the oxide semiconductor films 308a and 308b. Thus, the metal oxide film 308c contains a metal element similar to that in the oxide semiconductor films 308a and 308b. Furthermore, the metal oxide film 308c has a crystal structure similar to or different from that of the oxide semiconductor films 308a and 308b. By adding impurities or oxygen vacancies to the oxide semiconductor film formed at the same time as the oxide semiconductor films 308a and 308b, the oxide semiconductor film has conductivity and thus functions as an electrode of a capacitor. An example of the impurities contained in the oxide semiconductor film is hydrogen. Instead of hydrogen, as the impurity, boron, phosphorus, tin, antimony, a rare gas element, an alkali metal, an alkaline earth metal, or the like may be included. Alternatively, the metal oxide film 308c is formed at the same time as the oxide semiconductor films 308a and 308b, and has increased conductivity by containing oxygen vacancies generated by plasma damage or the like. Alternatively, the metal oxide film 308c is formed at the same time as the oxide semiconductor films 308a and 308b, and has increased conductivity by containing impurities and oxygen vacancies generated by plasma damage or the like.

Therefore, both the oxide semiconductor films 308a and 308b and the metal oxide film 308c are formed over the insulating film 306 but differ in impurity concentration. Specifically, the metal oxide film 308c has a higher impurity concentration than the oxide semiconductor films 308a and 308b. For example, the concentration of hydrogen contained in the oxide semiconductor films 308a and 308b is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, yet more preferably lower than or equal to $1 \times 10^{16}$ atoms/cm$^3$. The concentration of hydrogen contained in the metal oxide film 308c is higher than or equal to $8 \times 10^{19}$ atoms/cm$^3$, preferably higher than or equal to $1 \times 10^{20}$ atoms/cm$^3$, more preferably higher than or equal to $5 \times 10^{20}$ atoms/cm$^3$. The concentration of hydrogen contained in the metal oxide film 308c is greater than or equal to 2 times, preferably greater than or equal to 10 times that in the oxide semiconductor films 308a and 308b.

When the oxide semiconductor film formed at the same time as the oxide semiconductor films 308a and 308b is exposed to plasma, the oxide semiconductor film is damaged, and oxygen vacancies can be generated. For example, when a film is formed over the oxide semiconductor film by a plasma CVD method or a sputtering method, the oxide semiconductor film is exposed to plasma and oxygen vacancies are generated. Alternatively, when the oxide semiconductor film is exposed to plasma in etching treatment for formation of the insulating film 312, oxygen vacancies are generated. Alternatively, when the oxide semiconductor film is exposed to plasma of hydrogen, a rare gas, ammonia, a mixed gas of oxygen and hydrogen, or the like, oxygen vacancies are generated. As a result, the conductivity of the oxide semiconductor film is increased, so that the oxide semiconductor film has conductivity and functions as the metal oxide film 308c.

In other words, the metal oxide film 308c is formed using an oxide semiconductor film with high conductivity or a metal oxide film with high conductivity.

In the case where a silicon nitride film is used as the insulating film 314, the silicon nitride film contains hydrogen. When hydrogen in the insulating film 314 is diffused into the oxide semiconductor film formed at the same time as the oxide semiconductor films 308a and 308b, hydrogen is bonded to oxygen and electrons serving as carriers are generated in the oxide semiconductor film. When the silicon nitride film is formed by a plasma CVD method or a sputtering method, the oxide semiconductor film is exposed to plasma and oxygen vacancies are generated in the oxide semiconductor film. When hydrogen contained in the silicon nitride film enters the oxygen vacancies, electrons serving as carriers are generated. As a result, the conductivity of the oxide semiconductor film is increased, so that the oxide semiconductor film becomes the metal oxide film 308c.

The metal oxide film 308c has lower resistivity than the oxide semiconductor films 308a and 308b. The resistivity of the metal oxide film 308c is preferably greater than or equal to $1 \times 10^{-8}$ and less than $1 \times 10^{-1}$ times the resistivity of the oxide semiconductor films 308a and 308b. The resistivity of the metal oxide film 308c is typically greater than or equal to $1 \times 10^{-3}$ Ωcm and less than $1 \times 10^{4}$ Ωcm, preferably greater than or equal to $1 \times 10^{-3}$ Ωcm and less than $1 \times 10^{-1}$ Ωcm.

Note that one embodiment of the present invention is not limited thereto, and it is possible that the metal oxide film 308c not be in contact with the insulating film 314 depending on circumstances.

Further, one embodiment of the present invention is not limited thereto, and the metal oxide film 308c may be formed by a different process from that of the oxide semiconductor film 308a or 308b depending on circumstances. In that case, the metal oxide film 308c may include a different material from that of the oxide semiconductor film 308a or 308b. For example, the metal oxide film 308c may be formed using indium tin oxide (hereinafter referred to as ITO), indium zinc oxide, or the like.

In the liquid crystal display device described in this embodiment, the capacitor has a light-transmitting property. As a result, the area occupied by the capacitor can be increased and the aperture ratio in a pixel can be increased.

The conductive films 310a, 310b, 310c, 310d, and 310e can have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. A transparent conductive material containing indium oxide, tin oxide, or zinc oxide may be used.

The insulating films 312 and 314 are formed as the inorganic insulating film 53 over the insulating film 306, the oxide semiconductor films 308a and 308b, the metal oxide film 308c, and the conductive films 310a, 310b, 310c, 310d, and 310e. For the insulating film 312, in a manner similar to that of the insulating film 306, a material which can improve characteristics of the interface with the oxide semiconductor film is preferably used. The insulating film 312 can be formed using an oxide insulating film. Here, the insulating film 312 is formed by stacking insulating films 312a and 312b.

The insulating film 312a is an oxide insulating film which is permeable to oxygen. Note that the insulating film 312a serves also as a film which relieves damage to the oxide semiconductor films 308a and 308b and the metal oxide film 308c at the time of forming the insulating film 312b later.

Silicon oxide, silicon oxynitride, or the like with a thickness greater than or equal to 5 nm and less than or equal to 150 nm, preferably greater than or equal to 5 nm and less than or equal to 50 nm can be used as the insulating film 312a. Note that in this specification, a "silicon oxynitride film" refers to a film that contains oxygen at a higher proportion than nitrogen, and a "silicon nitride oxide film" refers to a film that contains nitrogen at a higher proportion than oxygen.

The insulating film 312a is preferably an oxide insulating film containing nitrogen and having a small number of defects.

Typical examples of the oxide insulating film containing nitrogen and having a small number of defects include a silicon oxynitride film and an aluminum oxynitride film.

In an ESR spectrum at 100 K or lower of the oxide insulating film having a small number of defects, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The width of the split between the first and second signals and the width of the split between the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

When the insulating film 312a contains a small amount of nitrogen oxide as described above, the carrier trap at the interface between the insulating film 312a and the oxide semiconductor film can be inhibited. As a result, a shift of the threshold voltage of the transistor included in the display device can be reduced, which leads to a reduced change in the electrical characteristics of the transistor.

The insulating film 312a preferably has a nitrogen concentration measured by secondary ion mass spectrometry (SIMS) of lower than or equal to $6\times10^{20}$ atoms/cm$^3$. In that case, nitrogen oxide is unlikely to be generated in the insulating film 312a, so that the carrier trap at the interface between the insulating film 312a and the oxide semiconductor films 308a and 308b can be inhibited. Furthermore, a shift of the threshold voltage of the transistor included in the display device can be reduced, which leads to a reduced change in the electrical characteristics of the transistor.

Note that when the insulating film 312a contains nitrogen oxide and ammonia, nitrogen oxide and ammonia react with each other in heat treatment in a manufacturing process, and nitrogen oxide is released as a nitrogen gas. As a result, the nitrogen concentration and the content of nitrogen oxide in the insulating film 312a can be reduced. Furthermore, carrier traps at the interface between the insulating film 312a and the oxide semiconductor films 308a and 308b can be reduced. Furthermore, a shift of the threshold voltage of the transistor included in the display device can be reduced, which leads to a reduced change in the electrical characteristics of the transistor.

Note that in the insulating film 312a, all oxygen having entered the insulating film 312a from the outside does not move to the outside of the insulating film 312a and some oxygen remains in the insulating film 312a. Further, movement of oxygen occurs in the insulating film 312a in some cases in such a manner that oxygen enters the insulating film 312a and oxygen contained in the insulating film 312a is moved to the outside of the insulating film 312a.

When the oxide insulating film which is permeable to oxygen is formed as the insulating film 312a, oxygen released from the insulating film 312b provided over the insulating film 312a can be moved to the oxide semiconductor films 308a and 308b through the insulating film 312a.

The insulating film 312b is formed in contact with the insulating film 312a. The insulating film 312b is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film containing oxygen at a higher proportion than the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

Silicon oxide, silicon oxynitride, or the like with a thickness greater than or equal to 30 nm and less than or equal to 500 nm, preferably greater than or equal to 50 nm and less than or equal to 400 nm can be used as the insulating film 312b.

Further, it is preferable that the amount of defects in the insulating film 312b be small, and typically the spin density corresponding to a signal which appears at g=2.001 due to a dangling bond of silicon, be lower than $1.5 \times 10^{18}$ spins/cm$^3$, more preferably lower than or equal to $1 \times 10^{18}$ spins/cm$^3$ by ESR measurement. Note that the insulating film 312b is provided more apart from the oxide semiconductor films 308a and 308b than the insulating film 312a is; thus, the insulating film 312b may have higher defect density than the insulating film 312a.

It is possible to prevent outward diffusion of oxygen from the oxide semiconductor films 308a and 308b and the metal oxide film 308c by providing a nitride insulating film having a blocking effect against oxygen, hydrogen, water, alkali metal, alkaline earth metal, and the like as the insulating film 314. The nitride insulating film is formed using silicon nitride, silicon nitride oxide, aluminum nitride, aluminum nitride oxide, or the like.

Note that over the nitride insulating film having a blocking effect against oxygen, hydrogen, water, alkali metal, alkaline earth metal, and the like, an oxide insulating film having a blocking effect against oxygen, hydrogen, water, and the like may be provided. The oxide insulating film having a blocking effect against oxygen, hydrogen, water, and the like is formed using aluminum oxide, aluminum oxynitride, gallium oxide, gallium oxynitride, yttrium oxide, yttrium oxynitride, hafnium oxide, hafnium oxynitride, or the like. In order to control the capacitance of the capacitor, a nitride insulating film or an oxide insulating film may be further provided over the nitride insulating film having a blocking effect against oxygen, hydrogen, water, alkali metal, alkaline earth metal, and the like, as appropriate.

The conductive film 316b is formed over the insulating film 314. The conductive film 316b formed over the insulating film 314 can function as an electrode of a capacitor.

The conductive film 316b can be formed using a light-transmitting conductive material. As the light-transmitting conductive material, indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added, can be used.

For the organic insulating film 317, an organic resin such as an acrylic resin, polyimide, or an epoxy resin can be used. Note that the thickness of the organic insulating film 317 is greater than or equal to 500 nm and less than or equal to 5000 nm, preferably greater than or equal to 1000 nm and less than or equal to 3000 nm. In the case where the organic insulating film 317 has the above thickness, a depressed portion over the conductive film 316b can be filled with the organic insulating film 317; accordingly, the unevenness of the region on which the alignment film 320 is formed can be reduced.

By forming the organic insulating film 317 using an organic resin, at least the depressed portion over the conductive film 316b can be filled with the organic insulating film 317, so that the uneven alignment of a liquid crystal material included in the liquid crystal layer 321 can be reduced.

The conductive films 319 and 319a are formed over the organic insulating film 317. The conductive film 319 serves as a pixel electrode. The conductive film 319a is electrically connected to the conductive film 304b through an opening 364a (see FIG. 9A) and electrically connected to the conductive film 310c through an opening 364b (see FIG. 9A).

That is, the conductive film 319a functions as a connection electrode which connects the conductive film 304b and the conductive film 310c.

The organic insulating film 317 is not limited thereto. For example, the organic insulating film 317 can have a function of a color filter or a black matrix. For example, in the case of having a function of a color filter, the organic insulating film 317 colored in accordance with red pixels, blue pixels, and green pixels, for example, may be formed.

The conductive films 319 and 319a can be formed using a light-transmitting conductive material in a manner similar to that of the conductive film 316b.

In order to form a connection structure in which the conductive film 304b is in direct contact with the conductive film 310c, it is necessary to form a mask for patterning to form an opening in the insulating films 305 and 306 before the conductive film 310c is formed. However, when the conductive film 304b is connected to the conductive film 310c with the conductive film 319a as shown in FIG. 4, it is not necessary to form a connection portion where the conductive film 304b is in direct contact with the conductive film 310c. Thus, the number of photomasks can be reduced by one. That is, steps for manufacturing a liquid crystal display device can be reduced.

The alignment film 320 preferably has a light-transmitting property and can be formed using, typically, an organic resin such as an acrylic resin, polyimide, or an epoxy resin.

A film having a coloring property (hereinafter referred to as a coloring film 346) is formed on the substrate 342. The coloring film 346 functions as a color filter. Further, a light-blocking film 344 adjacent to the coloring film 346 is formed on the substrate 342. The light-blocking film 344 functions as a black matrix. The coloring film 346 is not necessarily provided in the case where the liquid crystal display device is a monochrome display device, for example.

The coloring film 346 is a coloring film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Alternatively, as the coloring film 346, a light-transmitting layer which transmits light from a light source without change can be used. For example, the light-transmitting layer can be formed using an organic resin such as an acrylic resin, polyimide, or an epoxy resin.

The light-blocking film 344 preferably has a function of blocking light in a particular wavelength region, and can be a metal film or an organic insulating film including a black pigment or the like.

An insulating film 348 is formed on the coloring film 346. The insulating film 348 functions as a planarization layer or suppresses diffusion of impurities in the coloring film 346 to the liquid crystal element side.

The conductive film 350 is formed on the insulating film 348. The conductive film 350 functions as the other of the pair of electrodes of the liquid crystal element in the pixel portion. Note that the alignment film 320 is formed on the conductive films 319 and 319a, and the alignment film 352 is formed on the conductive film 350.

The liquid crystal layer 321 is formed between the conductive films 319 and 319a and the conductive film 350. The liquid crystal layer 321 is sealed between the substrate 302 and the substrate 342 with the use of a sealant (not illustrated). The sealant is preferably in contact with an inorganic material to prevent entry of moisture and the like from the outside.

A spacer may be provided between the conductive films 319 and 319a and the conductive film 350 to maintain the thickness of the liquid crystal layer 321 (also referred to as a cell gap).

A method for manufacturing an element portion over the substrate 302 in the liquid crystal display device illustrated in FIG. 4 is described with reference to FIGS. 5A to 5C, FIGS. 6A to 6C, FIGS. 7A and 7B, and FIGS. 8A to 8C. Here, the element portion provided over the substrate 302 refers to a region sandwiched between the substrate 302 and the alignment film 320.

The films included in the transistor (i.e., the insulating film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed.

The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, the ALD method makes it possible to accurately adjust a thickness and thus is suitable for manufacturing a minute transistor.

First, the substrate 302 is prepared. Here, a glass substrate is used as the substrate 302.

Next, a conductive film is formed over the substrate 302 and processed into desired shapes, so that the conductive films 304a, 304b, and 304c are formed. The conductive films 304a, 304b, and 304c can be formed in such a manner that a mask is formed in desired regions by first patterning and regions not covered with the mask are etched.

The conductive films 304a, 304b, and 304c can be typically formed by a sputtering method, a vacuum evaporation method, a pulsed laser deposition (PLD) method, a thermal CVD method, or the like.

Alternatively, a tungsten film can be formed for the conductive films 304a, 304b, and 304c with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Figure 5A:
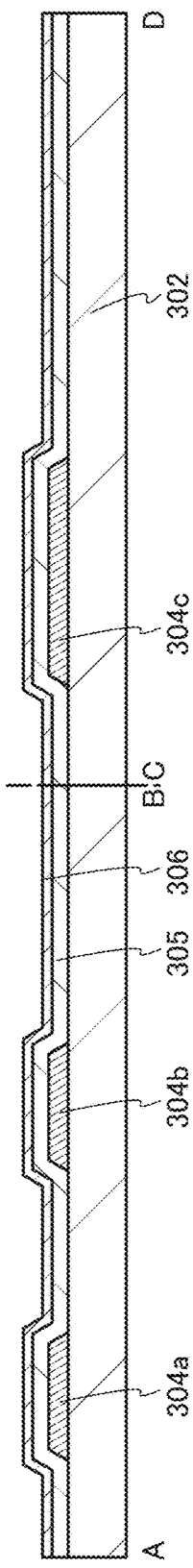
FIGS. 5A to 5C are cross-sectional views illustrating one embodiment of a method for manufacturing a display device.

Next, the insulating film 305 is formed over the substrate 302 and the conductive films 304a, 304b, and 304c, and then the insulating film 306 is formed over the insulating film 305 (see FIG. 5A).

The insulating films 305 and 306 can be formed by a sputtering method, a CVD method, a vacuum evaporation method, a pulsed laser deposition (PLD) method, a thermal CVD method, or the like. Note that it is preferable that the insulating films 305 and 306 be formed in succession in a vacuum, in which case entry of impurities is suppressed.

In the case where a silicon oxide film or a silicon oxynitride film is formed as the insulating film 305 or 306, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

Moreover, in the case of forming a gallium oxide film as the insulating film 305 or 306, a metal organic chemical vapor deposition (MOCVD) method can be employed.

In the case where a hafnium oxide film is formed as the insulating film 305 or 306 by a thermal CVD method such as an MOCVD method or an ALD method, two kinds of gases, i.e., ozone ($O_3$) as an oxidizer and a source material gas which is obtained by vaporizing a liquid containing a solvent and a hafnium precursor compound (a hafnium alkoxide solution, which is typified by tetrakis(dimethylamide)hafnium (TDMAH)), are used. Note that the chemical formula of tetrakis(dimethylamide)hafnium is $Hf[N(CH_3)_2]_4$. Examples of another material liquid include tetrakis(ethylmethylamide)hafnium.

In the case where an aluminum oxide film is formed as the insulating film 305 or 306 by a thermal CVD method such as an MOCVD method or an ALD method, two kinds of gases, i.e., $H_2O$ as an oxidizer and a source material gas which is obtained by vaporizing a liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

Furthermore, in the case where a silicon oxide film is formed as the insulating film 305 or 306 by a thermal CVD method such as an MOCVD method or an ALD method, hexachlorodisilane is adsorbed on a deposition surface, chlorine contained in the adsorbate is removed, and radicals of an oxidizing gas (e.g., O$_2$ or dinitrogen monoxide) are supplied to react with the adsorbate.

Figure 5B:
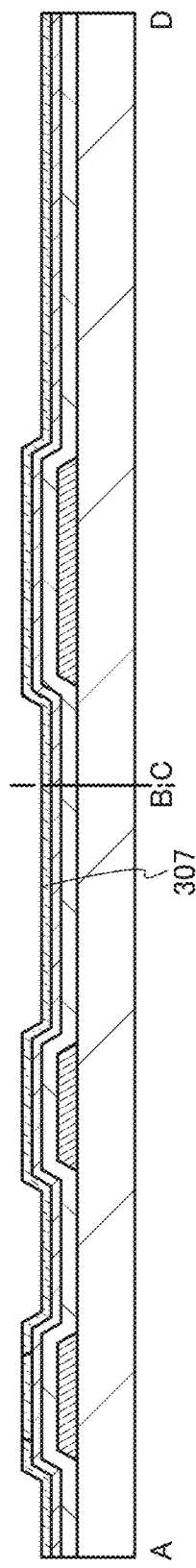
Figure 5C:
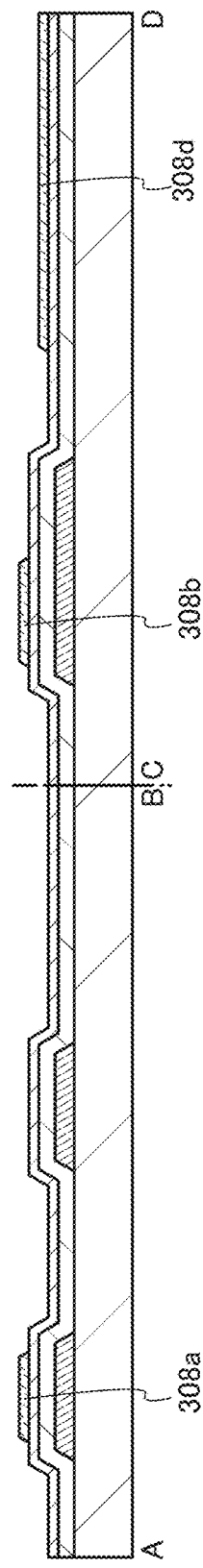

Next, an oxide semiconductor film 307 is formed over the insulating film 306 (see FIG. 5B).

The oxide semiconductor film 307 can be formed by a sputtering method, a coating method, a pulsed laser deposition method, a laser ablation method, a thermal CVD method, or the like.

As a sputtering gas, a rare gas (typically argon), an oxygen, or a mixed gas of a rare gas and oxygen is used as appropriate. In the case of using the mixed gas of a rare gas and oxygen, the proportion of oxygen to the rare gas is preferably increased.

Further, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., further preferably higher than or equal to 200° C. and lower than or equal to 350° C., the oxide semiconductor film can be a CAAC-OS film.

For the deposition of the CAAC-OS film, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

For example, in the case where an oxide semiconductor film, e.g., an In—Ga—Zn—O film is formed using a deposition apparatus employing ALD, an In(CH$_3$)$_3$ gas and an O$_3$ gas are sequentially introduced a plurality of times to form an In—O layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ may be used. Instead of a Ga(CH$_3$)$_3$ gas, a Ga(C$_2$H$_5$)$_3$ gas may be used. Furthermore, a Zn(CH$_3$)$_2$ gas may be used.

Next, the oxide semiconductor film 307 is processed into desired shapes, so that the island-shaped oxide semiconductor films 308a, 308b, and 308d are formed. The oxide semiconductor films 308a, 308b, and 308d can be formed in such a manner that a mask is formed in desired regions by second patterning and regions not covered with the mask are etched. For the etching, dry etching, wet etching, or a combination of dry etching and wet etching can be employed (see FIG. 5C).

After that, hydrogen, water, and the like may be released from the oxide semiconductor films 308a, 308b, and 308d by heat treatment to decrease hydrogen concentration and water concentration in the oxide semiconductor films 308a, 308b, and 308d. As a result, highly purified oxide semiconductor films 308a, 308b, and 308d can be formed. The heat treatment is performed typically at a temperature of higher than or equal to 250° C. and lower than or equal to 650° C., preferably higher than or equal to 300° C. and lower than or equal to 500° C. When the heat treatment is performed typically at a temperature higher than or equal to 300° C. and lower than or equal to 400° C., preferably higher than or equal to 320° C. and lower than or equal to 370° C., warp or shrinking of a large-sized substrate can be reduced to improve yield.

An electric furnace, an RTA apparatus, or the like can be used for the heat treatment. With the use of an RTA apparatus, the heat treatment can be performed at a temperature of higher than or equal to the strain point of the substrate if the heating time is short. This leads to shortening of the heat treatment time and reduces warp of the substrate during the heat treatment, which is particularly advantageous to a large-sized substrate.

The heat treatment may be performed under an atmosphere of nitrogen, oxygen, ultra-dry air (air with a water content of 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like. Further, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancies in the oxide semiconductor film can be reduced.

In the case where the deposition temperature of an insulating film 311a formed later is higher than or equal to 280° C. and lower than or equal to 400° C., hydrogen, water, and the like can be released from the oxide semiconductor films 308a, 308b, and 308d; thus, the heat treatment is not necessary.

Next, a conductive film 309 is formed over the insulating film 306 and the oxide semiconductor films 308a, 308b, and 308d (see FIG. 6A).

The conductive film 309 can be formed by a sputtering method, a vacuum evaporation method, a pulsed laser deposition (PLD) method, a thermal CVD method, or the like.

Next, the conductive film 309 is processed into desired shapes, so that the conductive films 310a, 310b, 310c, 310d, and 310e are formed. The conductive films 310a, 310b, 310c, 310d, and 310e can be formed in such a manner that a mask is formed in desired regions by third patterning and regions not covered with the mask are etched (see FIG. 6B).

Then, an insulating film 311 is formed by stacking the insulating films 311a and 311b so as to cover the insulating film 306, the oxide semiconductor films 308a, 308b, and 308d, and the conductive films 310a, 310b, 310c, 310d, and 310e (see FIG. 6C). The insulating film 311 can be formed by a sputtering method, a CVD method, an evaporation method, or the like.

Note that after the insulating film 311a is formed, the insulating film 311b is preferably formed in succession without exposure to the air. After the insulating film 311a is formed, the insulating film 311b is formed in succession by adjusting at least one of the flow rate of a source gas, pressure, a high-frequency power, and a substrate temperature without exposure to the air, whereby the concentration of impurities attributed to the atmospheric component at the interface between the insulating film 311a and the insulating film 311b can be reduced and oxygen in the insulating film 311b can be moved to the oxide semiconductor films 308a, 308b, and 308d; accordingly, the amount of oxygen vacancies in the oxide semiconductor films 308a, 308b, and 308d can be reduced.

As the insulating film 311a, an oxide insulating film containing nitrogen and having a small number of defects can be formed by a CVD method under the conditions where the ratio of an oxidizing gas to a deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

A deposition gas containing silicon and an oxidizing gas are preferably used as the source gas of the insulating film 311a. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film which is permeable to oxygen can be formed as the insulating film 311a. Further, by providing the insulating film 311a, damage to the oxide semiconductor films 308a, 308b, and 308d can be reduced in a step of forming the insulating film 311b later.

As the insulating film 311b, a silicon oxide film or a silicon oxynitride film is formed under the following conditions: the substrate placed in a treatment chamber of a plasma CVD apparatus that is vacuum-evacuated is held at a temperature higher than or equal to 180° C. and lower than or equal to 280° C., preferably higher than or equal to 200° C. and lower than or equal to 240° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the insulating film 311b. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions for the insulating film 311b, the high-frequency power having the above power density is supplied to the treatment chamber having the above pressure, whereby the decomposition efficiency of the source gas in plasma is increased, oxygen radicals are increased, and oxidation of the source gas is promoted; therefore, the oxygen content in the insulating film 311b becomes higher than that in the stoichiometric composition. However, in the case where the substrate temperature is the deposition temperature for the insulating film 311b, the bond between silicon and oxygen is weak, and accordingly, part of oxygen is released by heating. Thus, it is possible to form an oxide insulating film which contains oxygen at a higher proportion than the stoichiometric composition and from which part of oxygen is released by heating. Further, the insulating film 311a is provided over the oxide semiconductor films 308a, 308b, and 308d. Accordingly, in the step of forming the insulating film 311b, the insulating film 311a serves as a protective film for the oxide semiconductor films 308a, 308b, and 308d. Consequently, the insulating film 311b can be formed using the high-frequency power having a high power density while damage to the oxide semiconductor films 308a, 308b, and 308d is reduced.

Note that in the film formation conditions for the insulating film 311b, the flow rate of the deposition gas containing silicon relative to the oxidizing gas can be increased, whereby the amount of defects in the insulating film 311b can be reduced. Typically, it is possible to form an oxide insulating film in which the amount of defects is small, i.e., the spin density corresponding to a signal which appears at g=2.001 due to a dangling bond of silicon is lower than $6 \times 10^{17}$ spins/cm$^3$, preferably lower than or equal to $3 \times 10^{17}$ spins/cm$^3$, more preferably lower than or equal to $1.5 \times 10^{17}$ spins/cm$^3$ by ESR measurement. As a result, the reliability of the transistor can be improved.

Next, heat treatment is performed. The heat treatment is performed typically at a temperature of higher than or equal to 150° C. and lower than the strain point of the substrate, preferably higher than or equal to 200° C. and lower than or equal to 450° C., or further preferably higher than or equal to 300° C. and lower than or equal to 450° C. When the heat treatment is performed typically at a temperature higher than or equal to 300° C. and lower than or equal to 400° C., preferably higher than or equal to 320° C. and lower than or equal to 370° C., warp or shrinking of a large-sized substrate can be reduced to improve yield.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air with a water content of 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the insulating film 311b can be moved to the oxide semiconductor films 308a, 308b, and 308d, so that oxygen vacancies contained in the oxide semiconductor films 308a, 308b, and 308d can be reduced. Consequently, the amount of oxygen vacancies in the oxide semiconductor films 308a, 308b, and 308d can be further reduced.

Further, in the case where water, hydrogen, or the like is contained in the insulating film 311a and the insulating film 311b, when an insulating film 313 having a function of blocking water, hydrogen, and the like is formed later and heat treatment is performed, water, hydrogen, or the like contained in the insulating film 311a and the insulating film 311b are moved to the oxide semiconductor films 308a, 308b, and 308d, so that defects are generated in the oxide semiconductor films 308a, 308b, and 308d. However, by the heating, water, hydrogen, or the like contained in the insulating film 311a and the insulating film 311b can be released; thus, variation in electrical characteristics of the transistor can be reduced, and change in threshold voltage can be inhibited.

Note that when the insulating film 311b is formed over the insulating film 311a while being heated, oxygen can be moved to the oxide semiconductor films 308a, 308b, and 308d and oxygen vacancies in the oxide semiconductor films 308a, 308b, and 308d can be reduced; thus, the heat treatment is not necessarily performed.

Further, when the conductive films 310a, 310b, 310d, and 310e are formed, the oxide semiconductor films 308a, 308b, and 308d are damaged by the etching of the conductive film, so that oxygen vacancies are generated on the back channel side of the oxide semiconductor films 308a and 308b (the side of the oxide semiconductor films 308a and 308b which is opposite the side facing the conductive films 304a and 304c serving as gate electrodes). However, with the use of the oxide insulating film containing oxygen at a higher proportion than the stoichiometric composition as the insulating film 311b, the oxygen vacancies generated on the back channel side can be repaired by heat treatment. By this, defects contained in the oxide semiconductor films 308a and 308b can be reduced, and thus, the reliability of the transistor can be improved.

Note that the heat treatment may be performed after the formation of the opening 362 to be formed later.

Next, the insulating film 311 is processed into desired shapes, so that the insulating film 312 and the opening 362 are formed. The insulating film 312 and the opening 362 can be formed in such a manner that a mask is formed in desired regions by fourth patterning and regions not covered with the mask are etched (see FIG. 7A).

The opening 362 is formed so as to expose the surface of the oxide semiconductor film 308d. An example of a formation method of the opening 362 includes, but not limited to, a dry etching method. It is preferable that the insulating film 311 be etched by a dry etching method. As a result, the oxide semiconductor film 308d is exposed to plasma in the etching treatment; thus, oxygen vacancies in the oxide semiconductor film 308d can be increased. Alternatively, a wet etching method or a combination of dry etching and wet etching can be employed for formation of the opening 362.

Next, the insulating film 313 is formed over the insulating film 312 and the oxide semiconductor film 308d (see FIG. 7B).

The insulating film 313 is preferably formed using a material that can prevent an external impurity such as oxygen, hydrogen, water, alkali metal, or alkaline earth metal, from diffusing into the oxide semiconductor film, more preferably formed using the material containing hydrogen, and typically an inorganic insulating material containing nitrogen, such as a nitride insulating film, can be used. The insulating film 313 can be formed by a CVD method, a sputtering method, or the like.

When the insulating film 313 is formed by a plasma CVD method or a sputtering method, the oxide semiconductor film is exposed to plasma, so that oxygen vacancies are generated in the oxide semiconductor film. The insulating film 313 is a film formed using a material that prevents diffusion of impurities from the outside, such as water, alkali metal, and alkaline earth metal, into the oxide semiconductor film, and the material further contains hydrogen. Thus, when hydrogen in the insulating film 313 is diffused into the oxide semiconductor film 308d, hydrogen is bonded to oxygen and electrons serving as carriers are generated in the oxide semiconductor film 308d. Alternatively, hydrogen enters the oxygen vacancies in the oxide semiconductor film, whereby electrons serving as carriers are produced. As a result, the conductivity of the oxide semiconductor film 308d is increased, so that the semiconductor film 308d becomes the metal oxide film 308c.

The nitride insulating film is preferably formed at a high temperature to have an improved blocking property; for example, the silicon nitride film is preferably formed at a temperature in the range from the substrate temperature of 100° C. to 400° C., more preferably at a temperature in the range from 300° C. to 400° C. When the silicon nitride film is formed at a high temperature, a phenomenon in which oxygen is released from the oxide semiconductor used for the oxide semiconductor films 308a and 308b and the carrier concentration is increased is caused in some cases; therefore, the upper limit of the temperature is a temperature at which the phenomenon is not caused.

Then, a conductive film 315 is formed over the insulating film 313 (see FIG. 8A).

The conductive film 315 can be formed by a sputtering method, for example.

Next, the conductive film 315 is processed into desired shapes, so that the conductive film 316b is formed. The conductive film 316b can be formed in such a manner that a mask is formed in desired regions by fifth patterning and regions not covered with the mask are etched (see FIG. 8B).

Then, the organic insulating film 317 is formed so as to cover the insulating film 313 and the conductive film 316b (see FIG. 8C). The inorganic insulating film 317 serving as a planarization film has an opening so as to expose part of the insulating film 313.

The organic insulating film 317 is formed in such a manner that a photosensitive composition is applied onto the insulating film 313 and the conductive film 316b by a coating method such as spin coating or dip coating, is exposed to light and developed by a photolithography process using a sixth photomask, and is then subjected to heat treatment. Note that in the case where a non-photosensitive composition is applied onto the insulating film 313 and the conductive film 316b, a resist is applied onto the non-photosensitive composition, the resist is processed by a photolithography process using the sixth photomask to form a mask, and then the non-photosensitive composition is etched using the mask, so that the organic insulating film 317 can be formed.

When the organic insulating film 317 is formed by a wet method such as an inkjet method or a printing method, the number of photomasks can be reduced.

Next, the insulating films 305, 306, 312, and 313 are partly etched using the organic insulating film 317 as a mask, so that the opening 364a through which the conductive film 304b is exposed, the opening 364b through which the conductive film 310c is exposed, and the opening 364c through which the conductive film 310e is exposed are formed (see FIG. 9A).

Next, a conductive film 318 is formed (see FIG. 9B).

The conductive film 318 can be formed by a sputtering method, for example.

Next, the conductive film 318 is processed into desired shapes, so that the conductive films 319 and 319a are formed. The conductive films 319 and 319a can be formed in such a manner that a mask is formed in desired regions by seventh patterning and regions not covered with the mask are etched (see FIG. 9C).

Through the above process, the pixel portion and the driver circuit portion that include transistors can be formed over the substrate 302. In the manufacturing process described in this embodiment, the transistors and the capacitor can be formed at the same time by the first to seventh patternings, that is, with the seven masks.

In this embodiment, the conductivity of the oxide semiconductor film 308d is increased by diffusing hydrogen contained in the insulating film 313 into the oxide semiconductor film 308d; however, the conductivity of the oxide semiconductor film 308d may be increased by covering the oxide semiconductor films 308a and 308b with a mask and adding impurities, typically, hydrogen, boron, phosphorus, tin, antimony, a rare gas element, alkali metal, alkaline earth metal, or the like to the oxide semiconductor film 308d.

Hydrogen, boron, phosphorus, tin, antimony, a rare gas element, or the like may be added to the oxide semiconductor film 308d by an ion doping method, an ion implantation method, or the like. Further, alkali metal, alkaline earth metal, or the like may be added to the oxide semiconductor film 308d by a method in which a solution containing the impurity is applied to the oxide semiconductor film 308d.

Next, an element portion formed over the substrate 342 provided so as to face the substrate 302 is described below. Here, the element portion provided over the substrate 342 refers to a region sandwiched between the substrate 342 and the alignment film 352.

First, the substrate 342 is prepared. For materials of the substrate 342, the materials that can be used for the substrate 302 can be referred to. Then, the light-blocking film 344 and the coloring film 346 are formed over the substrate 342 (see FIG. 10A).

The light-blocking film 344 and the coloring film 346 each are formed in a desired position with any of various materials by a printing method, an inkjet method, an etching method using a photolithography technique, or the like.

Then, the insulating film 348 is formed over the light-blocking film 344 and the coloring film 346 (see FIG. 10B).

For the insulating film 348, an organic insulating film of an acrylic resin, an epoxy resin, polyimide, or the like can be used. With the insulating film 348, an impurity or the like contained in the coloring film 346 can be prevented from diffusing into the liquid crystal layer 321 side, for example. Note that the insulating film 348 is not necessarily formed.

Then, the conductive film 350 is formed over the insulating film 348 (see FIG. 10C). As the conductive film 350, a material that can be used for the conductive film 315 can be used.

Through the above process, the structure formed over the substrate 342 can be formed.

Next, the alignment film 320 and the alignment film 352 are formed over the substrate 302 and the substrate 342 respectively, specifically, over the insulating film 317 and the conductive films 319 and 319a formed over the substrate 302 and over the conductive film 350 formed over the substrate 342. The alignment films 320 and 352 can be formed by a rubbing method, an optical alignment method, or the like. After that, the liquid crystal layer 321 is formed between the substrate 302 and the substrate 342. The liquid crystal layer 321 can be formed by a dispenser method (a dropping method), or an injecting method by which a liquid crystal is injected using a capillary phenomenon after the substrate 302 and the substrate 342 are bonded to each other.

Through the above process, the liquid crystal display device illustrated in FIG. 4 can be fabricated.

Note that the structures, methods, and the like described in this embodiment can be used as appropriate in combination with any of the structures, methods, and the like described in other embodiments.

(Embodiment 3)

In this embodiment, liquid crystal display devices that include transistors different from those in Embodiment 1 are described with reference to FIGS. 11 to 15.

Figure 11:
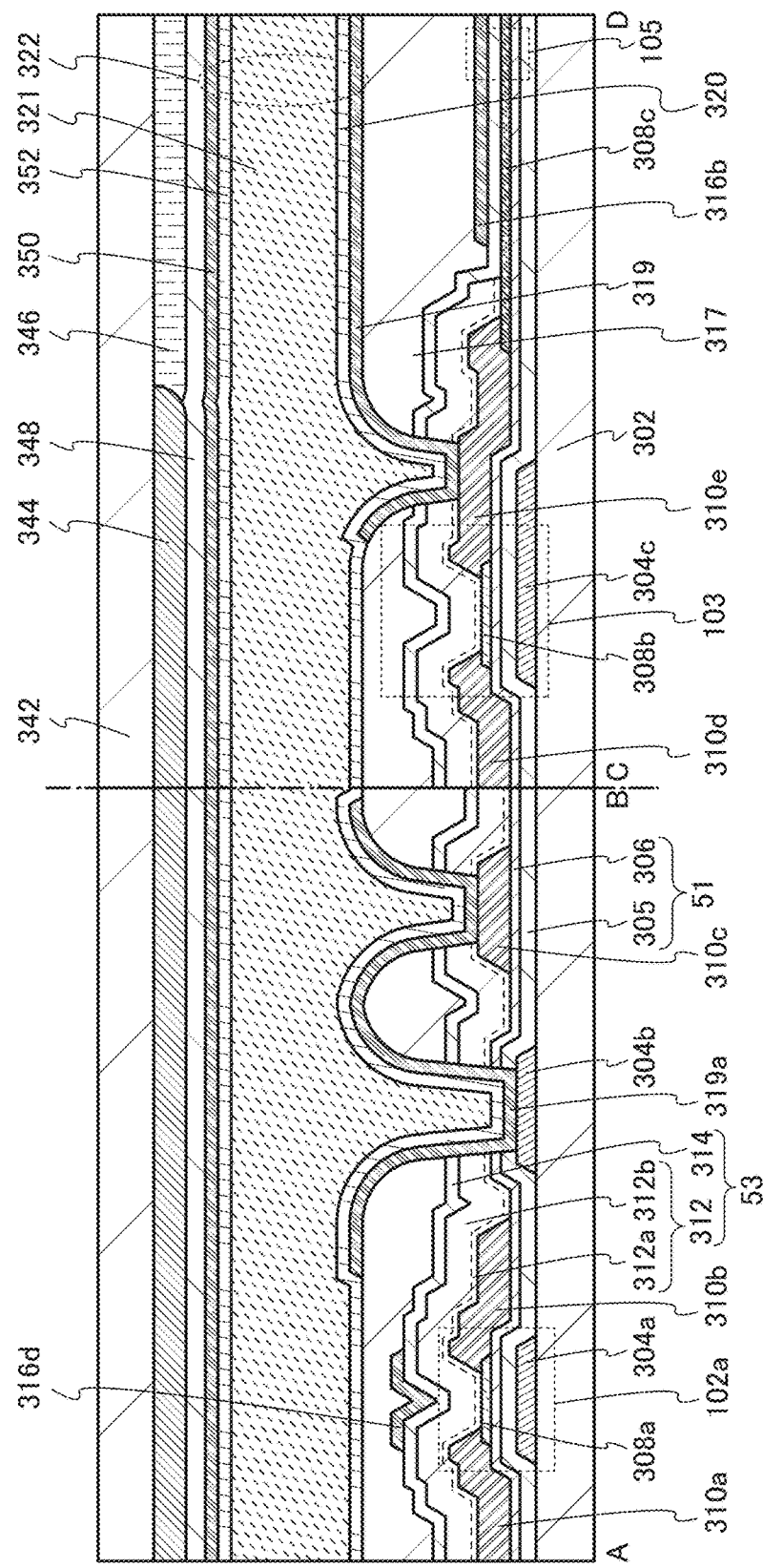
FIG. 11 is a cross-sectional view illustrating one embodiment of a display device.

A liquid crystal display device in FIG. 11 includes a transistor 102a with a dual-gate structure in a driver circuit portion illustrated in the cross section A-B.

The transistor 102a provided in the driver circuit portion includes the conductive film 304a functioning as a gate electrode over the substrate 302, the insulating films 305 and 306 functioning as the gate insulating film 51, the oxide semiconductor film 308a formed over the insulating film 306, and the conductive films 310a and 310b functioning as a source electrode and a drain electrode in contact with the oxide semiconductor film 308a. The inorganic insulating film 53 is formed over the oxide semiconductor film 308a and the conductive films 310a and 310b, and a conductive film 316d functioning as a gate electrode is formed over the inorganic insulating film 53. The conductive film 316d functioning as a gate electrode is connected to the conductive film 304a functioning as a gate electrode through an opening (not illustrated) provided in the gate insulating film 51 and the inorganic insulating film 53. That is, the conductive film 304a and the conductive film 316d have the same potential.

Thus, by applying voltage at the same potential to each gate electrode of the transistor 102a, variation in the initial characteristics can be reduced, and degradation of the transistor 102a in the −GBT stress test and a change in the rising voltage of on-state current at different drain voltages can be suppressed. In addition, a region where carriers flow in the oxide semiconductor film 308a is increased in the film thickness direction, so that the amount of carrier movement is increased. As a result, the on-state current of the transistor 102a is increased, and the field-effect mobility is increased. Typically, the field-effect mobility is greater than or equal to 20 cm$^2$/V·s.

An end portion processed by etching or the like of the oxide semiconductor film, in which defects are generated by damage due to processing, is also contaminated by the attachment of an impurity, or the like. Thus, the end portion of the oxide semiconductor film is easily activated by application of a stress such as an electric field, thereby easily becoming n-type (having a low resistance). Therefore, the end portion of the oxide semiconductor film 308a overlapping with the conductive film 304a functioning as a gate electrode easily becomes n-type. When the end portion which has become n-type is provided between the conductive films 310a and 310b functioning as a source electrode and a drain electrode, the region which has become n-type serves as a carrier path, resulting in a parasitic channel. However, in the channel width direction, when the conductive film 316d functioning as a gate electrode is provided, due to the electric field of the conductive film 316d functioning as a gate electrode, generation of a parasitic channel on the side surface of the oxide semiconductor film 308a or in a region including the side surface and the vicinity of the side surface is suppressed. As a result, a transistor which has excellent electrical characteristics such as a sharp increase in the drain current at the threshold voltage is obtained.

Note that the conductive film 316d functioning as a gate electrode can be formed using a material similar to that of the conductive film 316b in Embodiment 2.

<Modification Example 1>

Figure 12:
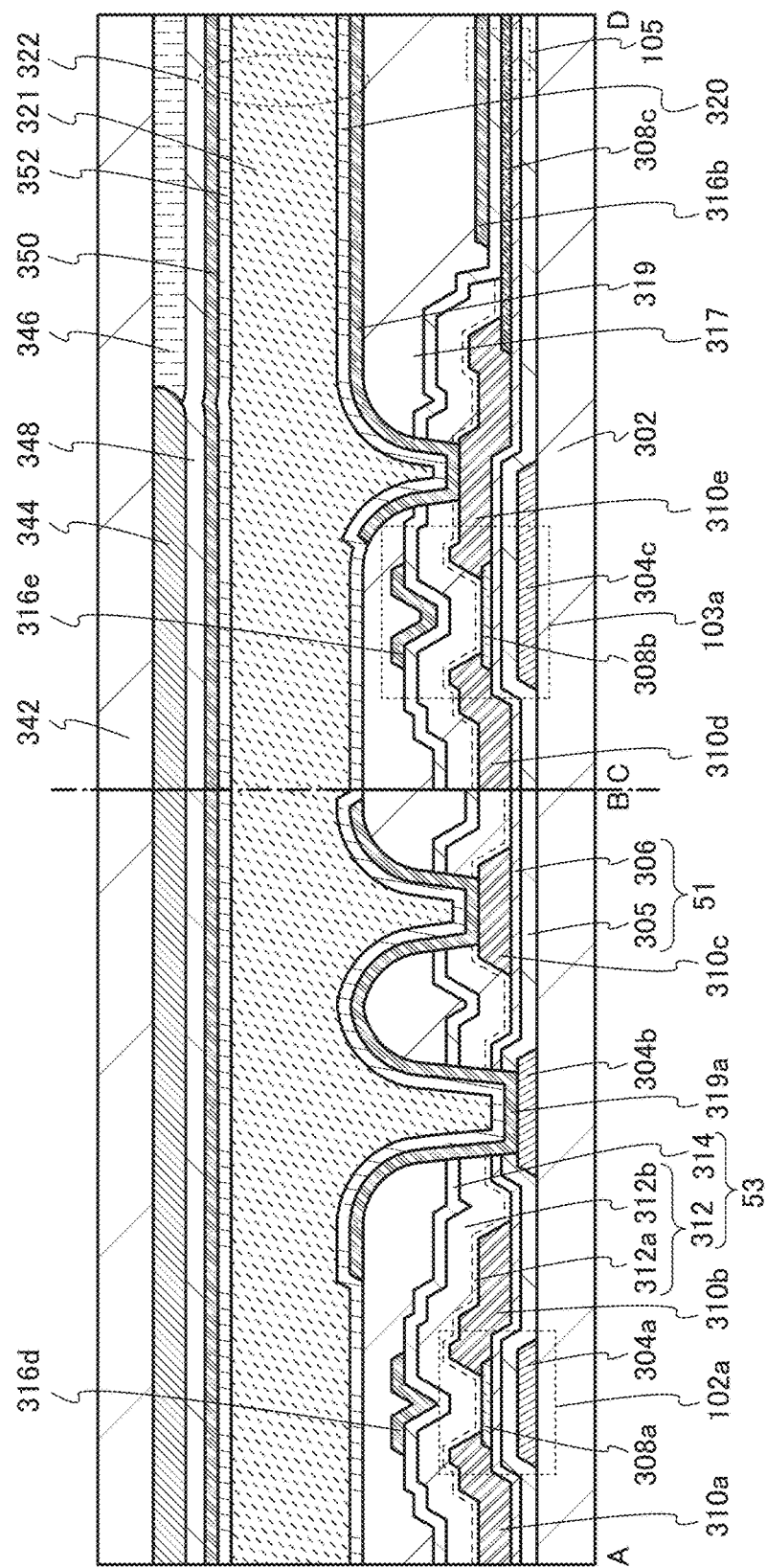
FIG. 12 is a cross-sectional view illustrating one embodiment of a display device.

The liquid crystal display device illustrated in FIG. 11 of Embodiment 3 includes the transistor with a dual-gate structure as a transistor in the driver circuit portion. Furthermore, as illustrated in FIG. 12, a transistor 103a with a dual-gate structure may be included in a pixel portion illustrated in the cross section C-D in addition to the transistor 102a with a dual-gate structure in the driver circuit portion illustrated in the cross section A-B.

The transistor 103a includes the conductive film 304c functioning as a gate electrode over the substrate 302; the insulating films 305 and 306 functioning as the gate insulating film 51; the oxide semiconductor film 308b over the insulating film 306; and the conductive films 310d and 310e functioning as a source electrode and a drain electrode in contact with the oxide semiconductor film 308b. The inorganic insulating film 53 is formed over the oxide semiconductor film 308b and the conductive films 310d and 310e, and a conductive film 316e functioning as a gate electrode is formed over the inorganic insulating film 53. The conductive film 316e functioning as a gate electrode is connected to the conductive film 304c functioning as a gate electrode through an opening (not illustrated) provided in the gate insulating film 51 and the inorganic insulating film 53. That is, the conductive film 304c and the conductive film 316e have the same potential.

By providing a highly reliable transistor with a dual-gate structure having large on-state current and high field-effect mobility not only in the driver circuit portion but also in the pixel portion, the liquid crystal display device can have a high display quality.

<Modification Example 2>

Figure 13:
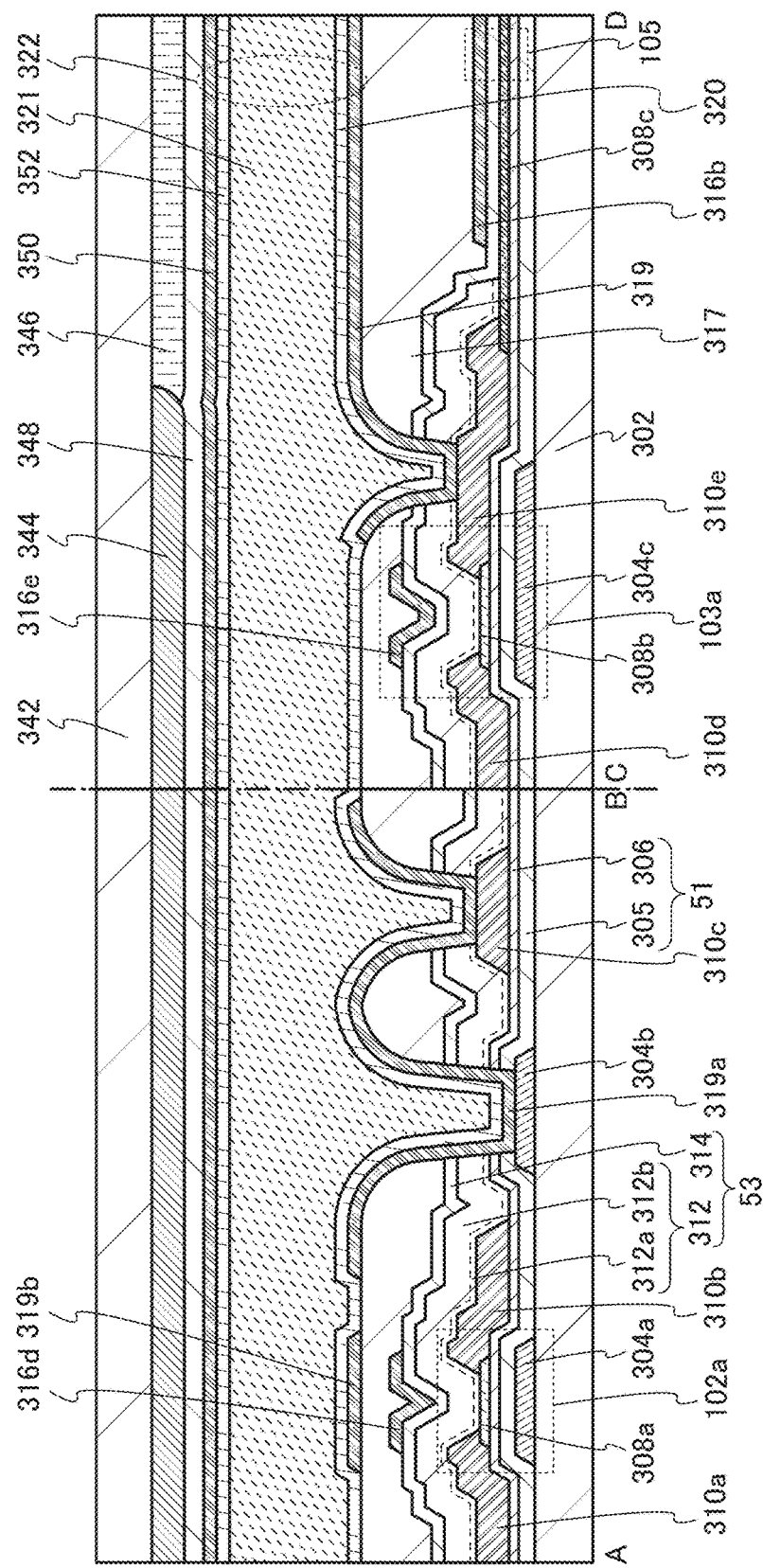
FIG. 13 is a cross-sectional view illustrating one embodiment of a display device.

In the liquid crystal display device described in Embodiment 2 or Embodiment 3, as illustrated in FIG. 13, a conductive film 319b formed at the same time as the conductive film 319 may be provided over the organic insulating film 317 to overlap with the transistor 102a provided in the driver circuit portion. The conductive film 319b can have a given potential, for example, a common potential or a ground potential. By providing the conductive film 319b overlapping with the transistor 102a with a dual-gate structure, the conductive film 319b can block an electric field caused by a voltage applied to the conductive film 316d functioning as a gate electrode of the transistor 102a. Consequently, an alignment defect in the liquid crystal layer 321 due to the electric field can be prevented.

<Modification Example 3>

Figure 14:
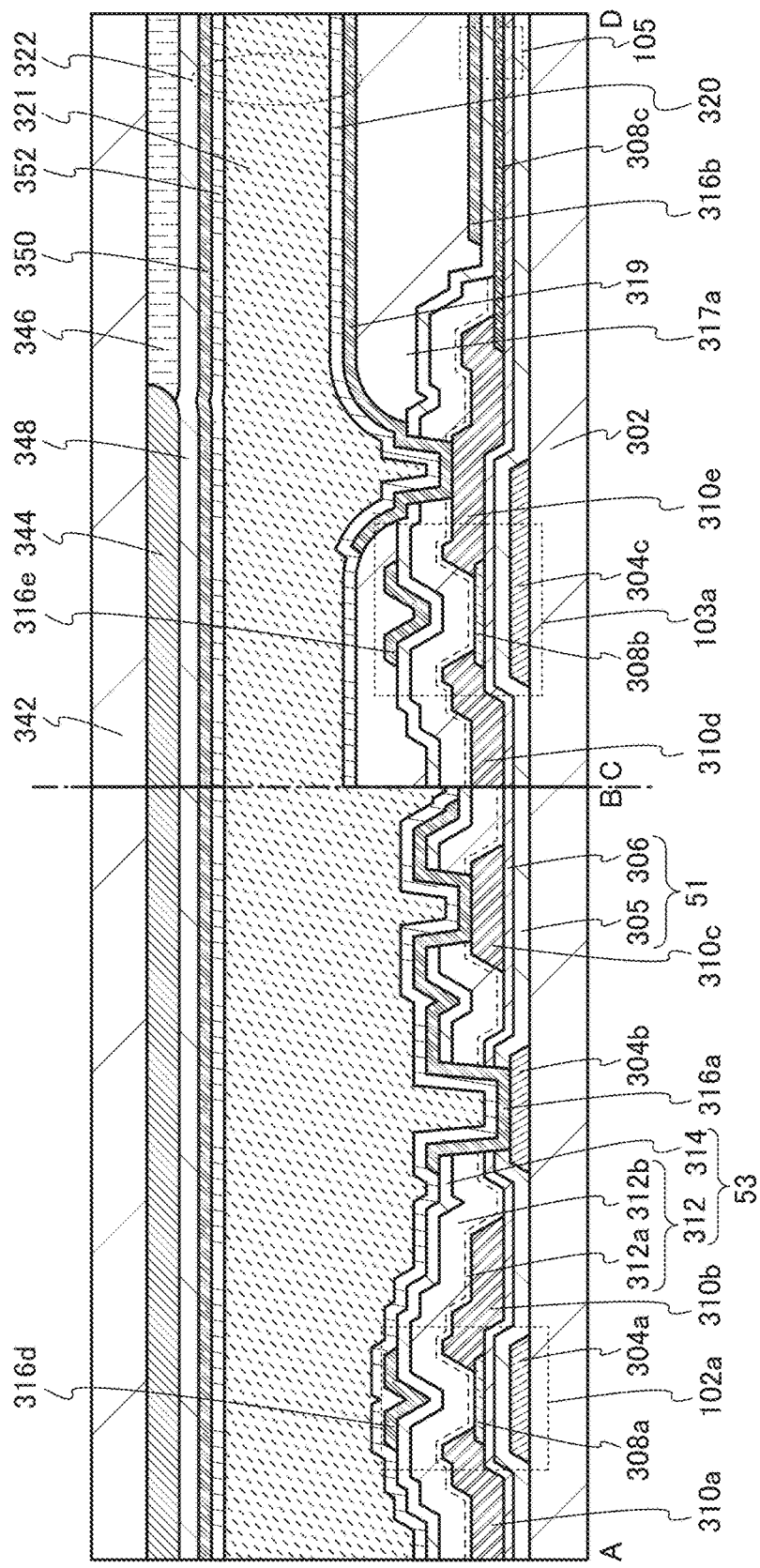
FIG. 14 is a cross-sectional view illustrating one embodiment of a display device.

In the liquid crystal display device described in Embodiment 2 or Embodiment 3, the organic insulating film 317 is provided in the driver circuit portion and the pixel portion; alternatively, an organic insulating film 317a may be formed only in the pixel portion, as illustrated in FIG. 14.

Note that in the liquid crystal display device illustrated in FIG. 14, the insulating film 313 is formed as illustrated in FIG. 7B, a mask is formed by patterning, and the insulating films 305, 306, 312, and 313 are etched using the mask to form openings. Next, the conductive film 315 illustrated in FIG. 8A is formed, and then a conductive film 316a that connects the conductive film 304b and the conductive film 310c is formed at the same time as the conductive film 316b illustrated in FIG. 8B. After that, the organic insulating film 317a and the conductive film 319 are formed.

Figure 15:
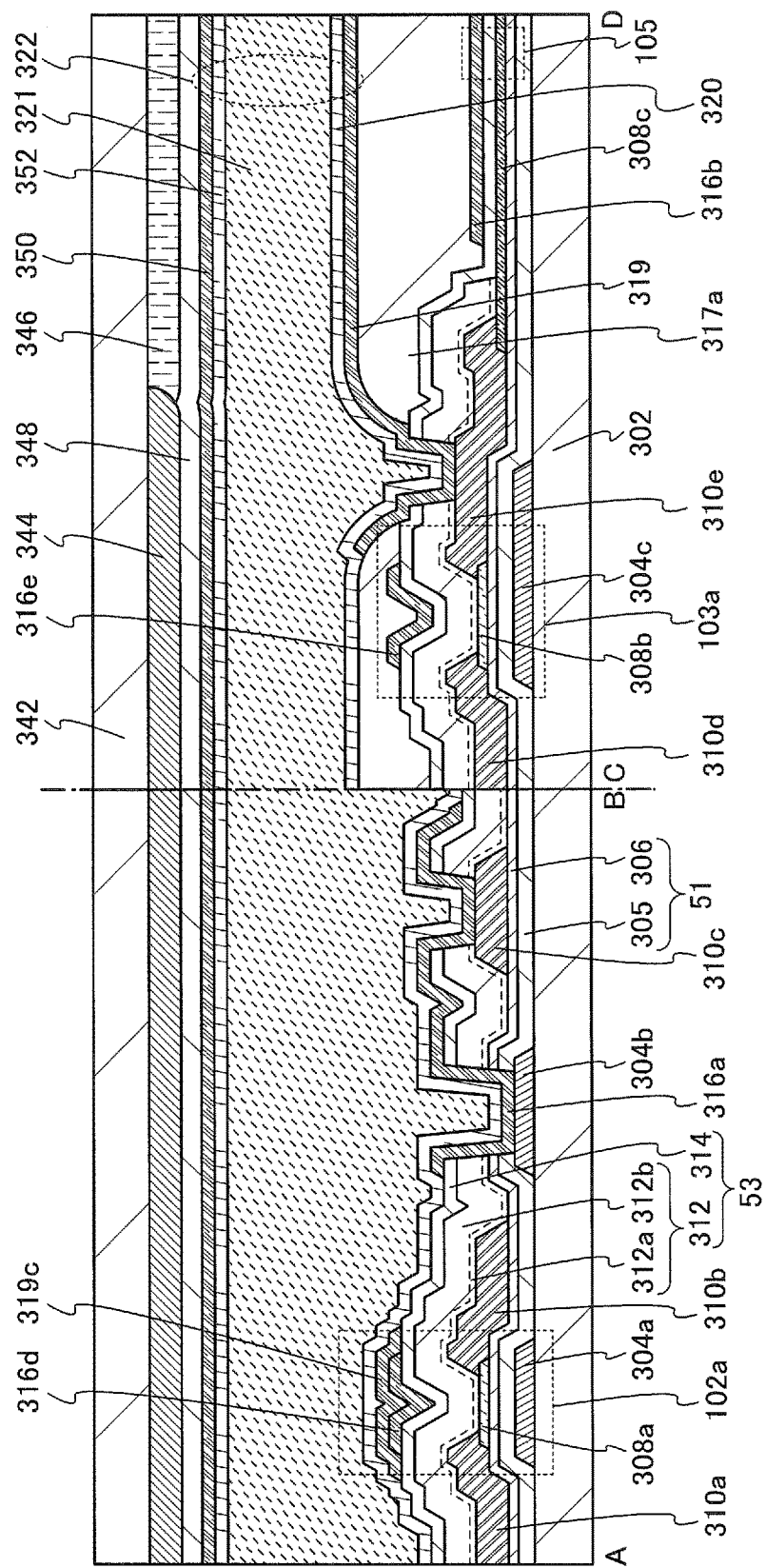
FIG. 15 is a cross-sectional view illustrating one embodiment of a display device.

In the case where the organic insulating film 317a is not provided in the driver circuit portion, a conductive film 319c formed at the same time as the conductive film 319 may be provided over the conductive film 316d functioning as a gate electrode of the transistor 102a with a dual-gate structure, as illustrated in FIG. 15.

<Modification Example 4>

Although the liquid crystal element is described as an example of a display element in Embodiment 2 and Embodiment 3, various other display elements can be used. For example, the case of using an organic EL element is described with reference to FIGS. 23 to 26. A display device including an organic EL element includes an organic resin film 371 formed with an acrylic resin, polyimide, an epoxy resin, or the like; an EL layer 373 provided over the organic resin film 371; and a common electrode 375 provided over the EL layer 373. The conductive film 319, the EL layer 373, and the common electrode 375 constitute the organic EL element.

Note that the structures, methods, and the like described in this embodiment can be used as appropriate in combination with any of the structures, methods, and the like described in other embodiments.

(Embodiment 4)

In each of the transistors 102, 102a, 103, and 103a described in Embodiments 2 and 3, the oxide semiconductor film can have a stacked-layer structure as necessary. Here, description is made using the transistor 103.

Figure 16:
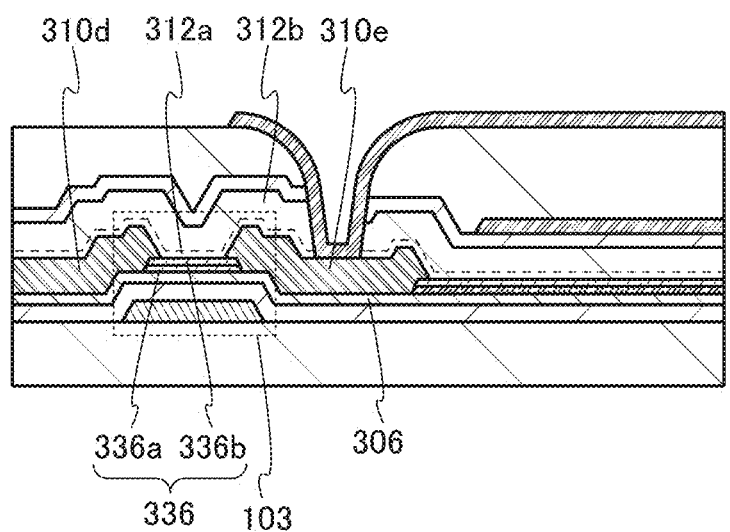
FIG. 16 is a cross-sectional view illustrating one embodiment of a display device.

In a transistor illustrated in FIG. 16, a multilayer film 336 including oxide semiconductor films is formed between the insulating film 306 and the conductive films 310d and 310e.

The multilayer film 336 includes an oxide semiconductor film 336a and an oxide semiconductor film 336b. That is, the multilayer film 336 has a two-layer structure. Further, part of the oxide semiconductor film 336a serves as a channel region. Furthermore, the insulating film 312a is formed in contact with the multilayer film 336, and the oxide semiconductor film 336b is formed in contact with the insulating film 312a. That is, the oxide semiconductor film 336b is provided between the oxide semiconductor film 336a and the insulating film 312a.

The oxide semiconductor film 336b contains one or more elements which form the oxide semiconductor film 336a. Since the oxide semiconductor film 336b contains one or more elements which form the oxide semiconductor film 336a, interface scattering is unlikely to occur at the interface between the oxide semiconductor film 336a and the oxide semiconductor film 336b. Thus, the transistor can have a high field-effect mobility because the movement of carriers is not hindered at the interface.

The oxide semiconductor film 336b includes typically In—Ga oxide, In—Zn oxide, or In-M-Zn oxide (M represents Al, Ti, Ga, Y, Zr, La, Ce, Nd, Sn, or Hf). The energy at the conduction band bottom of the oxide semiconductor film 336b is closer to a vacuum level than that of the oxide semiconductor film 336a is, and typically, the difference between the energy at the conduction band bottom of the oxide semiconductor film 336b and the energy at the conduction band bottom of the oxide semiconductor film 336a is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide semiconductor film 336b and the electron affinity of the oxide semiconductor film 336a is any one of 0.05 eV or more, 0.07 eV or more, 0.1 eV or more, and 0.15 eV or more, and any one of 2 eV or less, 1 eV or less, 0.5 eV or less, and 0.4 eV or less.

The oxide semiconductor film 336b preferably contains In because carrier mobility (electron mobility) can be increased.

When the oxide semiconductor film 336b contains a larger amount of Al, Ti, Ga, Y, Zr, La, Ce, Nd, Sn, or Hf in an atomic ratio than the amount of In in an atomic ratio, any of the following effects may be obtained:

(1) the energy gap of the oxide semiconductor film 336b is widened;

(2) the electron affinity of the oxide semiconductor film 336b decreases;

(3) an impurity from the outside is blocked;

(4) an insulating property increases as compared with the oxide semiconductor film 336a; and (5) oxygen vacancies are less likely to be generated in the oxide semiconductor film 336b containing a larger amount of Al, Ti, Ga, Y, Zr, La, Ce, Nd, Sn, or Hf in an atomic ratio than the amount of In in an atomic ratio because Al, Ti, Ga, Y, Zr, La, Ce, Nd, Sn, or Hf is a metal element which is strongly bonded to oxygen.

In the case where the oxide semiconductor film 336b contains an In-M-Zn oxide, the proportions of In and M when summation of In and M is assumed to be 100 atomic % are as follows: the atomic percentage of In is less than 50 atomic % and the atomic percentage of M is greater than or equal to 50 atomic %, or preferably, the atomic percentage of In is less than 25 atomic % and the atomic percentage of M is greater than or equal to 75 atomic %.

Further, in the case where each of the oxide semiconductor films 336a and 336b is an In-M-Zn oxide film (M represents Al, Ti, Ga, Y, Zr, La, Ce, Nd, Sn, or Hf), the proportion of M (M represents Al, Ti, Ga, Y, Zr, La, Ce, Nd, Sn, or Hf) in the oxide semiconductor film 336b is higher than that in the oxide semiconductor film 336a. Typically, the proportion of M in the oxide semiconductor film 336b is 1.5 or more times, twice or more, or three or more times as high as that in the oxide semiconductor film 336a.

Furthermore, in the case where each of the oxide semiconductor films 336a and 336b is an In-M-Zn oxide film (M represents Al, Ti, Ga, Y, Zr, La, Ce, Nd, Sn, or Hf), when In:M:Zn=$x_1$:$y_1$:$z_1$ [atomic ratio] is satisfied in the oxide semiconductor film 336b and In:M:Zn=$x_2$:$y_2$:$z_2$ [atomic ratio] is satisfied in the oxide semiconductor film 336a, $y_1/x_1$ is higher than $y_2/x_2$, or $y_1/x_1$ be 1.5 or more times as high as $y_2/x_2$. Alternatively, $y_1/x_1$ is twice or more as high as $y_2/x_2$, or $y_1/x_1$ is three or more times as high as $y_2/x_2$. In this case, it is preferable that in the oxide semiconductor film 336b, $y_1$ be higher than or equal to $x_1$ because a transistor including the oxide semiconductor film can have stable electrical characteristics. However, when $y_1$ is larger than or equal to three or more times $x_1$, the field-effect mobility of the transistor including the oxide semiconductor film is reduced. Accordingly, $y_1$ is preferably smaller than three times $x_1$.

For the oxide semiconductor film 336a, an In—Ga—Zn oxide with an atomic ratio of In:Ga:Zn=1:1:1, In:Ga:Zn=1:1:1.2, or In:Ga:Zn=3:1:2 can be used, for example. For the oxide semiconductor film 336b, an In—Ga—Zn oxide with an atomic ratio of In:Ga:Zn=1:3:n (n is an integer greater than or equal to 2 and less than or equal to 8), 1:6:m (m is an integer greater than or equal to 2 and less than or equal to 10), or 1:9:6 can be used. Note that the proportion of each metal element in the atomic ratio of each of the oxide semiconductor films 336a and 336b may vary within a range of ±20% of that in the above atomic ratio as an error. In the oxide semiconductor film 336a, the percentage of Zn is preferably higher than or equal to the percentage of Ga because a CAAC-OS is easily formed.

The oxide semiconductor film 336b also serves as a film which relieves damage to the oxide semiconductor film 336a at the time of forming the insulating film 312b later.

The thickness of the oxide semiconductor film 336b is greater than or equal to 3 nm and less than or equal to 100 nm, or preferably greater than or equal to 3 nm and less than or equal to 50 nm.

The oxide semiconductor film 336b may have a non-single-crystal structure, for example, like the oxide semiconductor film 336a. Non-single-crystal structures include a c-axis aligned crystalline oxide semiconductor (CAAC-OS) described later, a polycrystalline structure, a microcrystalline structure described later, and an amorphous structure.

Note that the oxide semiconductor films 336a and 336b may each be a mixed film including two or more of the following: a region having an amorphous structure, a region having a microcrystalline structure, a region having a polycrystalline structure, a CAAC-OS region, and a region having a single crystal structure. The mixed film has a single-layer structure including, for example, two or more of a region having an amorphous structure, a region having a microcrystalline structure, a region having a polycrystalline structure, a CAAC-OS region, and a region having a single crystal structure in some cases. Furthermore, the mixed film has a stacked-layer structure including, for example, layers of two or more of a region having an amorphous structure, a region having a microcrystalline structure, a region having a polycrystalline structure, a CAAC-OS region, and a region having a single crystal structure in some cases.

Here, the oxide semiconductor film 336b is provided between the oxide semiconductor film 336a and the insulating film 312a. Hence, if trap states are formed between the oxide semiconductor film 336b and the insulating film 312a owing to impurities and defects, electrons flowing in the oxide semiconductor film 336a are less likely to be captured by the trap states because there is a distance between the trap states and the oxide semiconductor film 336a. Accordingly, the amount of on-state current of the transistor can be increased, and the field-effect mobility can be increased. When electrons are captured by the trap states, the electrons become negative fixed charges. As a result, a threshold voltage of the transistor changes. However, by the distance between the oxide semiconductor film 336a and the trap states, capture of the electrons by the trap states can be reduced, and accordingly a change of the threshold voltage can be reduced.

Further, impurities from the outside can be blocked by the oxide semiconductor film 336b, and accordingly, the amount of impurities which move from the outside to the oxide semiconductor film 336a can be reduced. Further, an oxygen vacancy is less likely to be formed in the oxide semiconductor film 336b. Consequently, the impurity concentration and the amount of oxygen vacancies in the oxide semiconductor film 336a can be reduced.

Note that the oxide semiconductor films 336a and 336b are not formed by simply stacking each film, but are formed to form a continuous junction (here, in particular, a structure in which the energy of the bottom of the conduction band is changed continuously between the films). In other words, a stacked-layer structure in which there exists no impurity which forms a defect level such as a trap center or a recombination center at each interface is provided. If an impurity exists between the oxide semiconductor films 336a and 336b which are stacked, a continuity of the energy band is damaged, and the carrier is captured or recombined at the interface and then disappears.

In order to form such a continuous junction, the films need to be stacked successively without being exposed to the air by using a multi-chamber deposition apparatus (sputtering apparatus) provided with a load lock chamber. Each chamber of the sputtering apparatus is preferably evacuated to a high vacuum (to the degree of about $5\times10^{-7}$ Pa to $1\times10^{-4}$ Pa) by an adsorption vacuum pump such as a cryopump so that water and the like acting as impurities for the oxide semiconductor film are removed as much as possible. Alternatively, a combination of a turbo molecular pump and a cold trap is preferably used to prevent back-flow of a gas, especially a gas containing carbon or hydrogen, from an exhaust system into a chamber.

In FIG. 16, the multilayer film 336 has a two-layer structure of the oxide semiconductor film 336a and the oxide semiconductor film 336b; however the multilayer film 336 may have a three-layer structure in which a film similar to the oxide semiconductor film 336b is further provided between the insulating film 306 and the oxide semiconductor film 336a. In this case, the thickness of the oxide film provided between the insulating film 306 and the oxide semiconductor film 336a is preferably smaller than that of the oxide semiconductor film 336a. When the thickness of the oxide film is greater than or equal to 1 nm and less than or equal to 5 nm, preferably greater than or equal to 1 nm and less than or equal to 3 nm, the amount of change in the threshold voltage of the transistor can be reduced.

Note that the structures, methods, and the like described in this embodiment can be used as appropriate in combination with any of the structures, methods, and the like described in other embodiments.

(Embodiment 5)

In this embodiment, one embodiment which can be applied to an oxide semiconductor film in the transistor included in the display device described in the above embodiment is described.

The oxide semiconductor film may include one or more of the following: an oxide semiconductor having a single crystal structure (hereinafter referred to as a single crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may be formed using a CAAC-OS film. Furthermore, the oxide semiconductor film may include an amorphous oxide semiconductor and an oxide semiconductor having a crystal grain. Described below are the CAAC-OS and the microcrystalline oxide semiconductor.

First, a CAAC-OS film is described.

The CAAC-OS film is one of oxide semiconductor films including a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

FIG. 17A is a cross-sectional TEM image of a CAAC-OS film. FIG. 17B is a cross-sectional TEM image obtained by enlarging the image of FIG. 17A. In FIG. 17B, atomic arrangement is highlighted for easy understanding.

FIG. 17C is local Fourier transform images of regions each surrounded by a circle (the diameter is about 4 nm) between A and O and between O and A' in FIG. 17A. C-axis alignment can be observed in each region in FIG. 17C. The c-axis direction between A and O is different from that between O and A', which indicates that a grain in the region between A and O is different from that between O and A'. In addition, the angle of the c-axis between A and O continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) indicating alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 18A).

From the results of the cross-sectional TEM image and the plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray is incident on a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added may be altered and the proportion of the c-axis aligned crystal parts in the CAAC-OS film might vary depending on regions.

Note that when the CAAC-OS film with an $InGaZnO_4$ crystal is analyzed by an out-of-plane method, a peak may also be observed when $2\theta$ is around 36°, in addition to the peak at $2\theta$ of around 31°. The peak at $2\theta$ of around 36° indicates that a crystal having no c-axis alignment is included in part of the CAAC-OS film. It is preferable that in the CAAC-OS film, a peak appear when $2\theta$ is around 31° and that a peak not appear when $2\theta$ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, a transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

In an image obtained with the TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, a grain boundary is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases (see FIG. 18B).

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where an oxide semiconductor film has a plurality of structures, the structures can be analyzed using nanobeam electron diffraction in some cases.

Figure 18A:
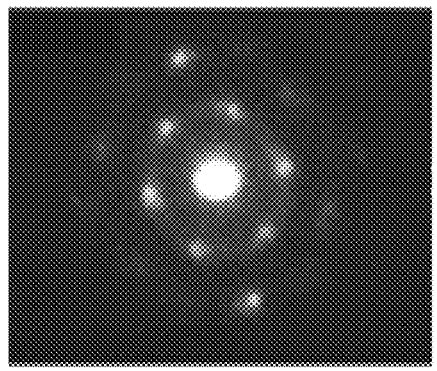
FIGS. 18A and 18B show nanobeam electron diffraction patterns of oxide semiconductor films.
Figure 18B:
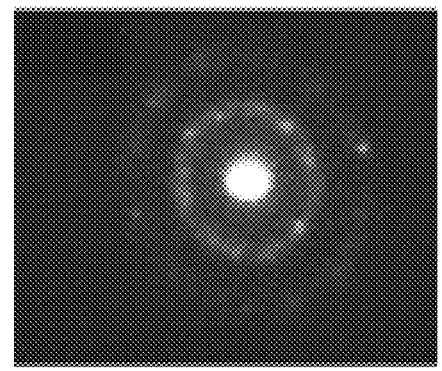
Figure 18C:
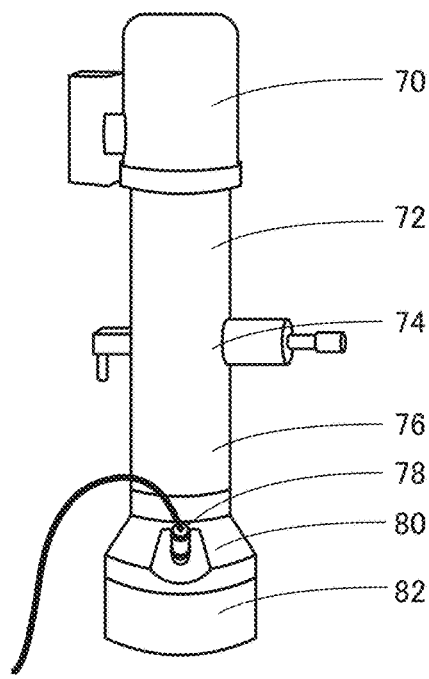
FIGS. 18C and 18D illustrate an example of a transmission electron diffraction measurement apparatus.

FIG. 18C illustrates a transmission electron diffraction measurement apparatus which includes an electron gun chamber 70, an optical system 72 below the electron gun chamber 70, a sample chamber 74 below the optical system 72, an optical system 76 below the sample chamber 74, an observation chamber 80 below the optical system 76, a camera 78 installed in the observation chamber 80, and a film chamber 82 below the observation chamber 80. The camera 78 is provided to face toward the inside of the observation chamber 80. Note that the film chamber 82 is not necessarily provided.

Figure 18D:
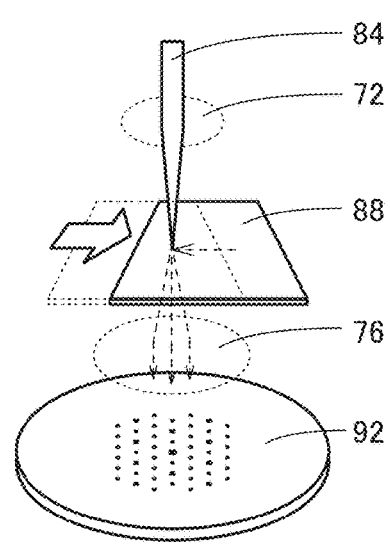

FIG. 18D illustrates an internal structure of the transmission electron diffraction measurement apparatus illustrated in FIG. 18C. In the transmission electron diffraction measurement apparatus, a substance 88 which is positioned in the sample chamber 74 is irradiated with electrons emitted from an electron gun installed in the electron gun chamber 70 through the optical system 72. Electrons passing through the substance 88 are incident on a fluorescent plate 92 provided in the observation chamber 80 through the optical system 76. On the fluorescent plate 92, a pattern corresponding to the intensity of the incident electrons appears, which allows measurement of a transmission electron diffraction pattern.

The camera 78 is installed so as to face the fluorescent plate 92 and can take an image of a pattern appearing on the fluorescent plate 92. An angle formed by a straight line which passes through the center of a lens of the camera 78 and the center of the fluorescent plate 92 and an upper surface of the fluorescent plate 92 is, for example, 15° or more and 80° or less, 30° or more and 75° or less, or 45° or more and 70° or less. As the angle is reduced, distortion of the transmission electron diffraction pattern taken by the camera 78 becomes larger. Note that if the angle is obtained in advance, the distortion of an obtained transmission electron diffraction pattern can be corrected. Note that the film chamber 82 may be provided with the camera 78. For example, the camera 78 may be set in the film chamber 82 so as to be opposite to the incident direction of electrons 84. In this case, a transmission electron diffraction pattern with less distortion can be taken from the rear surface of the fluorescent plate 92.

A holder for fixing the substance 88 that is a sample is provided in the sample chamber 74. The holder transmits electrons passing through the substance 88. The holder may have, for example, a function of moving the substance 88 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 88.

Then, a method for measuring a transmission electron diffraction pattern of a substance by the transmission electron diffraction measurement apparatus described above will be described.

For example, changes in the structure of a substance can be observed by changing (scanning) the irradiation position of the electrons 84 that are a nanobeam on the substance, as illustrated in FIG. 18D. At this time, when the substance 88 is a CAAC-OS film, a diffraction pattern shown in FIG. 18A is observed. When the substance 88 is an nc-OS film, a diffraction pattern shown in FIG. 18B is observed.

Even when the substance 88 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high-quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 19A:
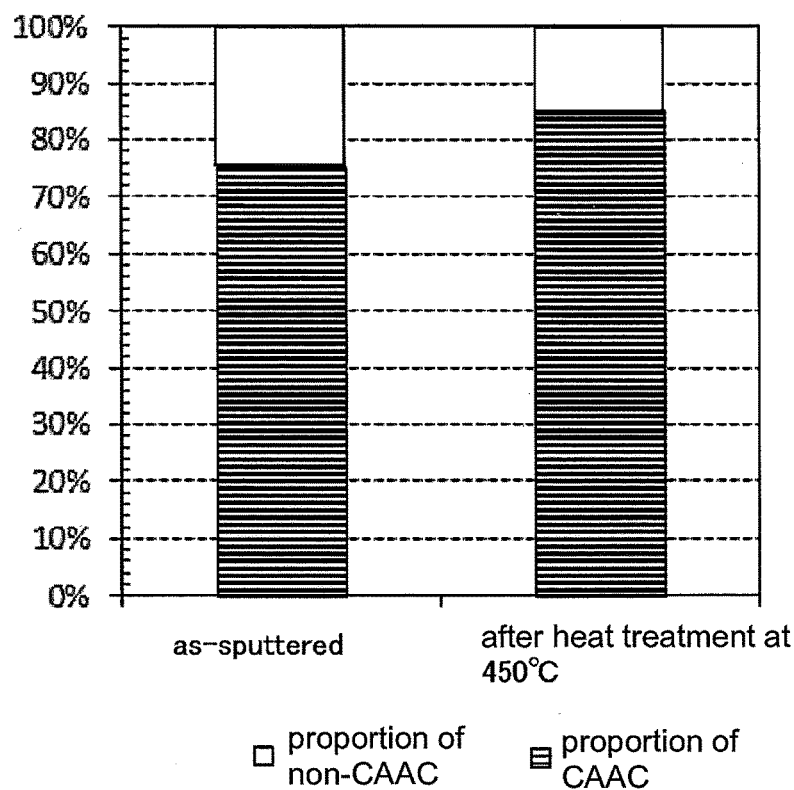
FIG. 19A shows an example of structural analysis by transmission electron diffraction measurement.

FIG. 19A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 19B:
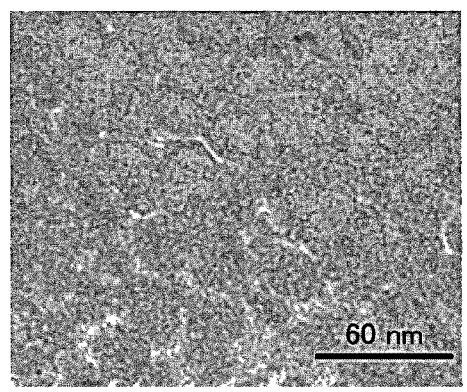
FIGS. 19B and 19C show plan-view TEM images.
Figure 19C:
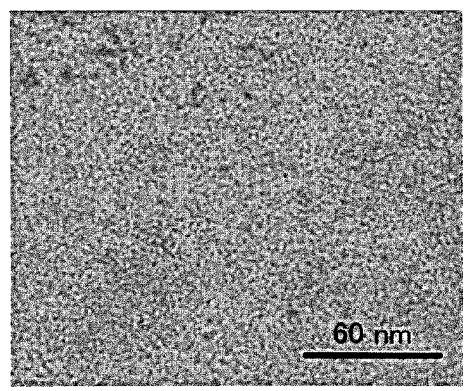

FIGS. 19B and 19C are plan-view TEM images of the CAAC-OS film obtained just after the deposition and the CAAC-OS film subjected to the heat treatment at 450° C., respectively. Comparison between FIGS. 19B and 19C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in other embodiments.

(Embodiment 6)

In the transistor manufactured using the oxide semiconductor film described in Embodiment 2, the current in an off state (off-state current) can be made small. Accordingly, an electric signal such as an image signal can be held for a longer period, and a writing interval can be set longer.

With the use of a transistor with low off-state current, a liquid crystal display device in this embodiment can display images by at least two driving methods (modes). The first driving mode is a conventional driving method of a liquid crystal display device, in which data is rewritten sequentially every frame. The second driving mode is a driving method in which data rewriting is stopped after data writing is executed, i.e., a driving mode with a reduced refresh rate.

Moving images are displayed in the first driving mode. A still image can be displayed without change in image data every frame; thus, it is not necessary to rewrite data every frame. When the liquid crystal display device is driven in the second driving mode in displaying still images, power consumption can be reduced with less screen flicker.

A liquid crystal element used in the liquid crystal display device in this embodiment has a large-area capacitor that can store a large amount of charge. Thus, it is possible to retain the potential of the pixel electrode for a longer time and to apply a driving mode with a reduced refresh rate. Furthermore, a change in voltage applied to the liquid crystal layer can be inhibited for a long time even when the liquid crystal display device is used in the driving mode with a reduced refresh rate. This makes it possible to more effectively prevent screen flickers from being perceived by a user. Thus, the power consumption can be reduced and the display quality can be improved.

An effect of reducing the refresh rate will be described here.

The eye strain is divided into two categories: nerve strain and muscle strain. The nerve strain is caused by prolonged looking at light emitted from a liquid crystal display device or blinking images. This is because the brightness stimulates and fatigues the retina and nerve of the eye and the brain. The muscle strain is caused by overuse of a ciliary muscle which works for adjusting the focus.

Figure 20A:
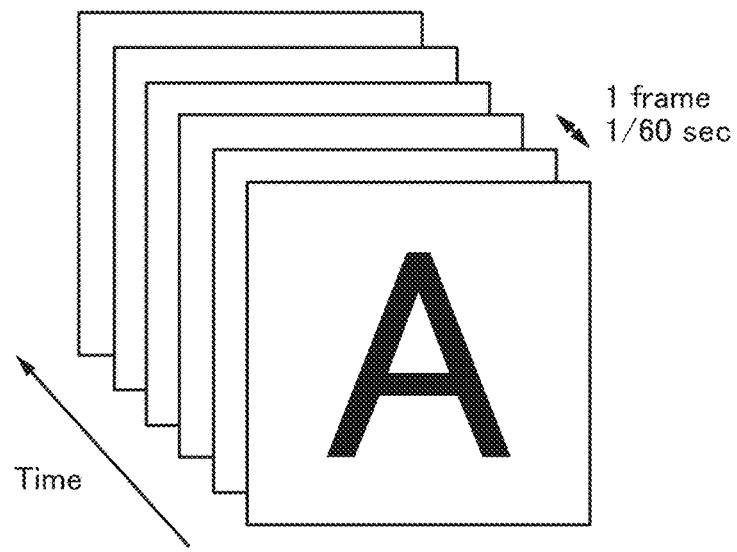
FIGS. 20A and 20B are conceptual diagrams illustrating examples of a driving method of a display device.

FIG. 20A is a schematic diagram illustrating display of a conventional liquid crystal display device. As illustrated in FIG. 20A, for the display of the conventional liquid crystal display device, image rewriting is performed 60 times per second. A prolonged looking at such a screen might stimulate the retina and nerve of the eye and the brain of a user and lead to eye strain.

In this embodiment, a transistor with an extremely low off-state current (e.g., a transistor using an oxide semiconductor) is used in a pixel portion of the liquid crystal display device. In addition, the liquid crystal element has a large-area capacitor. With these components, leakage of electrical charges stored in the capacitor can be inhibited, whereby the luminance of the liquid crystal display device can be kept even at a lower frame frequency.

Figure 20B:
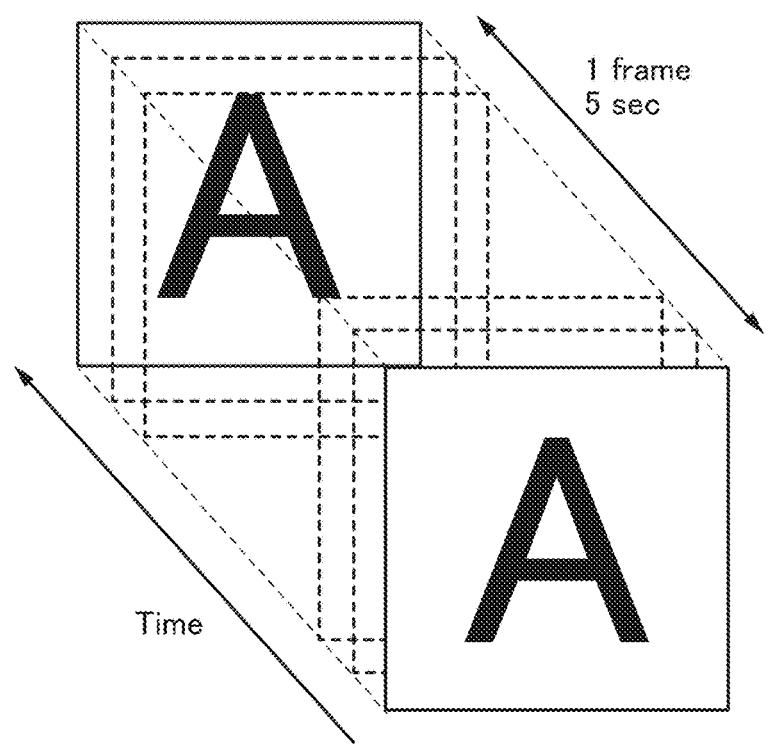

Thus, for example, the number of times of image writing can be reduced to once every five seconds as shown in FIG. 20B. The same image can be seen for as long as possible and flickers on a screen perceived by a user can be reduced. This makes it possible to reduce stimuli to the retina and nerve of the eye and the brain of a user, resulting in less nerve strain.

One embodiment of the present invention can provide an eye-friendly liquid crystal display device.

Note that the structures, methods, and the like described in this embodiment can be used as appropriate in combination with any of the structures, methods, and the like described in other embodiments.

(Embodiment 7)

In this embodiment, a structure example of an electronic device including a display panel of one embodiment of the present invention is described. In addition, in this embodiment, a display module including a display device of one embodiment of the present invention will be described with reference to FIG. 21.

Figure 21:
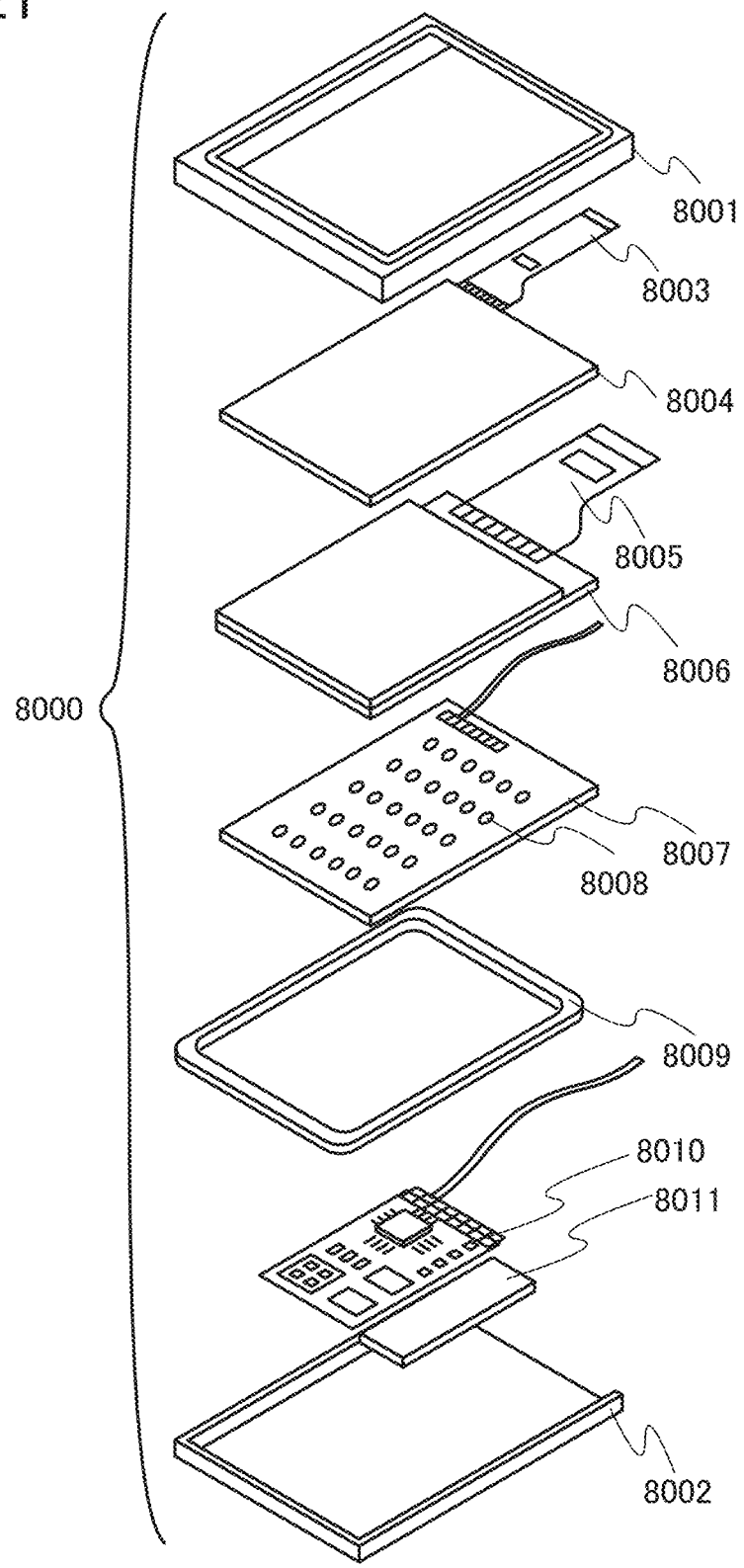
FIG. 21 illustrates a display module.

In a display module 8000 illustrated in FIG. 21, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 22A to 22D are external views of electronic devices each including the display device of one embodiment of the present invention.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

Figure 22A:
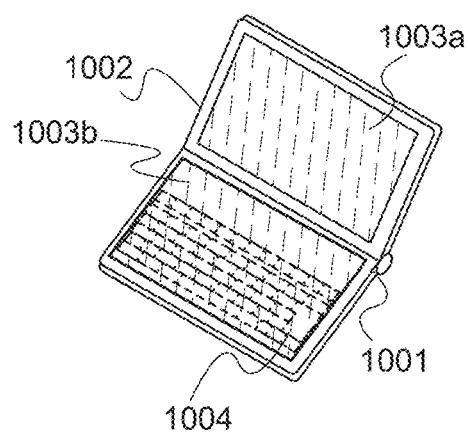
FIGS. 22A to 22D are each an external view of an electronic device of one embodiment.

FIG. 22A illustrates a portable information terminal, which includes a main body 1001, a housing 1002, display portions 1003a and 1003b, and the like. The display portion 1003b functions as a touch panel. By touching a keyboard 1004 displayed on the display portion 1003b, a screen can be operated and text can be input. Needless to say, the display portion 1003a may function as a touch panel. A liquid crystal panel or an organic light-emitting panel is manufactured by using the transistor described in the above embodiment as a switching element and applied to the display portion 1003a or 1003b, whereby a highly reliable portable information terminal can be provided.

The portable information terminal in FIG. 22A can have a function of displaying a variety of information (e.g., a still image, a moving image, and a text image) on the display portion, a function of displaying a calendar, a date, the time, or the like on the display portion, a function of operating or editing information displayed on the display portion, a function of controlling processing by various kinds of software (programs), and the like. Moreover, an external connection terminal (e.g., an earphone terminal, a USB terminal, or the like), a recording media insertion portion, or the like may be provided on a rear surface or a side surface of the housing.

The portable information terminal illustrated in FIG. 22A may be configured to be able to transmit and receive data wirelessly. The portable information terminal can have a structure where desired book data or the like are wirelessly purchased and downloaded from an electronic book server.

Figure 22B:
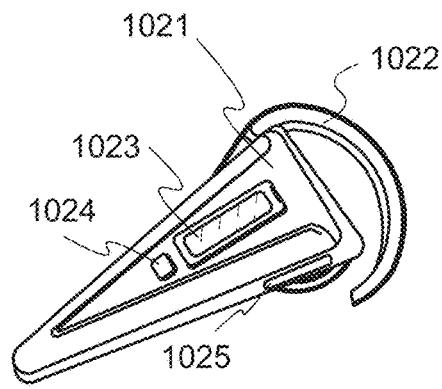

FIG. 22B illustrates a portable music player, which includes, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is manufactured by using the transistor described in the above embodiment as a switching element and is applied to the display portion 1023, whereby a highly reliable portable music player can be provided.

Furthermore, when the portable music player illustrated in FIG. 22B has an antenna, a microphone function, or a wireless communication function and is used with a cellular phone, a user can talk on the phone wirelessly and hands-free while driving a car or the like.

Figure 22C:
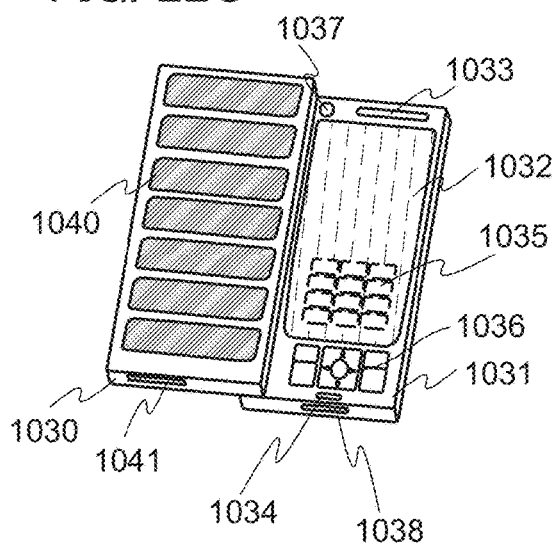

FIG. 22C illustrates a cellular phone, which includes two housings, a housing 1030 and a housing 1031. The housing 1031 includes a display panel 1032, a speaker 1033, a microphone 1034, a pointing device 1036, a camera lens 1037, an external connection terminal 1038, and the like. In addition, the housing 1030 includes a solar cell 1040 having a function of charging the cellular phone, an external memory slot 1041, and the like. Further, an antenna is incorporated in the housing 1031. The transistor described in the above embodiment is applied to the display panel 1032, whereby a highly reliable cellular phone can be provided.

Further, the display panel 1032 includes a touch panel. A plurality of operation keys 1035 which are displayed as images are indicated by dashed lines in FIG. 22C. Note that a boosting circuit by which a voltage output from the solar cell 1040 is increased to be sufficiently high for each circuit is also included.

The display panel 1032 changes the orientation of display as appropriate in accordance with the application mode. Further, the camera lens 1037 is provided on the same side as the display panel 1032, so that the cellular phone can be used as a video phone. The speaker 1033 and the microphone 1034 can be used for videophone calls, recording, and playing sound, etc. as well as voice calls. Moreover, the housings 1030 and 1031 in a state where they are developed as illustrated in FIG. 22C can be slid so that one is lapped over the other. Therefore, the size of the cellular phone can be reduced, which makes the cellular phone suitable for being carried around.

The external connection terminal 1038 can be connected to an AC adaptor and a variety of cables such as a USB cable, and charging and data communication with a personal computer or the like are possible. Moreover, the cellular phone can store and transfer a larger amount of data by inserting a recording medium into the external memory slot 1041.

Further, in addition to the above functions, an infrared communication function, a television reception function, or the like may be provided.

Figure 22D:
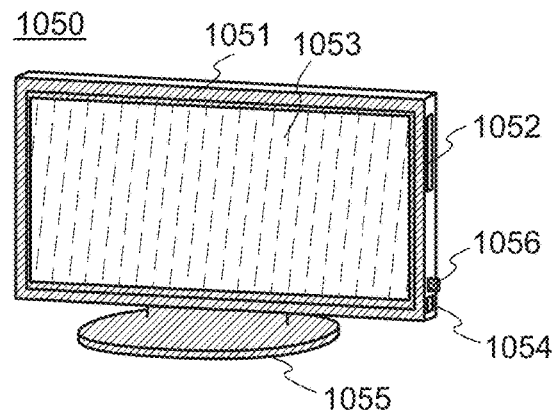
Figure 23:
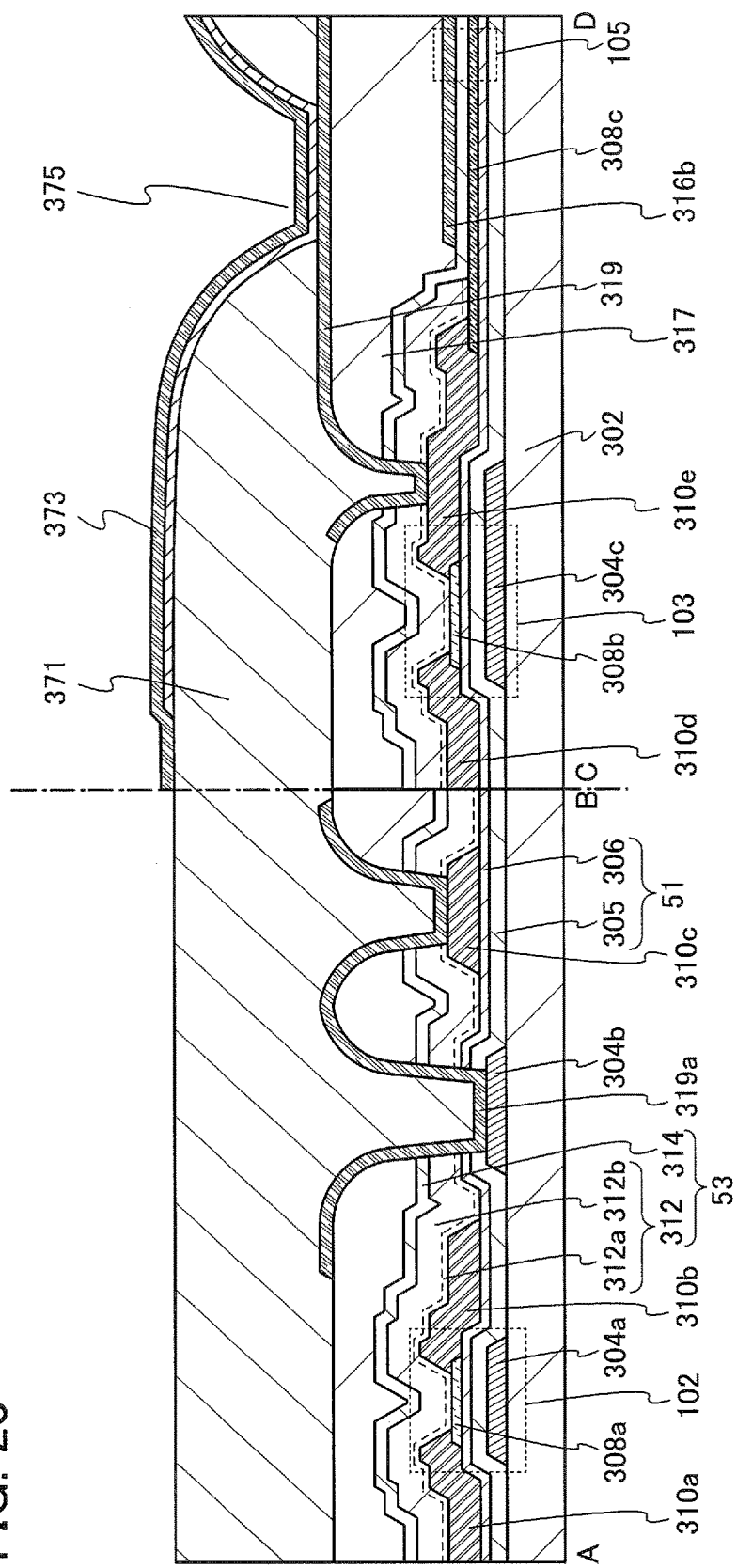
FIG. 23 is a cross-sectional view illustrating one embodiment of a display device.
Figure 24:
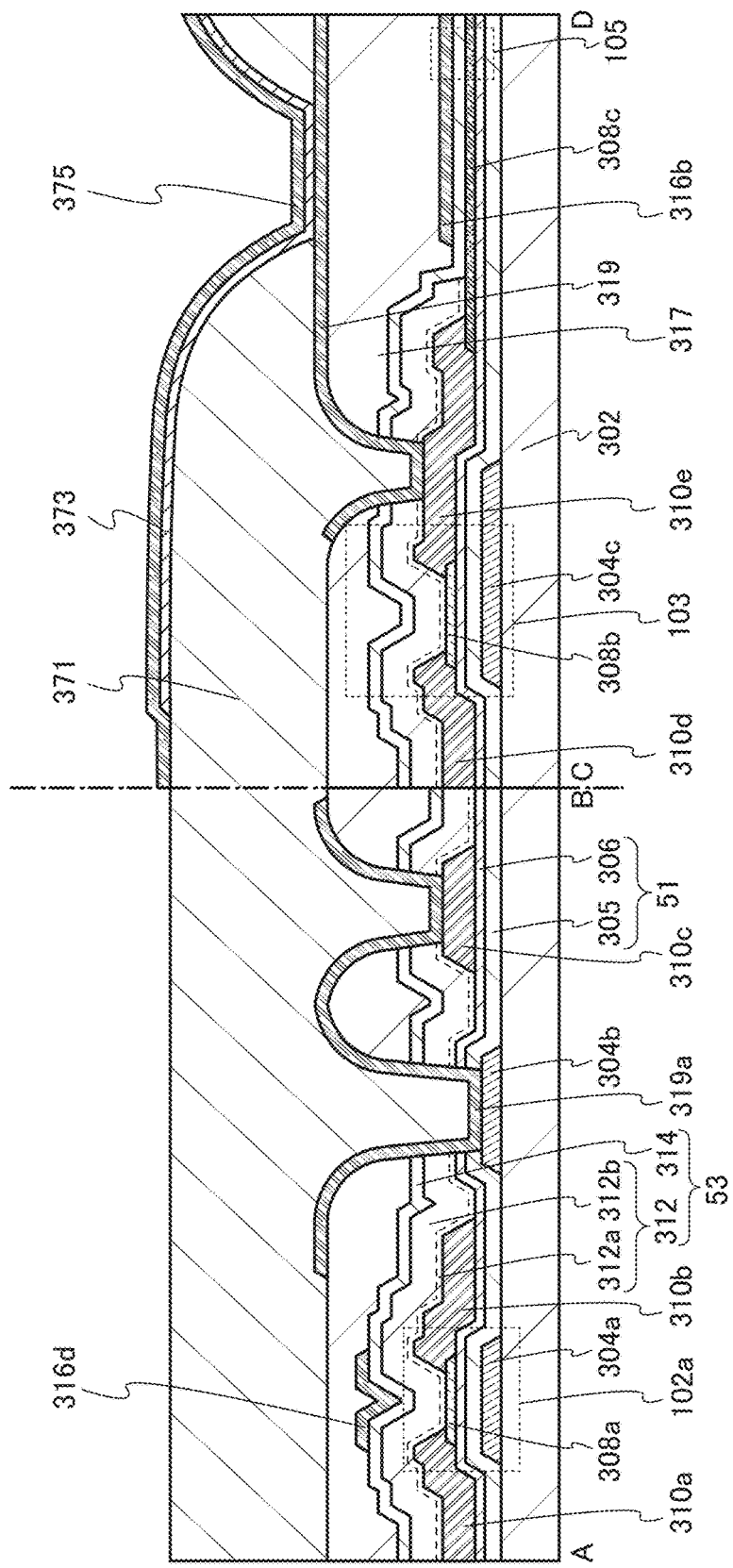
FIG. 24 is a cross-sectional view illustrating one embodiment of a display device.
Figure 25:
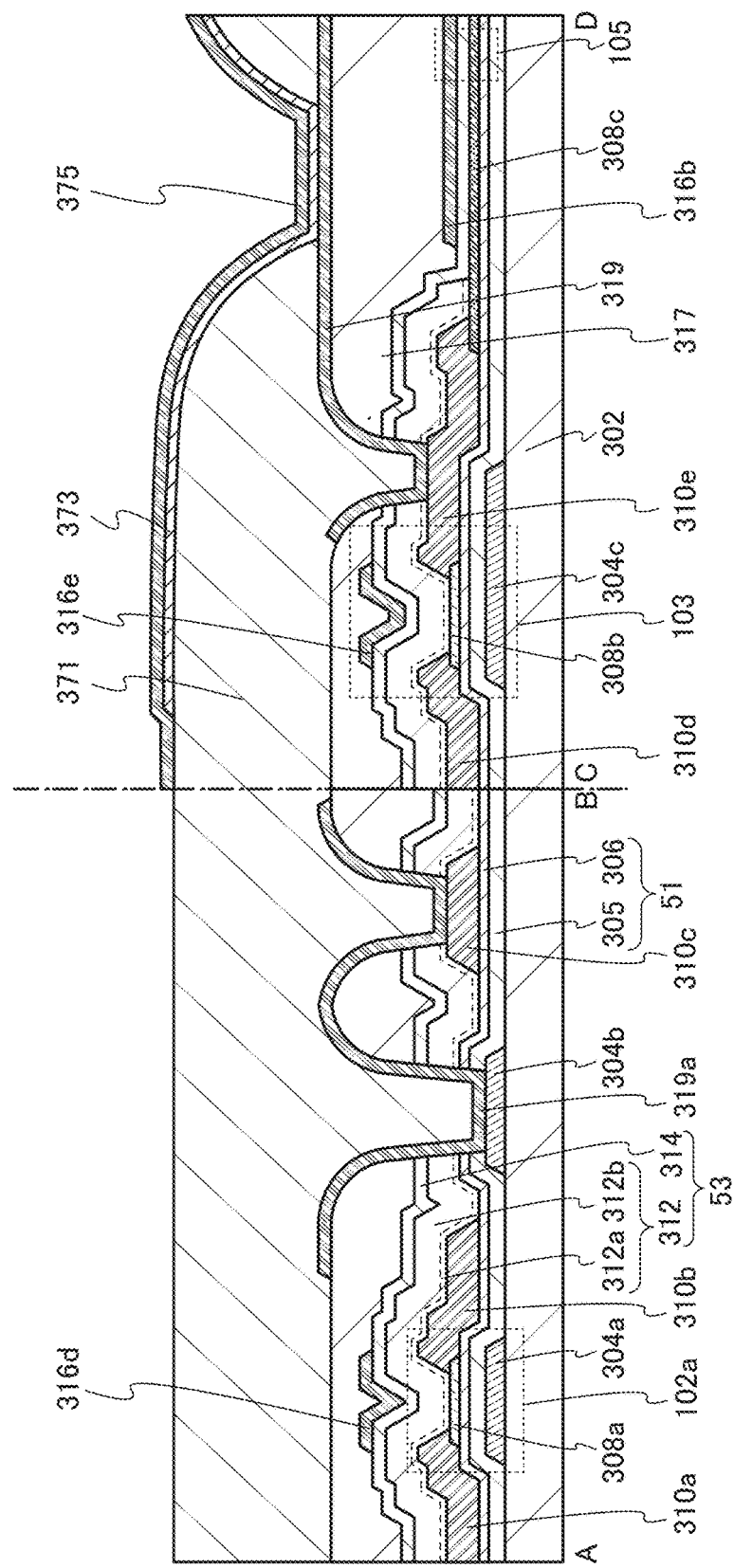
FIG. 25 is a cross-sectional view illustrating one embodiment of a display device.
Figure 26:
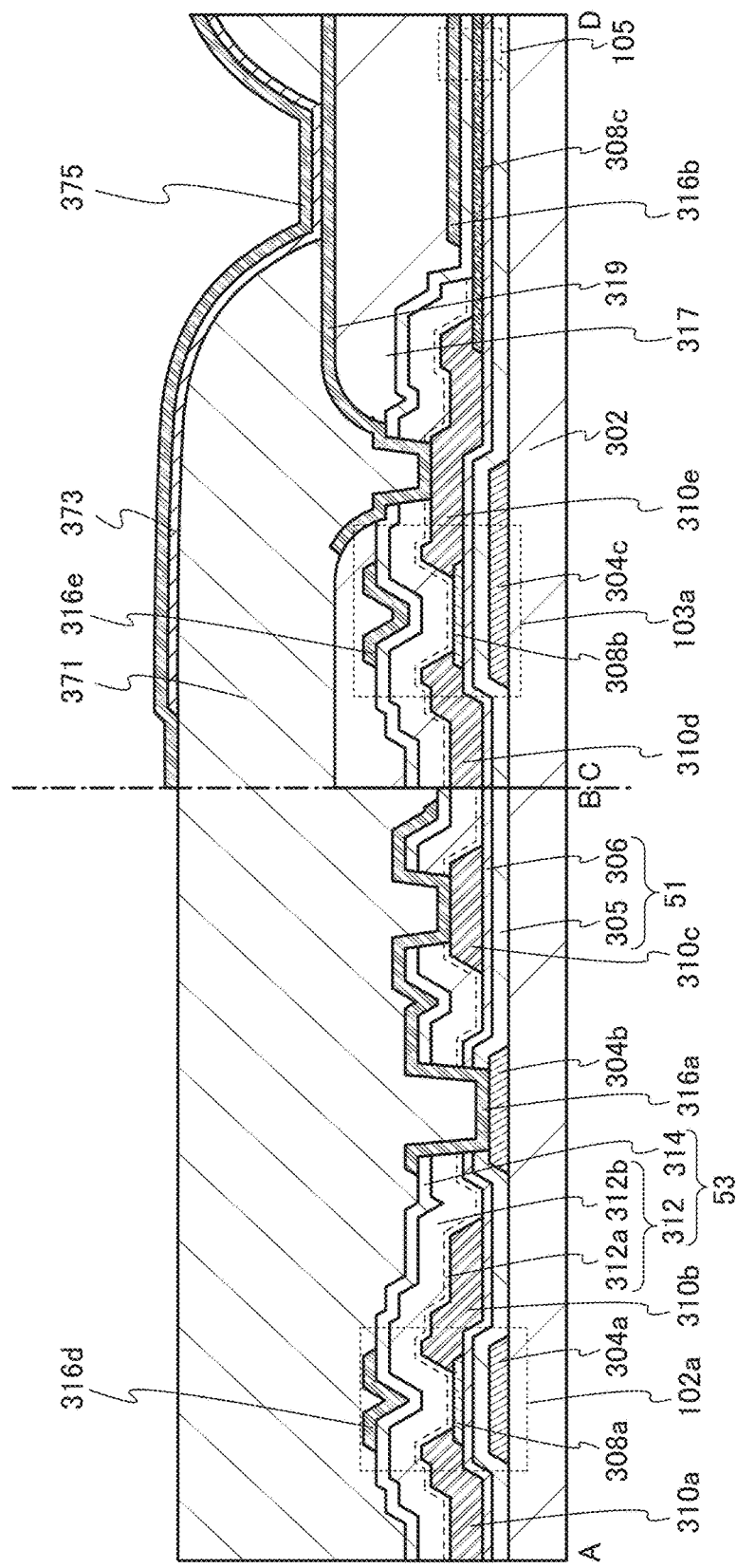
FIG. 26 is a cross-sectional view illustrating one embodiment of a display device.

FIG. 22D illustrates an example of a television set. In a television set 1050, a display portion 1053 is incorporated in a housing 1051. The display portion 1053 can display images. Moreover, a CPU is incorporated in a stand 1055 for supporting the housing 1051. When the transistor described in the above embodiment is applied to the display portion 1053 and the CPU, the television set 1050 with high reliability can be obtained.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, the television set 1050 can receive general television broadcasting. Moreover, when the television set is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium can be inserted into the storage medium recording and reproducing portion 1052, and reading data stored in the storage medium and writing data to the storage medium can be performed. In addition, a picture, a video, or the like stored as data in an external memory 1056 inserted to the external memory slot can be displayed on the display portion 1053.

Further, in the case where the off-state leakage current of the transistor described in the above embodiment is extremely small, when the transistor is used in the external memory 1056 or the CPU, the television set 1050 can have high reliability and sufficiently reduced power consumption.

Note that the structures, methods, and the like described in this embodiment can be used as appropriate in combination with any of the structures, methods, and the like described in other embodiments.

This application is based on Japanese Patent Application serial no. 2013-245172 filed with Japan Patent Office on Nov. 27, 2013 and Japanese Patent Application serial no. 2014-038159 filed with Japan Patent Office on Feb. 28, 2014, the entire contents of which are hereby incorporated by reference.

What is claimed is:

1. A display device comprising:
    a first pixel;
    a second pixel;
    a first wiring;
    a second wiring;
    a third wiring; and
    a first light-transmitting conductive film overlapping the first wiring, the second wiring and the third wiring,
    wherein each of the first pixel and the second pixel comprises a first sub-pixel, a second sub-pixel, a third sub-pixel, and a fourth sub-pixel, each subpixel comprising a transistor and a capacitor,
    wherein the capacitor of each subpixel comprises a metal oxide film and a part of the first light-transmitting conductive film with an inorganic insulating film between the metal oxide film and the part of the first light-transmitting conductive film,
    wherein the first wiring is electrically connected to a gate electrode of the transistor of the first sub-pixel of the first pixel, a gate of the transistor of the second sub-pixel of the first pixel, and a gate of the transistor of the third sub-pixel of the first pixel, wherein the second wiring is electrically connected to a gate of the transistor of the fourth sub-pixel of the first pixel and a gate of the transistor of the fourth sub-pixel of the second pixel, and wherein the third wiring is electrically connected to one of a source and a drain of the transistor of the fourth sub-pixel of the first pixel, one of a source and a drain of the transistor of the second sub-pixel of the first pixel and one of a source and a drain of the transistor of the second sub-pixel of the second pixel.

2. The display device according to claim 1, further comprising:

an organic insulating film over the inorganic insulating film; and a pixel electrode over the organic insulating film, the pixel electrode being electrically connected to the transistor of the first sub-pixel of the first pixel, wherein the transistor of the first sub-pixel of the first pixel is over a substrate, wherein the transistor of the first sub-pixel of the first pixel comprises:
the gate electrode over the substrate;
a gate insulating film over the gate electrode;
an oxide semiconductor film over the gate insulating film, the oxide semiconductor film overlapping the gate electrode; and
a pair of conductive films over the oxide semiconductor film, wherein the pixel electrode is formed using a second light-transmitting conductive film and is in contact with the one of the pair of conductive films.

3. The display device according to claim 2,
wherein the inorganic insulating film comprises:
an oxide insulating film in contact with the oxide semiconductor film; and
a nitride insulating film over the oxide insulating film.

4. The display device according to claim 3,
wherein the metal oxide film is in contact with the nitride insulating film and comprises a same metal element as the oxide semiconductor film.

5. The display device according to claim 2,
wherein the oxide semiconductor film comprises an In—Ga oxide, an In—Zn oxide, or an In-M-Zn oxide, and
wherein M represents Al, Ti, Ga, Y, Zr, La, Ce, Nd, Sn, or Hf.

6. The display device according to claim 2,
wherein the oxide semiconductor film has a multilayer structure comprising a first film and a second film, and
wherein an atomic ratio of a metal element of the first film is different from an atomic ratio of the metal element of the second film.

7. A display device comprising:
a first pixel;
a second pixel;
a first wiring;
a second wiring;
a third wiring; and
a first light-transmitting conductive film overlapping the first wiring, the second wiring and the third wiring,
wherein each of the first pixel and the second pixel comprises a first sub-pixel, a second sub-pixel, a third sub-pixel, and a fourth sub-pixel, each subpixel comprising a transistor and a capacitor,
wherein the capacitor of each subpixel comprises a metal oxide film and a part of the first light-transmitting conductive film with an inorganic insulating film between the metal oxide film and the part of the first light-transmitting conductive film, wherein the first wiring is electrically connected to a gate electrode of the transistor of the first sub-pixel of the first pixel, a gate of the transistor of the second sub-pixel of the first pixel, and a gate of the transistor of the third sub-pixel of the first pixel, wherein the second wiring is electrically connected to a gate of the transistor of the fourth sub-pixel of the first pixel and a gate of the transistor of the fourth sub-pixel of the second pixel, wherein the third wiring is electrically connected to one of a source and a drain of the transistor of the fourth sub-pixel of the first pixel, one of a source and a drain of the transistor of the second sub-pixel of the first pixel and one of a source and a drain of the transistor of the second sub-pixel of the second pixel, wherein the third wiring extends in a direction, wherein the first sub-pixel of the first pixel comprises a first pixel electrode between the first wiring and the second wiring in the direction, wherein the second sub-pixel of the first pixel comprises a second pixel electrode between the first wiring and the second wiring in the direction, wherein the third sub-pixel of the first pixel comprises a third pixel electrode between the first wiring and the second wiring in the direction, and wherein the fourth sub-pixel of the first pixel comprises a fourth pixel electrode between the third pixel electrode and the second wiring in the direction.

8. The display device according to claim 7, further comprising:

an organic insulating film over the inorganic insulating film; and a pixel electrode over the organic insulating film, the pixel electrode being electrically connected to the transistor of the first sub-pixel of the first pixel, wherein the transistor of the first sub-pixel of the first pixel is over a substrate, wherein the transistor of the first sub-pixel of the first pixel comprises:
the gate electrode over the substrate;
a gate insulating film over the gate electrode;
an oxide semiconductor film over the gate insulating film, the oxide semiconductor film overlapping the gate electrode; and
a pair of conductive films over the oxide semiconductor film, wherein the pixel electrode is formed using a second light-transmitting conductive film and is in contact with the one of the pair of conductive films.

9. The display device according to claim 8,
wherein the inorganic insulating film comprises:
an oxide insulating film in contact with the oxide semiconductor film; and
nitride insulating film over the oxide insulating film.

10. The display device according to claim 9,
wherein the metal oxide film is in contact with the nitride insulating film and comprises a same metal element as the oxide semiconductor film.

11. The display device according to claim 8,
wherein the oxide semiconductor film comprises an In—Ga oxide, an In—Zn oxide, or an In-M-Zn oxide, and
wherein M represents Al, Ti, Ga, Y, Zr, La, Ce, Nd, Sn, or Hf.

12. The display device according to claim 8,
wherein the oxide semiconductor film has a multilayer structure comprising a first film and a second film, and
wherein an atomic ratio of a metal element of the first film is different from an atomic ratio of the metal element of the second film.

* * * * *

UNITED STATES PATENT AND TRADEMARK OFFICE
CERTIFICATE OF CORRECTION

PATENT NO. : 9,880,437 B2  
APPLICATION NO. : 14/551914  
DATED : January 30, 2018  
INVENTOR(S) : Koji Kusunoki et al.

Page 1 of 1

It is certified that error appears in the above-identified patent and that said Letters Patent is hereby corrected as shown below:

In the Claims

In Claim 9, at Column 54, Line 56, "nitride" should be --a nitride--.

Signed and Sealed this  
First Day of May, 2018

Andrei Iancu  
*Director of the United States Patent and Trademark Office*